United States Patent
Nihashi et al.

(10) Patent No.: US 11,573,491 B2
(45) Date of Patent: Feb. 7, 2023

(54) NEGATIVE TONE PHOTOSENSITIVE COMPOSITION FOR EUV LIGHT, PATTERN FORMING METHOD, AND METHOD FOR MANUFACTURING ELECTRONIC DEVICE

(71) Applicant: FUJIFILM Corporation, Tokyo (JP)

(72) Inventors: Wataru Nihashi, Haibara-gun (JP); Michihiro Shirakawa, Haibara-gun (JP); Michihiro Ogawa, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 320 days.

(21) Appl. No.: 17/036,576

(22) Filed: Sep. 29, 2020

(65) Prior Publication Data

US 2021/0011380 A1  Jan. 14, 2021

Related U.S. Application Data

(63) Continuation of application No. PCT/JP2019/007155, filed on Feb. 26, 2019.

(30) Foreign Application Priority Data

Mar. 30, 2018 (JP) ............... JP2018-069071

(51) Int. Cl.
  *G03F 7/038* (2006.01)
  *G03F 7/004* (2006.01)
  *G03F 7/20* (2006.01)
  *G03F 7/32* (2006.01)

(52) U.S. Cl.
  CPC .......... *G03F 7/0382* (2013.01); *G03F 7/0045* (2013.01); *G03F 7/2004* (2013.01); *G03F 7/325* (2013.01)

(58) Field of Classification Search
  None
  See application file for complete search history.

(56) References Cited

U.S. PATENT DOCUMENTS

| | | | |
|---|---|---|---|
| 2012/0077126 A1* | 3/2012 | Mori | G03F 7/0046 430/326 |
| 2014/0199631 A1 | 7/2014 | Sagehashi et al. | |
| 2014/0212797 A1 | 7/2014 | Kawabata et al. | |
| 2014/0308605 A1 | 10/2014 | Ito et al. | |
| 2015/0017576 A1* | 1/2015 | Inoue | G03F 7/0046 430/326 |
| 2016/0238930 A1 | 8/2016 | Hasegawa et al. | |
| 2017/0226252 A1* | 8/2017 | Sagehashi | G03F 7/0046 |
| 2018/0004087 A1 | 1/2018 | Hatakeyama et al. | |
| 2019/0079399 A1 | 3/2019 | Fukushima et al. | |

FOREIGN PATENT DOCUMENTS

| | | |
|---|---|---|
| JP | 2013-083959 A | 5/2013 |
| JP | 2014-136708 A | 7/2014 |
| JP | 2016-042199 A | 3/2016 |
| JP | 2016-147979 A | 8/2016 |
| JP | 2017-141373 A | 8/2017 |
| JP | 2018-004812 A | 1/2018 |
| JP | 2019-052294 A | 4/2019 |
| TW | 201638078 A | 11/2016 |
| TW | 201736964 A | 10/2017 |
| WO | 2009/019793 A1 | 2/2009 |

OTHER PUBLICATIONS

Notice of Reasons for Refusal dated Sep. 14, 2021 by the Japanese Patent Office in Japanese Application No. 2020-510460.
International Search Report dated May 21, 2019 in International Application No. PCT/JP2019/007155.
Written Opinion of the International Searching Authority dated May 21, 2019 in International Application No. PCT/JP2019/007155.
International Preliminary Report on Patentability dated Oct. 6, 2020 in International Application No. PCT/JP2019/007155.
Extended European Search Report dated Jun. 4, 2021 in European Application No. 19776054.9.
Office Action dated Aug. 30, 2022 issued by the Taiwanese Patent Office in Taiwanese Application No. 108109152.

\* cited by examiner

*Primary Examiner* — Duane Smith
*Assistant Examiner* — Nicholas E Brown
(74) *Attorney, Agent, or Firm* — Sughrue Mion, PLLC

(57) ABSTRACT

The present invention provides a negative tone photosensitive composition for EUV light, capable of forming a pattern, in which occurrence of missing defects is suppressed and pattern collapse is suppressed. The present invention also provides a pattern forming method and a method for manufacturing an electronic device. The negative tone photosensitive composition for EUV light of an embodiment of the present invention includes a resin A having a repeating unit having an acid-decomposable group with a polar group being protected with a protective group that is eliminated by the action of an acid, and a photoacid generator, in which a ClogP value of the resin after elimination of the protective group from the resin A is 1.4 or less, a value x calculated by Expression (1) is 1.2 or more, and the value x calculated by Expression (1) and a value y calculated by Expression (2) satisfy a relationship of Expression (3).

20 Claims, No Drawings

NEGATIVE TONE PHOTOSENSITIVE COMPOSITION FOR EUV LIGHT, PATTERN FORMING METHOD, AND METHOD FOR MANUFACTURING ELECTRONIC DEVICE

CROSS-REFERENCE TO RELATED APPLICATIONS

This application is a Continuation of PCT International Application No. PCT/JP2019/007155 filed on Feb. 26, 2019, which claims priority under 35 U.S.C. § 119(a) to Japanese Patent Application No. 2018-069071 filed on Mar. 30, 2018. Each of the above applications is hereby expressly incorporated by reference, in its entirety, into the present application.

BACKGROUND OF THE INVENTION

1. Field of the Invention

The present invention relates to a negative tone photosensitive composition for EUV light, a pattern forming method, and a method for manufacturing an electronic device.

2. Description of the Related Art

In processes for manufacturing semiconductor devices such as an integrated circuit (IC) and a large scale integrated circuit (LSI), microfabrication by lithography using a photosensitive composition has been performed.

Examples of the lithographic method include a method in which a resist film is formed with a photosensitive composition, and then the obtained film is exposed and then developed. In particular, in recent years, it has been investigated to use extreme ultraviolet (EUV) light upon exposure, and above all, a method for forming a negative tone pattern using a developer including an organic solvent has also been considered (JP2016-042199A).

SUMMARY OF THE INVENTION

In recent years, it has been required to form a finer pattern without pattern collapse. Further, a problem that in a case where a fine pattern is formed, a part of the pattern is removed by development and missing defects thus easily occur has been pointed out.

Therefore, an object of the present invention is to provide a photosensitive composition for EUV light, capable of forming a pattern, in which occurrence of missing defects is suppressed and pattern collapse is suppressed.

In addition, another object of the present invention is to provide a pattern forming method and a method for manufacturing an electronic device.

The present inventors have found that the objects can be accomplished by the following configurations.

[1] A negative tone photosensitive composition for EUV light, comprising:
  a resin A having a repeating unit having an acid-decomposable group with a polar group being protected with a protective group that is eliminated by the action of an acid; and
  a photoacid generator,
  in which a ClogP value of the resin after elimination of the protective group from the resin A is 1.40 or less,
  a value x calculated by Expression (1) which will be described later is 1.2 or more, and
  the value x calculated by Expression (1) which will be described later and a value y calculated by Expression (2) which will be described later satisfy a relationship of Expression (3) which will be described later.

[2] The negative tone photosensitive composition for EUV light as described in [1],
  in which the protective group has a fluorine atom.

[3] The negative tone photosensitive composition for EUV light as described in [1] or [2],
  in which a relationship of Expression (4) which will be described later is satisfied.

[4] The negative tone photosensitive composition for EUV light as described in any one of [1] to [3],
  in which a relationship of Expression (5) which will be described later is satisfied.

[5] The negative tone photosensitive composition for EUV light as described in any one of [1] to [4],
  in which a content of the repeating unit having an acid-decomposable group with respect to all the repeating units of the resin A is 60% by mass or more.

[6] The negative tone photosensitive composition for EUV light as described in any one of [1] to [5],
  in which y is 0.2 or more.

[7] The negative tone photosensitive composition for EUV light as described in any one of [1] to [6],
  in which x is 1.4 or more.

[8] A pattern forming method comprising:
  a step of forming a resist film on a substrate using the negative tone photosensitive composition for EUV light as described in any one of [1] to [7];
  a step of exposing the resist film to EUV light; and
  a step of developing the exposed resist film using a developer including an organic solvent to form a pattern.

[9] The pattern forming method as described in [8],
  in which the exposed resist film has a film thickness of 50 nm or less.

[10] The pattern forming method as described in [8] or [9],
  in which the exposed resist film has a film thickness of 40 nm or less.

[11] The pattern forming method as described in any one of [8] to [10],
  in which the exposed resist film has a film thickness of 35 nm or less.

[12] A method for manufacturing an electronic device, the method comprising the pattern forming method as described in any one of [8] to [11].

According to the present invention, it is possible to provide a photosensitive composition for EUV light, capable of forming a pattern, in which occurrence of missing defects is suppressed and pattern collapse is suppressed.

In addition, the present invention can provide a pattern forming method and a method for manufacturing an electronic device.

DESCRIPTION OF THE PREFERRED EMBODIMENTS

Hereinafter, an example of embodiments for carrying out the present invention will be described.

In the present specification, a numerical range expressed using "to" is used in a meaning of a range that includes the preceding and succeeding numerical values of "to" as the lower limit value and the upper limit value, respectively.

Moreover, in citations for a group (atomic group) in the present specification, in a case where the group is denoted without specifying whether it is substituted or unsubstituted, the group includes both a group not containing a substituent and a group containing a substituent. For example, an "alkyl group" which is not denoted about whether it is substituted or unsubstituted includes not only an alkyl group not containing a substituent (unsubstituted alkyl group), but also an alkyl group containing a substituent (substituted alkyl group).

In the present specification, the weight-average molecular weight (Mw), the number-average molecular weight (Mn), and the dispersity (also referred to as a molecular weight distribution) (Mw/Mn) of a resin are defined as values in terms of polystyrene by means of gel permeation chromatography (GPC) measurement (solvent: tetrahydrofuran, flow amount (amount of a sample injected): 10 µL, columns: TSK gel Multipore HXL-M manufactured by Tosoh Corporation, column temperature: 40° C., flow rate: 1.0 mL/min, detector: differential refractive index detector) using a GPC apparatus (HLC-8120 GPC manufactured by Tosoh Corporation).

1 Å is $1 \times 10^{-10}$ m.

In the present specification, the acid dissociation constant pKa refers to an acid dissociation constant pKa in an aqueous solution, and is defined, for example, in Chemical Handbook (II) (Revised $4^{th}$ Edition, 1993, compiled by the Chemical Society of Japan, Maruzen Co., Ltd.). The lower the value of the acid dissociation constant pKa, the higher the acid strength. Specifically, the acid dissociation constant pKa in an aqueous solution may be measured by using an infinite-dilution aqueous solution to measure the acid dissociation constant at 25° C. Alternatively, the acid dissociation constant pKa can also be determined using the following software package 1, by computation from a value based on a Hammett substituent constant and the database of known literature values. Any of the values of pKa described in the present specification represent values determined by calculation using the software package.

Software package 1: Advanced Chemistry Development (ACD/Labs) Software V8.14 for Solaris (1994-2007 ACD/Labs).

[Negative Tone Photosensitive Composition for EUV Light]

The negative tone photosensitive composition for EUV light of an embodiment of the present invention is typically a chemically amplified resist composition, which is a negative resist composition for organic solvent development.

The negative tone photosensitive composition for EUV light of the embodiment of the present invention (hereinafter also referred to as a "resist composition") includes a resin A having a repeating unit having an acid-decomposable group with a polar group being protected with a protective group that is eliminated by the action of an acid, and a photoacid generator.

In addition, the ClogP value of a resin after elimination of the protective group from the resin A is 1.40 or less.

A value x calculated by Expression (1) which will be described later is 1.2 or more, and the value x calculated by Expression (1) and a value y calculated by Expression (2) satisfy a relationship (3) which will be described later.

First, EUV light has a wavelength of 13.5 nm, which is a shorter wavelength than that of ArF (wavelength of 193 nm) light or the like, and therefore, the EUV light has a smaller number of incident photons upon exposure with the same sensitivity. With this, an effect of "photon shot noise" that the number of photons is statistically non-uniform is significant and missing defects easily occur. As a countermeasure, there is a method of increasing a resist film thickness to increase the number of absorbed photons, but in a case where the resist film thickness during development was large, there has been a problem that pattern collapse tends to occur during the development process.

Here, the present inventors have paid attention to an EUV light absorption efficiency in a resist film thus formed and a shrinkage amount of the resist film before and after exposure, and have found each of the value x calculated by Expression (1) and the value y calculated by Expression (2), which index the degrees of the EUV light absorption efficiency and the shrinkage amount.

That is, the larger x is, the better the EUV light absorption efficiency of the resist film is.

Furthermore, the larger y is, the larger the amount of a change in the film thickness (shrinkage amount) of the resist film before and after exposure is. That is, in a case where y is large, the resist film shrinks and the film thickness decreases upon subsequent development even with an increase in the film thickness of the resist film upon exposure and an increase in the number of absorbed photons, and therefore, it is easy to avoid the occurrence of pattern collapse due to the large film thickness.

The present inventors have found that x is a constant value (1.2) or more, and that it is important for x and y to be in a constant relationship (that is, the relationship of Expression (3) being satisfied) in order to solve the problems of the present invention.

In addition, by adjusting the ClogP value of the resin after elimination of the protective group from the resin A within a certain range (1.40 or less), the degree of interaction with the developer is adjusted and the developability is improved.

<Expression (1)>

In the resist composition, the value x calculated by Expression (1) is 1.2 or more.

As described above, in a case where x is large, the absorption efficiency for EUV light of a resist film formed with the resist composition is increased.

$$x=([H]\times0.04+[C]\times1.0+[N]\times2.1+[O]\times3.6+[F]\times5.6+[S]\times1.5+[I]\times39.5)/([H]\times1+[C]\times12+[N]\times14+[O]\times16+[F]\times19+[S]\times32+[I]\times127)\times10 \quad \text{Expression (1):}$$

As described, x is 1.2 or more, but from the viewpoint that at least one of suppression of occurrence of missing defects or suppression of pattern collapse can be achieved (hereinafter also simply referred to as "the effects of the present invention are more excellent"), x is preferably 0.13 or more, more preferably 0.14 or more, and particularly preferably 0.15 or more. The upper limit is not particularly limited, but is generally 2.5 or less.

Moreover, in Expression (1), [H] represents a molar ratio of hydrogen atoms derived from the total solid content with respect to all the atoms of the total solid content in the negative tone photosensitive composition for EUV light, [C] represents a molar ratio of carbon atoms derived from the total solid content with respect to all the atoms of the total solid content in the negative tone photosensitive composition for EUV light, [N] represents a molar ratio of nitrogen atoms derived from the total solid content with respect to all the atoms of the total solid content in the negative tone photosensitive composition for EUV light, [O] represents a molar ratio of oxygen atoms derived from the total solid content with respect to all the atoms of the total solid content in the negative tone photosensitive composition for EUV light, [F] represents a molar ratio of fluorine atoms derived from the total solid content with respect to all the atoms of the total solid content in the negative tone photosensitive composition for EUV light, [S] represents a molar ratio of sulfur atoms derived from the total solid content with respect to all the atoms of the total solid content in the negative tone photosensitive composition for EUV light, and [I] represents a molar ratio of iodine atoms derived from the total solid content with respect to all the atoms of the total solid content in the negative tone photosensitive composition for EUV light.

For example, in a case where the resist composition includes a resin A having a repeating unit having an acid-decomposable group with a polar group being protected with a protective group that is eliminated by the action of an acid, a photoacid generator, an acid diffusion control agent, and a solvent, the resin A, the photoacid generator, and the acid diffusion control agent correspond to the solid content. That is, all the atoms in the total solid content correspond to a sum of all the atoms derived from the resin A, all the atoms derived from the photoacid generator, and all the atoms derived from the acid diffusion control agent. For example, [H] represents a molar ratio of hydrogen atoms derived from the total solid content with respect to all the atoms in the total solid content, and as described based on the example, [H] represents a molar ratio of a sum of the hydrogen atom derived from the resin, the hydrogen atom derived from the photoacid generator, and the hydrogen atom derived from the acid diffusion control agent with respect to a sum of all the atoms derived from the resin, all the atoms derived from the photoacid generator, and all the atoms derived from the acid diffusion control agent.

x can be calculated by computation of the structures of constituent components of the total solid content in the resist composition, and the ratio of atoms contained in a case where the content is already known. In addition, even in a case where the constituent components are not known yet, it is possible to calculate a ratio of the number of constituent atoms according to analytic procedure such as elemental analysis for a resist film obtained after evaporating the solvent components of the resist composition.

Furthermore, the solid content is intended to mean a component forming a resist film, and does not include a solvent. In addition, as long as the component is one forming a resist film, it is regarded as a solid content even in a case where it is in the property and state of a liquid.

<Expression (2)>

As described above, the value y calculated by Expression (2) is a value obtained by indexing a shrinkage amount of the resist film before and after exposure, and the larger y, the larger the amount of change (shrinkage) in the resist film thickness between before and after exposure.

$$y=\{(a-b)/a\} \times c \times d \qquad \text{Expression (2):}$$

From the viewpoint that the effects of the present invention are more excellent, y is preferably 0.2 or more, more preferably 0.3 or more, and still more preferably 0.4 or more. The upper limit is not particularly limited, but is generally 0.6 or less, and often 0.5 or less.

Furthermore, in Expression (2), a represents a molecular weight of the repeating unit having an acid-decomposable group in the resin A, b represents a molecular weight of the repeating unit after elimination of the protective group from the repeating unit having an acid-decomposable group, c represents a mass ratio of the repeating unit having an acid-decomposable group to all the repeating units of the resin A, and d represents a mass ratio of the resin A to the total mass of the solid content.

For reference, examples of the resist composition in which the resin A including the repeating unit represented by Formula (B-4) as an acid-decomposable group in the amount of 60% by mass with respect to all the repeating units is included in the amount of 80% by mass with respect to the total solid content will be shown below. The repeating unit represented by (B-4) is a repeating unit represented by (B-4x) after elimination of the protective group. Thus, in such a resist composition including the resin A, y is determined based on Expression (2) with a=254, b=86, c=0.6, and d=0.8.

Similarly, for example, in a case of a resist composition including a resin including 60% by mass of a repeating unit represented by Expression (B-5) in the amount of 70% by mass with respect to the total solid content, y is determined based on Expression (2) with a=346, b=102, c=0.6, and d=0.7 in a resist composition including such a resin A.

In addition, in a case where one kind of the resin A includes a repeating unit having a plurality of kinds of acid-decomposable groups, y based on the repeating unit having an acid-decomposable group is calculated for each kind of the repeating units, and a sum thereof is taken as the resin A as a whole.

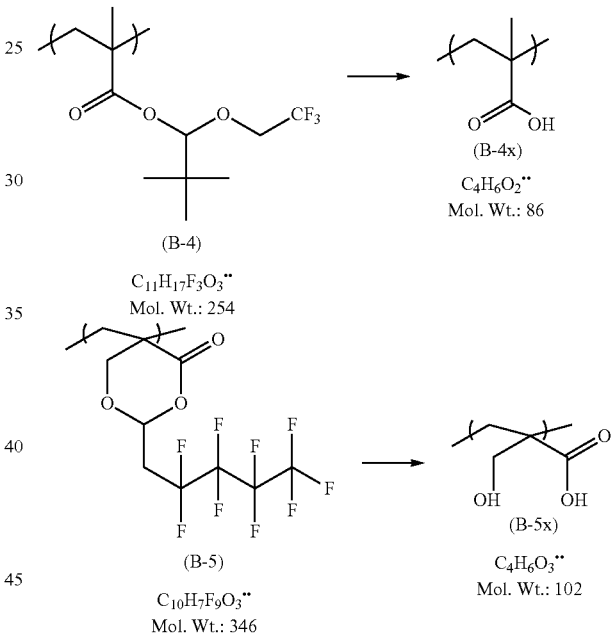

Details of the resin A will be described later.

<Expression (3) to Expression (5)>

Expression (3) is a relational expression of x and y as described above, and the resist composition of the embodiment of the present invention satisfies a relationship of Expression (3).

$$y \geq -x+1.5 \qquad \text{Expression (2):}$$

Furthermore, from the viewpoint that the effects of the present invention are more excellent, the resist composition of the embodiment of the present invention preferably satisfies a relationship of Expression (4), and more preferably satisfies a relationship of Expression (5).

$$y \geq -0.75x+1.4 \qquad \text{Expression (4):}$$

$$y \geq -0.66x+1.4 \qquad \text{Expression (5):}$$

x and y in Expressions (3) to (5) are as described above.

Hereinafter, the components of the resist composition of the embodiment of the present invention will be described in detail.

<Resin a Having Repeating Unit Having Acid-Decomposable Group with Polar Group being Protected with Protective Group that is Eliminated by Action of Acid (Resin A)>

The resist composition includes a resin A having a repeating unit having an acid-decomposable group with a polar group being protected with a protective group that is eliminated by the action of an acid.

The value y calculated by Expression (2) is determined according to the structure of the resin A.

Furthermore, the resin A is a resin having a ClogP value of 1.40 or less after elimination of the protective group from the resin A.

The ClogP value of the resin after elimination of the protective group is preferably 1.30 or less, and more preferably 1.20 or less. The lower limit is not particularly limited, but is usually −1.0 or more.

Furthermore, in the present specification, the ClogP value of the resin (hereinafter also referred to as "Clog(Poly)") is a sum of products of a ClogP value of each monomer corresponding to each repeating unit included in the resin and a mole fraction of each repeating unit. An expression, "a monomer corresponds to a repeating unit", indicates that the repeating unit corresponds to a repeating unit obtained by polymerizing the monomer. In a case where two or more resins having different Clog(Poly) values are blended, the Clog(Poly) value of each resin is converted into a mass-average value.

As the ClogP of the monomer, the calculated value of Chem Draw Ultra 8.0 Apr. 23, 2003 (Cambridge corporation) is used.

The ClogP (Poly) of the resin can be calculated by the following expression.

ClogP (Poly)=ClogP of monomer $A$×Compositional ratio of repeating unit $A$+ClogP of monomer $B$×Compositional ratio of repeating unit $B$+ . . .

In the expression, the resin contains repeating units A and B, the monomer A and the repeating unit A correspond to each other, and the monomer B and the repeating unit B correspond to each other.

(Repeating Unit Having Acid-Decomposable Group with Polar Group being Protected with Protective Group that is Eliminated by Action of Acid)

The resin A has a repeating unit having an acid-decomposable group with a polar group being protected with a protective group that is eliminated by the action of an acid (also referred to simply as "a repeating unit having an acid-decomposable group"). That is, the resin A has a repeating unit having a group in which a protective group is eliminated (decomposes) by the action of an acid to generate a polar group. Typically, in a case where the protective group is eliminated from the resin A, a hydrogen atom is bonded to a position where the protective group before being eliminated has been bonded, thus to generate a polar group.

The resin having such a repeating unit has an increased polarity by the action of an acid, and thus, has an increased solubility in an alkali solution and a decreased solubility in an organic solvent.

As the polar group in the repeating unit having a structure (acid-decomposable group) with a polar group being protected with a protective group that is eliminated by the action of an acid, an alkali-soluble group is preferable, and examples thereof include acidic groups such as a carboxyl group, a phenolic hydroxyl group, a fluorinated alcohol group, a sulfonic acid group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, and a tris(alkylsulfonyl)methylene group, and alcoholic hydroxyl groups.

Among those, the carboxyl group, the phenolic hydroxyl group, the fluorinated alcohol group (preferably a hexafluoroisopropanol group), or the sulfonic acid group is preferable as the polar group.

Examples of the protective group that is eliminated by the action of an acid include groups represented by Formulae (Y1) to (Y4).

—C($Rx_1$)($Rx_2$)($Rx_3$)                 Formula (Y1):

—C(=O)OC($Rx_1$)($Rx_2$)($Rx_3$)           Formula (Y2):

—C($R_{36}$)($R_{37}$)(O$R_{38}$)                  Formula (Y3):

—C(Rn)(H)(Ar)                         Formula (Y4):

In Formula (Y1) and Formula (Y2), $Rx_1$ to $Rx_3$ each independently represent an (linear or branched) alkyl group, a (monocyclic or polycyclic) cycloalkyl group, an aryl group, an aralkyl group, or an alkenyl group. In addition, in a case where all of $Rx_1$ to $Rx_3$ are (linear or branched) alkyl groups, it is preferable that at least two of $Rx_1$, . . . , or $Rx_3$ are methyl groups.

Above all, it is preferable that $Rx_1$ to $Rx_3$ each independently represent a linear or branched alkyl group, and it is more preferable that $Rx_1$ to $Rx_3$ each independently represent a linear alkyl group.

Two of $Rx_1$ to $Rx_3$ may be bonded to each other to form a monocycle or a polycycle.

As the alkyl group of each of $Rx_1$ to $Rx_3$, an alkyl group having 1 to 4 carbon atoms, such as a methyl group, an ethyl group, an n-propyl group, an isopropyl group, an n-butyl group, an isobutyl group, or a t-butyl group, is preferable.

As the cycloalkyl group of each of $Rx_1$ to $Rx_3$, a monocyclic cycloalkyl group such as a cyclopentyl group or a cyclohexyl group, or a polycyclic cycloalkyl group such as a norbornyl group, a tetracyclodecanyl group, a tetracyclododecanyl group, and an adamantyl group is preferable.

The aryl group of each of $Rx_1$ to $Rx_3$ is preferably an aryl group having 6 to 10 carbon atoms, and examples thereof include a phenyl group, a naphthyl group, and an anthryl group.

The aralkyl group of each of $Rx_1$ to $Rx_3$ is preferably an aralkyl group having 7 to 12 carbon atoms, and examples thereof include a benzyl group, a phenethyl group, and a naphthylmethyl group.

The alkenyl group of each of $Rx_1$ to $Rx_3$ is preferably an alkenyl group having 2 to 8 carbon atoms, and examples thereof include a vinyl group, an allyl group, a butenyl group, and a cyclohexenyl group.

As the cycloalkyl group formed by the bonding of two of $Rx_1$ to $Rx_3$, a monocyclic cycloalkyl group such as a cyclopentyl group or a cyclohexyl group, or a polycyclic cycloalkyl group such as a norbornyl group, a tetracyclodecanyl group, a tetracyclododecanyl group, or an adamantyl group is preferable, and a monocyclic cycloalkyl group having 5 or 6 carbon atoms is more preferable.

In the cycloalkyl group formed by the bonding of two of $Rx_1$ to $Rx_3$, for example, one or more methylene groups constituting the ring may be substituted with a heteroatom such as an oxygen atom or a group having a heteroatom, such as a carbonyl group. Further, one or more of the ethylene groups (—$CH_2$—$CH_2$—) constituting the ring may be substituted with vinylene groups (—CH=CH—).

For the group represented by Formula (Y1) or Formula (Y2), for example, an aspect in which $Rx_1$ is a methyl group or an ethyl group, and $Rx_2$ and $Rx_3$ are bonded to each other to form the above-mentioned cycloalkyl group is also preferable.

In Formula (Y3), $R_{36}$ to $R_{38}$ each independently represent a hydrogen atom or a monovalent organic group. $R_{37}$ and $R_{38}$ may be bonded to each other to form a ring. Examples of the monovalent organic group include a group represented by Formula (Y1) and an alkyl group (which may be linear or branched and may have a cyclic structure, with examples thereof including a methyl group, an ethyl group, an n-propyl group, an isopropyl group, an n-butyl group, an isobutyl group, and a 1-adamantyl group, each of which has 1 to 10 carbon atoms), an aryl group, an aralkyl group, and an alkenyl group, which are other than the group represented by Formula (Y1). It is also preferable that $R_{36}$ is a hydrogen atom.

Examples of the aryl group, the aralkyl group, and the alkenyl group include the same groups as the aryl group, the aralkyl group, and the alkenyl group, respectively, for each of $Rx_1$ to $Rx_3$ described above.

Furthermore, $R_{38}$ and another group other than the group represented by Formula (Y3) in the repeating unit may be bonded to each other. For example, $R_{38}$ may be bonded to a group contained in the main chain of the repeating unit. In a case where $R_{38}$ is bonded to another group in the repeating unit, $R_{38}$ and the other group preferably form a single bond or a divalent linking group (an alkylene group or the like). In addition, in a case where $R_{38}$ is bonded to another group in the repeating unit, the repeating unit forms a ring including the group represented by Formula (Y3).

For Formula (Y3), a group represented by Formula (Y3-1) is also preferable.

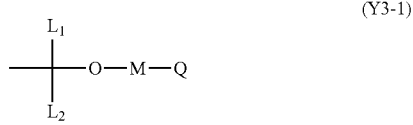

(Y3-1)

Here, $L_1$ and $L_2$ each independently represent a hydrogen atom, an alkyl group, a cycloalkyl group, an aryl group, or a group formed by combination thereof (for example, a group formed by combination of an alkyl group and an aryl group).

M represents a single bond or a divalent linking group.

Q represents an alkyl group which may include a heteroatom, a cycloalkyl group which may include a heteroatom, an aryl group which may include a heteroatom, an amino group, an ammonium group, a mercapto group, a cyano group, an aldehyde group, or a group formed by combination thereof (for example, a group formed by combination of an alkyl group and a cycloalkyl group).

In the alkyl group and the cycloalkyl group, for example, one methylene group may be substituted with a heteroatom such as an oxygen atom, or a group having a heteroatom, such as a carbonyl group.

Furthermore, it is preferable that at least one of $L_1$ or $L_2$ is a hydrogen atom, and the other is an alkyl group, a cycloalkyl group, an aryl group, or a group formed by combination of an alkylene group and an aryl group.

At least two of Q, M, or $L_1$ may be bonded to each other to form a ring (preferably a 5- or 6-membered ring).

From the viewpoint of miniaturization of a pattern, it is preferable that $L_2$ is a secondary or tertiary alkyl group, it is more preferable that $L_2$ is a tertiary alkyl group. Examples of the secondary alkyl group include an isopropyl group, a cyclohexyl group, and a norbornyl group, and examples of the tertiary alkyl group include a tert-butyl group and an adamantane group. In these aspects, a glass transition temperature (Tg) or an activation energy is increased, and therefore, in addition to secured film hardness, suppression of fogging can be achieved.

In Formula (Y4), Ar represents an aromatic ring group. Rn represents an alkyl group, a cycloalkyl group, or an aryl group. Rn and Ar may be bonded to each other to form a non-aromatic ring. Ar is more preferably an aryl group.

Examples of the alkyl group, the cycloalkyl group, and the aryl group include the same groups as the alkyl group, the cycloalkyl group, and the aryl group in $Rx_1$ to $Rx_3$ described above, respectively.

Moreover, from the viewpoint that the effects of the present invention are more excellent, the protective group that is eliminated by the action of an acid preferably has a fluorine atom.

An aspect in which the protective group has a fluorine atom is not particularly limited, but for example, it is preferable that the group represented by each of Formulae (Y1) to (Y4) includes a fluorine atom. More specifically, an aspect in which the alkyl group, the cycloalkyl group, the aryl group, the aralkyl group, the alkenyl group and the like described above in Formulae (Y1) to (Y4) have a fluorine atom or a group (a fluoroalkyl group and the like) having a fluorine atom as a substituent may be mentioned.

Furthermore, the fluoroalkyl group also includes a perfluoroalkyl group (preferably a trifluoromethyl group).

Hexafluoro-2-propanol is also preferable as the group having a fluorine atom.

In a case where the protective group has a fluorine atom, the number of fluorine atoms contained in the protective group is preferably 1 to 11, more preferably 1 to 9, and still more preferably 3 to 6.

As the repeating unit having an acid-decomposable group, a repeating unit represented by General Formula (A) is preferable.

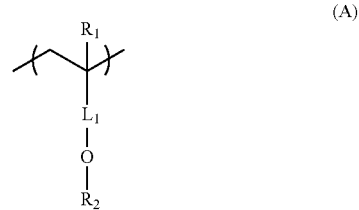

(A)

$L_1$ represents a divalent linking group, $R_1$ represents a hydrogen atom or an alkyl group, and $R_2$ represents a protective group that may be eliminated by the action of an acid and which may have a fluorine atom.

$L_1$ represents a divalent linking group. Examples of the divalent linking group include —CO—, —O—, —S—, —SO—, —$SO_2$—, a hydrocarbon group (for example, an alkylene group, a cycloalkylene group, an alkenylene group, and an arylene group), and a linking group formed by the linking of a plurality of these groups.

As the arylene group, a phenylene group is preferable.

The alkylene group may be linear or branched. The number of carbon atoms of the alkylene group is not particularly limited, but is preferably 1 to 10, and more preferably 1 to 3. As the substituent of the alkylene group, a fluorine atom or a group having a fluorine atom (a fluoroalkyl group (preferably a perfluoroalkyl group) and the like) is preferable. That is, as the alkylene group, a fluoroalkylene group is preferable, a perfluoroalkylene group is more preferable, and —C(CF$_3$)$_2$— is still more preferable.

Among those, $L_1$ is preferably —CO— or -phenylene group-alkylene group (preferably —C(CF$_3$)$_2$—) from the viewpoint that the effects of the present invention are more excellent.

$R_1$ represents a hydrogen atom or an alkyl group.

The alkyl group may be linear or branched. The number of carbon atoms of the alkyl group is not particularly limited, but is preferably 1 to 10, and more preferably 1 to 3.

In addition, as described later, in a case where $R_2$ is a group represented by Formula (Y3), $R_1$ may be bonded to $R_{38}$ in the group represented by Formula (Y3) to form a ring.

$R_2$ represents a protective group that is eliminated by the action of an acid.

Among those, $R_2$ is preferably a group represented by any of Formulae (Y1) to (Y4).

In a case where $R_2$ is a group represented by Formula (Y3), $R_{38}$ and $R_1$ in the group represented by Formula (Y3) may be bonded to each other to form a ring. In this case, the group formed by the mutual bonding of $R_{38}$ and $R_1$ with each other is preferably an alkylene group, and more preferably a methylene group.

Repeating Unit Represented by General Formula (A-2)

As the repeating unit having an acid-decomposable group, a repeating unit represented by General Formula (A-2) is also preferable.

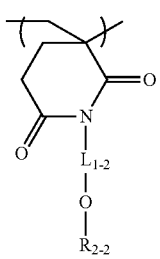

(A-2)

$L_{1-2}$ represents a divalent linking group. Examples of the divalent linking group represented by $L_{1-2}$ include the divalent linking groups mentioned in the description of $L_1$.

Among those, the alkylene group is preferable as the divalent linking group represented by $L_{1-2}$.

$R_{2-2}$ represents a protective group that is eliminated by the action of an acid. As $R_{2-2}$, the groups represented by Formulae (Y1) to (Y4) are preferable.

The content of the repeating unit having an acid-decomposable group is preferably 50% by mass or more, and more preferably 60% by mass or more, with respect to all the repeating units of the resin A. The upper limit is preferably 90% by mass or less, and more preferably 80% by mass or less.

The repeating unit having an acid-decomposable group may be used singly or in combination of two or more kinds thereof, and in a case where the two or more kinds of the repeating units are used, a total content thereof is preferably within the range.

(Other Repeating Units)

The resin A may have other repeating units in addition to the repeating unit having an acid-decomposable group.

Repeating Unit Represented by General Formula (B)

As such another repeating unit, a repeating unit represented by General Formula (B) is preferable.

(B)

In the formula, $R_{B11}$, $R_{B12}$, and $R_{B13}$ each represent a hydrogen atom or an alkyl group.

$L_B$ represents a single bond or a divalent linking group.

$T_B$ represents an aromatic ring group having a hydroxyl group.

$R_{B12}$ and $T_B$ may be bonded to each other to form a ring.

$R_{B13}$ and $L_B$ or $T_B$ may be bonded to each other to form a ring.

Examples of the alkyl group represented by each of $R_{B11}$, $R_{B12}$, and $R_{B13}$ include an alkyl group having 20 or less carbon atoms, such as a methyl group, an ethyl group, a propyl group, an isopropyl group, an n-butyl group, a sec-butyl group, a hexyl group, a 2-ethylhexyl group, n octyl group, and a dodecyl group. In one aspect, the alkyl group represented by each of $R_{11}$, $R_{12}$, and $R_{13}$ is preferably an alkyl group having 8 or less carbon atoms, and more preferably an alkyl group having 3 or less carbon atoms. Further, these alkyl groups may be fluoroalkyl groups (including a perfluoroalkyl group).

The alkyl group represented by each of $R_{B11}$, $R_{B12}$, and $R_{B13}$ may have a substituent. Examples of the substituent include an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and the substituent preferably has 8 or less carbon atoms.

Examples of the divalent linking group in $L_B$ include an ether group (—O—), a carbonyl group (—CO—), an ester group (—COO—), a thioether group (—S—), —SO$_2$—, —NR$_{64}$— (R$_{64}$ represents a hydrogen atom or an alkyl group), a divalent hydrocarbon group (for example, an alkylene group, an alkenylene group (for example, —CH═CH—), an alkynylene group (for example, —C≡C—), and an arylene group), and a group (—CONR$_{64}$—, —CONR$_{64}$-alkylene group-, and the like) formed by combination thereof.

Among those, the carbonyl group, the ester group, —NR$_{64}$—, the alkylene group, or the group formed by combination thereof (—CONR$_{64}$—, —CONR$_{64}$-alkylene group-, and the like) is preferable.

As the alkyl group of $R_{64}$, an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which may have a substituent, is preferable, and an alkyl group having 8 or less carbon atoms is more preferable. In a case where —$NR_{64}$— is combined with another group to form —$CONR_{64}$—, —$CONR_{64}$— is preferably —CONH—.

Examples of the alkylene group of the divalent linking group (also including a case where the alkylene group is combined with another group) include an alkylene group having 1 to 8 carbon atoms, such as a methylene group, an ethylene group, a propylene group, a butylene group, a hexylene group, and an octylene group. The alkylene group may have a substituent.

Examples of the aromatic ring group in the aromatic ring group having a hydroxyl group, represented by $T_B$, include an aromatic hydrocarbon ring having 6 to 18 carbon atoms, such as a benzene ring group, a naphthalene ring group, an anthracene ring group, a fluorene ring group, and a phenanthrene ring group, and an aromatic ring heterocyclic group including a heterocycle, such as a thiophene ring group, a furan ring group, a pyrrole ring group, a benzothiophene ring group, a benzofuran ring group, a benzopyrrole ring group, a triazine ring group, an imidazole ring group, a benzimidazole ring group, a triazole ring group, a thiadiazole ring group, and a thiazole ring group. Among those, a benzene ring group or a naphthalene ring group is preferable from the viewpoint of resolution, and the benzene ring group is more preferable.

The aspect in which the aromatic ring group has a hydroxyl group is not particularly limited, but it is preferable that the hydroxyl group is present as a substituent of the aromatic ring group. In addition, the number of the hydroxyl groups contained in the aromatic ring group preferably has 2 or more, more preferably 2 to 5, and still more preferably 2 or 3.

The aromatic ring group may have a substituent other than the hydroxyl group. Examples of the substituent include the specific examples of the alkyl group represented by each of $R_{11}$, $R_{12}$, and $R_{13}$; an alkoxy group such as a methoxy group, an ethoxy group, a hydroxyethoxy group, a propoxy group, a hydroxypropoxy group, and a butoxy group; an iodine atom; and an aryl group such as a phenyl group.

In a case where $R_{B13}$ and $L_B$ are bonded to each other to form a ring, $L_B$ is a trivalent linking group. More specifically, in the divalent linking group which can have a substituent among the divalent linking groups in $L_B$, the substituent and $R_{B13}$ are bonded to each other to form a single bond or a divalent linking group (for example, the divalent linking group mentioned in the description of $L_B$). Among those, the single bond or an alkylene group (preferably having 1 to 5 carbon atoms) is preferably formed.

In a case where $R_{B12}$ or $R_{B13}$ and $T_B$ are bonded to each other to form a ring, $R_{B12}$ or $R_{B13}$ and $T_B$ are bonded to each other to form a single bond or a divalent linking group (for example, the divalent linking group mentioned in the description of $L_B$). Among those, the single bond, an alkylene group (preferably having 1 to 5 carbon atoms), —$R_{Ba}$—CO—$NR_{Bb}$—, and a divalent aromatic ring group (which is preferably an arylene group and preferably has 1 to 4 hydroxyl groups as a substituent), or a group formed by combination thereof is preferably formed.

The alkylene group preferably has 1 to 5 carbon atoms. In addition, the alkylene group preferably has a substituent, and the substituent preferably has one or more groups selected from the group consisting of a fluorine atom, a fluoroalkyl group (preferably a perfluoroalkyl group, and more preferably a trifluoromethyl group), and a hydroxyl group.

In —$R_{Ba}$—CO—$NR_{Bb}$—, $R_{Ba}$ represents a single bond or a divalent linking group (for example, the divalent linking group mentioned in the description of $L_B$), and among these, the single bond or an alkylene group (preferably a methylene group) is preferable.

$R_{Bb}$ represents a hydrogen atom or a substituent. As the substituent, an alkyl group, an alkylsulfonyl group, or an aromatic ring group having a hydroxyl group is preferable.

The alkyl group preferably has 1 to 3 carbon atoms. The alkyl group is preferably a fluoroalkyl group, and more preferably a perfluoroalkyl group.

Furthermore, the number of carbon atoms in the alkyl group moiety of the alkylsulfonyl group is preferably 1 to 3. The alkyl group moiety is preferably a fluoroalkyl group, and more preferably a perfluoroalkyl group.

The aromatic ring group having a hydroxyl group is the same as the aromatic ring group having a hydroxyl group in TB, and a preferred range thereof is also the same.

Repeating Unit Represented by General Formula (I-1)

The other repeating unit is more preferably a repeating unit having two or more phenolic hydroxyl groups represented by General Formula (I-1).

(I-1)

In the formula, $R_{11}$, $R_{12}$, and $R_{13}$ each represent a hydrogen atom or an alkyl group.

L represents a single bond or a divalent linking group.

Ar represents an aromatic ring group.

n represents an integer of 2 or more.

$R_{13}$ and a substituent other than the hydroxyl group contained in the aromatic ring group of Ar or L may be bonded to each other to form a ring.

As the alkyl group of each of $R_{11}$, $R_{12}$, and Rn in General Formula (I-1), an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, is preferable, an alkyl group having 8 or less carbon atoms is more preferable, and an alkyl group having 3 or less carbon atoms is still more preferable. In one aspect, the alkyl group represented by each of $R_{11}$, $R_{12}$, and $R_{13}$ is preferably an alkyl group having 8 or less carbon atoms, and more preferably an alkyl group having 3 or less carbon atoms.

The alkyl group represented by each of $R_{11}$, $R_{12}$, and $R_{13}$ may have a substituent. Examples of the substituent include a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group, and the substituent preferably has 8 or less carbon atoms.

Examples of the divalent linking group represented by L include an ester group, —$CONR_{64}$ ($R_{64}$ represents a hydrogen atom or an alkyl group)-, or an alkylene group, or a combination of two or more selected from these groups.

Preferred examples of the alkyl group of $R_{64}$ include an alkyl group having 20 or less carbon atoms, such as a methyl group, an ethyl group, a propyl group, an isopropyl group, an n-butyl group, a sec-butyl group, a hexyl group, a 2-ethylhexyl group, an octyl group, and a dodecyl group, each of which may have a substituent, and more preferred examples thereof include an alkyl group having 8 or less carbon atoms. In one aspect, —$CONR_{64}$— is preferably —CONH—.

Examples of the alkylene group represented by L include the group having 1 to 8 carbon atoms, such as a methylene group, an ethylene group, a propylene group, a butylene group, a hexylene group, and an octylene group. The alkylene group may have a substituent.

In one aspect of the present invention, L is preferably a single bond, an ester group-, an alkylene group, —CONH—, or a combination thereof.

$R_{13}$ and L may be bonded to each other to form a ring. Here, in a case where $R_{13}$ and L are bonded to each other to form a ring, L is a trivalent linking group. More specifically, in a divalent linking group (for example, an alkylene group and —$CONR_{64}$—) which can have a substituent, among the divalent linking groups in L, the substituent and $R_{B13}$ are bonded to each other to form a single bond or an alkylene group (preferably having 1 to 5 carbon atoms).

Examples of the aromatic ring group represented by Ar include an aromatic hydrocarbon ring having 6 to 18 carbon atoms, such as a benzene ring group, a naphthalene ring group, an anthracene ring group, a fluorene ring group, and a phenanthrene ring group, and an aromatic ring heterocyclic group including a heterocycle, such as a thiophene ring group, a furan ring group, a pyrrole ring group, a benzothiophene ring group, a benzofuran ring group, a benzopyrrole ring group, a triazine ring group, an imidazole ring group, a benzimidazole ring group, a triazole ring group, a thiadiazole ring group, and a thiazole ring group. Among those, a benzene ring group or a naphthalene ring group is preferable from the viewpoint of resolution, and the benzene ring group is more preferable.

The aromatic ring group may have a substituent other than the hydroxyl group. Examples of the substituent include the alkyl group represented by each of $R_{11}$, $R_{12}$, and $R_{13}$ described above; an alkoxy group such as a methoxy group, an ethoxy group, a hydroxyethoxy group, a propoxy group, a hydroxypropoxy group, and a butoxy group; and an aryl group such as a phenyl group.

n represents an integer of 2 or more, and is preferably 2 to 5, and more preferably 2 or 3.

$R_{13}$ and a substituent other than the hydroxyl group contained in the aromatic ring group of Ar may be bonded to each other to form a ring. Here, in a case where $R_{13}$ and the substituent other than the hydroxyl group contained in the aromatic ring group of Ar are bonded to each other to form a ring, a single bond or an alkylene group (preferably having 1 to 5 carbon atoms) is formed by mutual bonding of $R_{13}$ and the substituent.

Specific examples of the repeating unit represented by General Formula (B) (including the repeating unit represented by General Formula (I-1)) are shown below. In the formula, a represents 1 or 2.

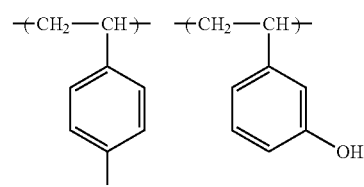

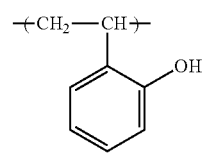

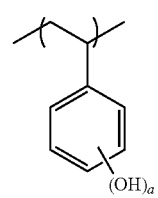 (B-1)

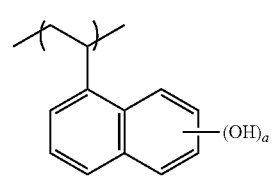 (B-2)

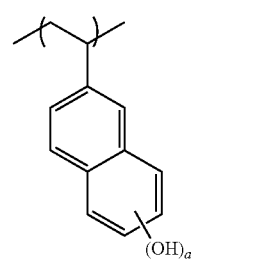 (B-3)

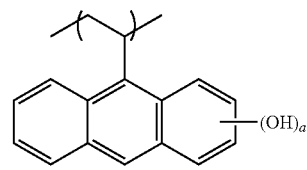 (B-4)

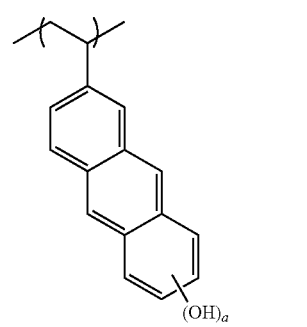 (B-5)

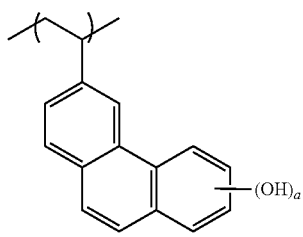 (B-6)
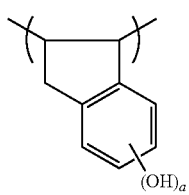 (B-7)
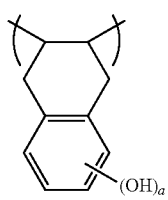 (B-8)
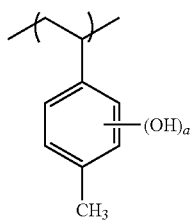 (B-9)
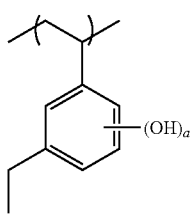 (B-10)
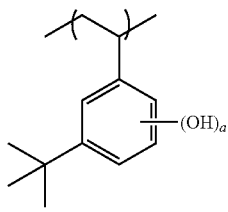 (B-11)
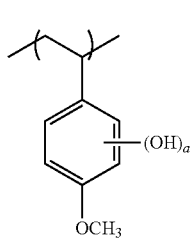 (B-12)
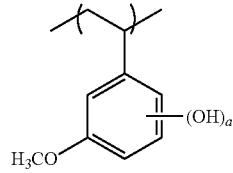 (B-13)
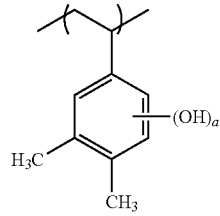 (B-14)
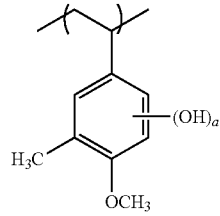 (B-15)
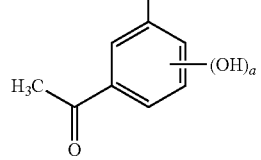 (B-16)
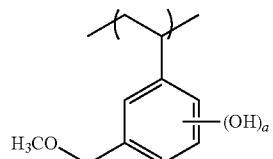 (B-17)
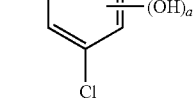 (B-18)
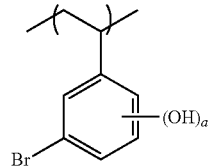 (B-19)

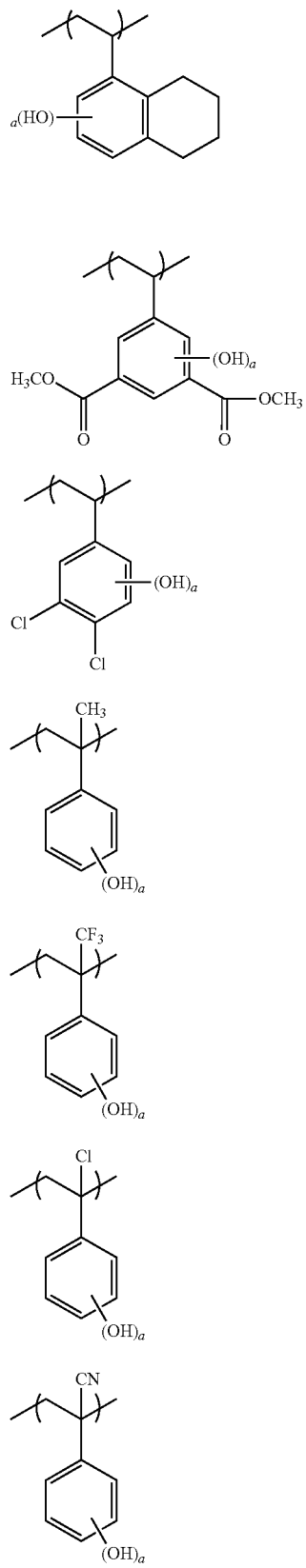
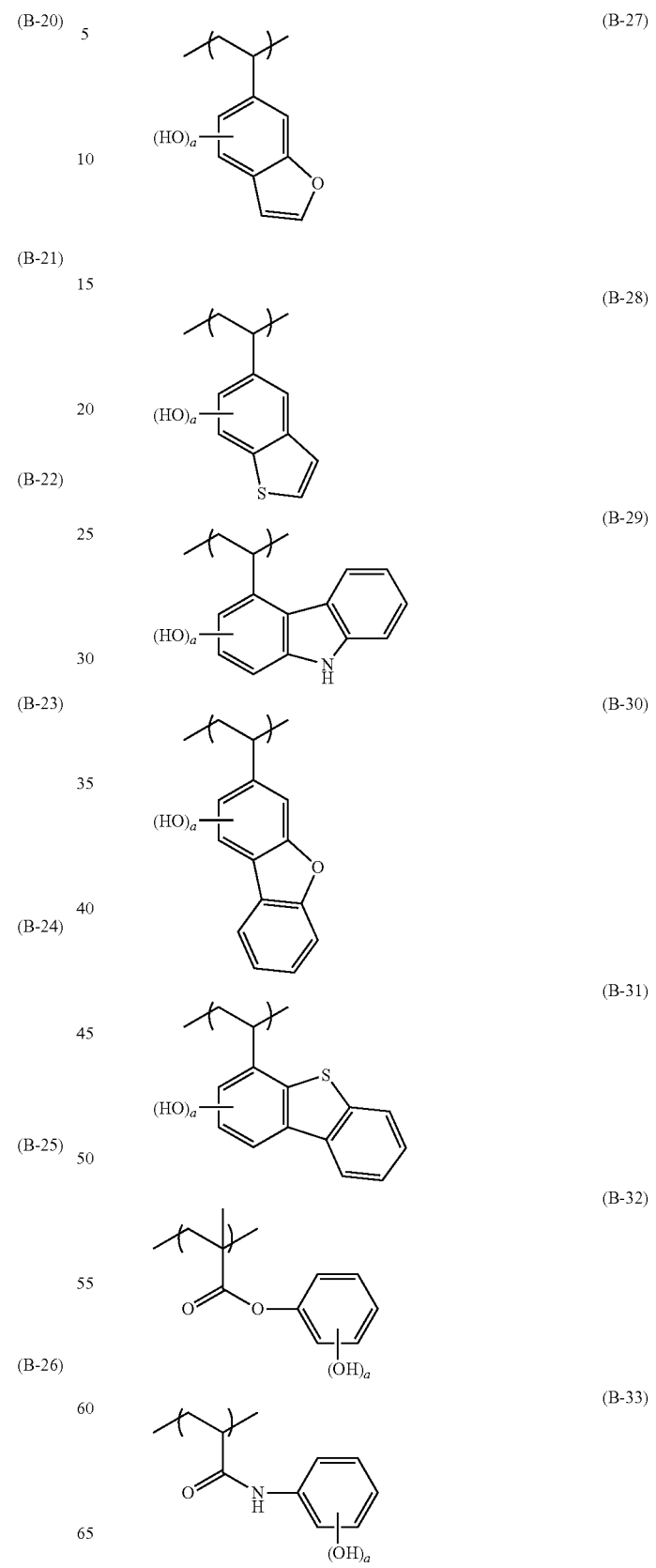

(B-34)
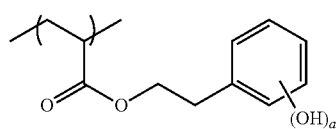
(B-35)
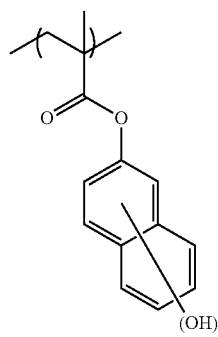
(B-36)
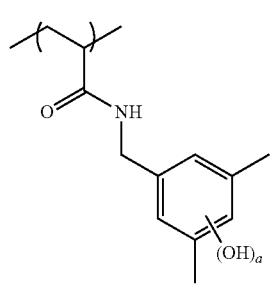
(B-37)
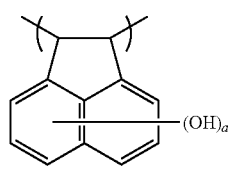
(B-38)
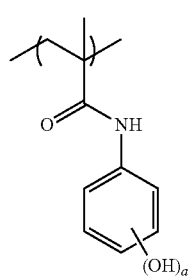
Moreover, among the repeating units, the repeating units specifically described below are preferable. In the formulae, R represents a hydrogen atom or a methyl group, and a represents 2 or 3.
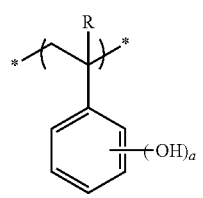
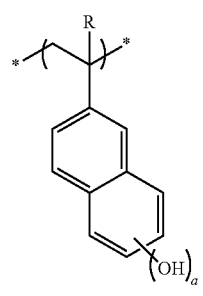
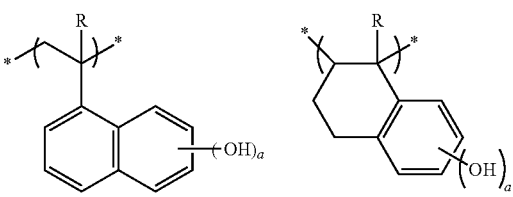
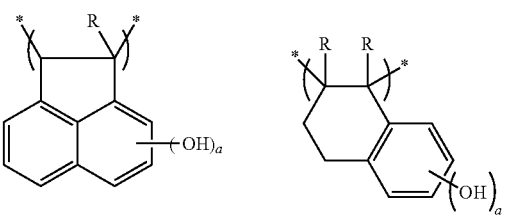
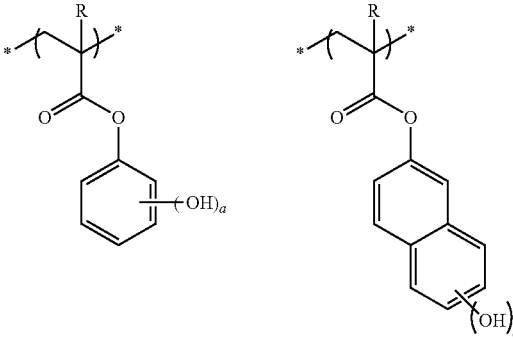
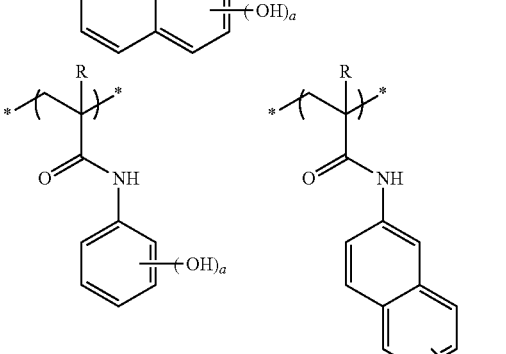
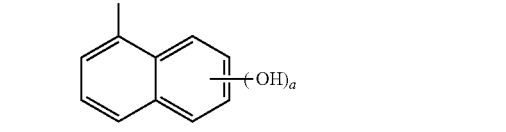

-continued

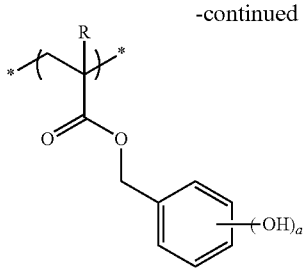

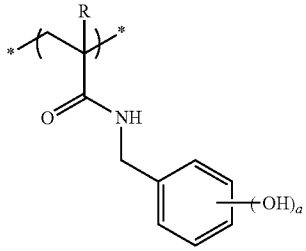

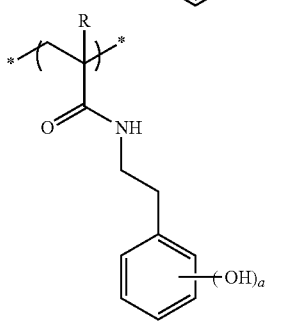

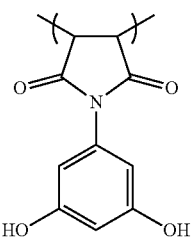

In a case where the resin A has a repeating unit represented by General Formula (B) (including a repeating unit represented by General Formula (I-1)), a content thereof is preferably 60% by mass or less, more preferably 50% by mass or less, and still more preferably 40% by mass or less, with respect to all the repeating units of the resin A. The lower limit is not particularly limited, but is, for example, 10% by mass or more with respect to all the repeating units of the resin A.

The repeating units represented by General Formula (B) (including the repeating unit represented by General Formula (I-1)) may be used singly or in combination of two or more kinds thereof, and in a case where the two or more kinds of the repeating units are used, a total content thereof is preferably within the range.

Repeating Unit Having Group Selected from Group Consisting of Lactone Group and Sultone Group The resin A may have a repeating unit having a group selected from the group consisting of a lactone group and a sultone group, in addition to the above-mentioned repeating units.

As the lactone group, any group may be used as long as it has a lactone structure, but the lactone group is preferably a group having a 5- to 7-membered ring lactone structure, and is also preferably a group having a 5- to 7-membered ring lactone structure to which another ring structure is fused in the form of forming a bicyclo structure or a Spiro structure.

As the sultone group, any group may be used as long as it has a sultone structure, but the sultone group is preferably a group having a 5- to 7-membered ring sultone structure, and is also preferably a group having a 5- to 7-membered ring sultone structure to which another ring structure is fused in the form of forming a bicyclo structure or a spiro structure.

Among those, the resin A preferably has a repeating unit having a group having a lactone structure represented by any one of General Formulae (LC1-1) to (LC1-22) or a group having a sultone structure represented by any one of General Formulae (SL1-1) to (SL1-3). Further, a lactone structure or a sultone structure may be bonded directly to the main chain. For example, the ring member atoms forming the lactone structure or the sultone structure may simultaneously be the atoms forming the main chain.

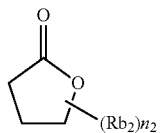

LC1-1

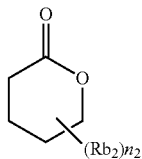

LC1-2

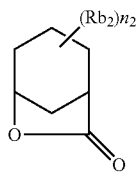

LC1-3

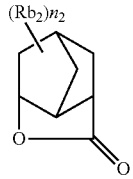

LC1-4

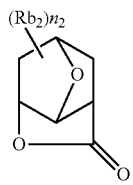

LC1-5

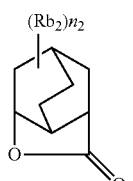

LC1-6

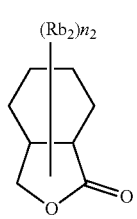

LC1-7

LC1-8 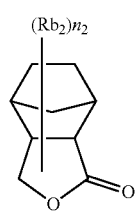
LC1-9 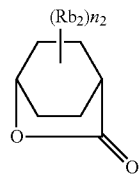
LC1-10 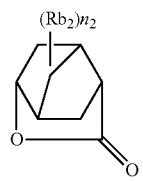
LC1-11 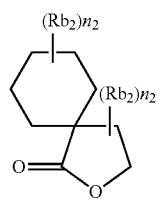
LC1-12 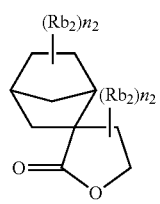
LC1-13 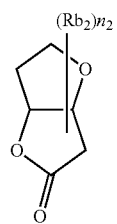
LC1-14 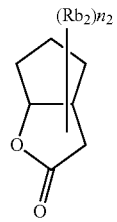
LC1-15 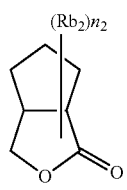
LC1-16 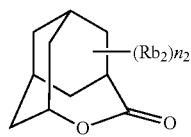
LC1-17 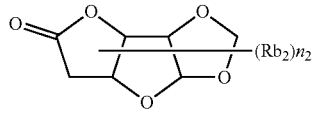
LC1-18 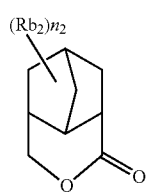
LC1-19 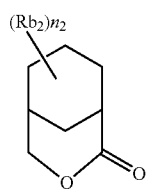
LC1-20 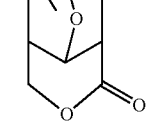
LC1-21 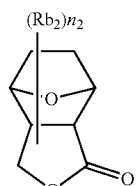
LC1-22 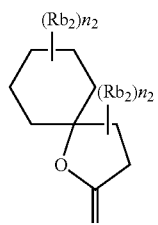
LC1-23 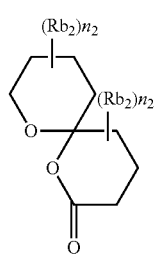

SL1-1
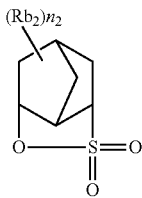

SL1-2
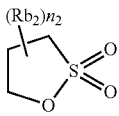

SL1-3
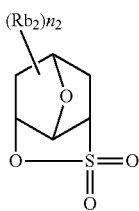

The lactone structural moiety and the sultone structural moiety may each have a substituent ($Rb_2$). Preferred examples of the substituent ($Rb_2$) include an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom (a fluorine atom and the like), a hydroxyl group, a cyano group, a carboxyalkyl group, and an acid-decomposable group. $n_2$ represents an integer of 0 to 4. In a case where $n_2$ is 2 or more, $Rb_2$'s which are present in plural number may be the same as or different from each other, and the substituents ($Rb_2$) which are present in plural number may be bonded to each other to form a ring.

One or more methylene groups constituting the ring in the lactone structure and the sultone structure may be substituted with —C(=O)— or —S(=O)—.

Repeating Unit Represented by General Formula (AI)

Examples of the repeating unit having a group selected from the group consisting of a lactone group and a sultone group include a repeating unit represented by General Formula (AI).

(AI)
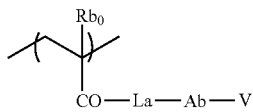

In General Formula (AI), $Rb_0$ represents a hydrogen atom, a halogen atom, or an alkyl group having 1 to 4 carbon atoms.

Preferred examples of the substituent which may be contained in the alkyl group of $Rb_0$ include a hydroxyl group and a halogen atom.

Examples of the halogen atom of $Rb_0$ include a fluorine atom, a chlorine atom, a bromine atom, and an iodine atom. As $Rb_0$, a hydrogen atom or a methyl group is preferable.

La represents a single bond, —O—, or —NH—.

Ab represents a single bond, an alkylene group, a divalent linking group having a monocyclic or polycyclic alicyclic hydrocarbon structure, an ether group, an ester group, a carbonyl group, a carboxyl group, or a divalent group formed by combination thereof. Among those, the single bond or the linking group represented by -$Ab_1$-$CO_2$— is preferable. $Ab_1$ represents a linear or branched alkylene group, or a monocyclic or polycyclic cycloalkylene group, and is preferably a methylene group, an ethylene group, a cyclohexylene group, an adamantylene group, or a norbornylene group.

V represents a group obtained by removing one hydrogen atom from the structure represented by any one of General Formulae (LC1-1) to (LC1-22) and General Formulae (SL1-1) to (SL1-3).

In the repeating unit having a group selected from the group consisting of a lactone group and a sultone group, optical isomers are typically present, but any of the optical isomers may be used. In addition, one optical isomer may be used singly or a mixture of a plurality of the optical isomers may be used. In a case where one optical isomer is mainly used, the optical purity (ee) thereof is preferably 90 or more, and more preferably 95 or more.

Specific examples of the repeating unit having a group selected from the group consisting of a lactone group and a sultone group are shown below, but the present invention is not limited thereto.

(In the formulae, x is H, $CH_3$, $CH_2OH$, or $CF_3$.)

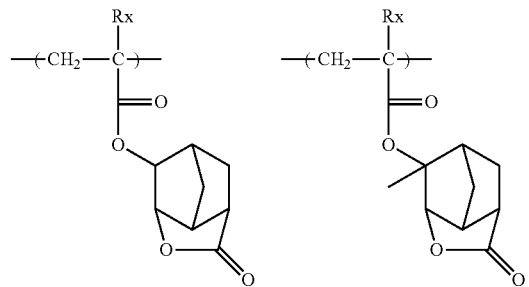

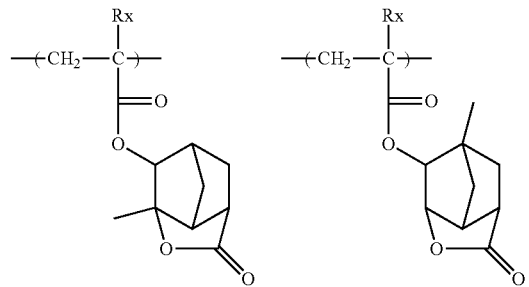

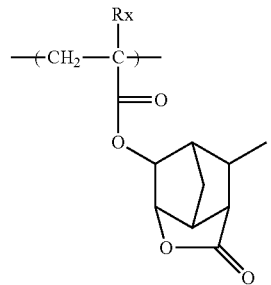

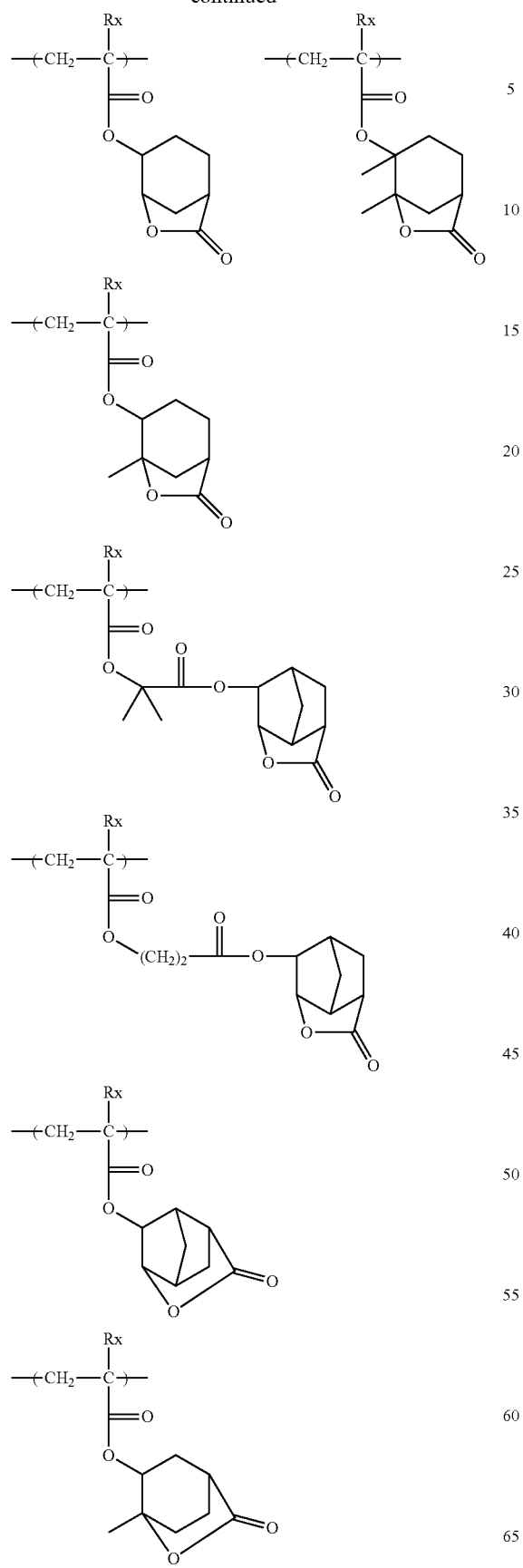
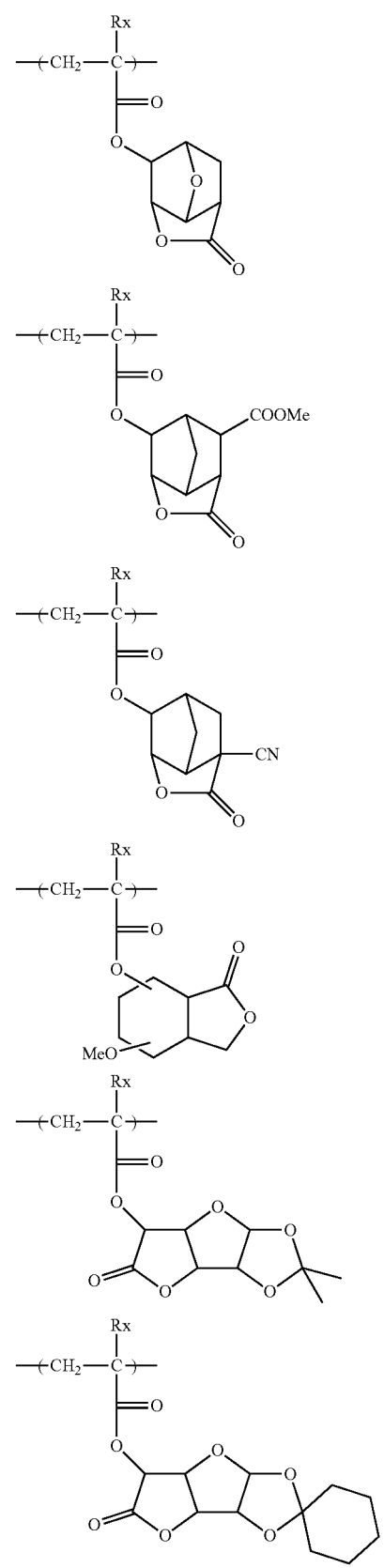

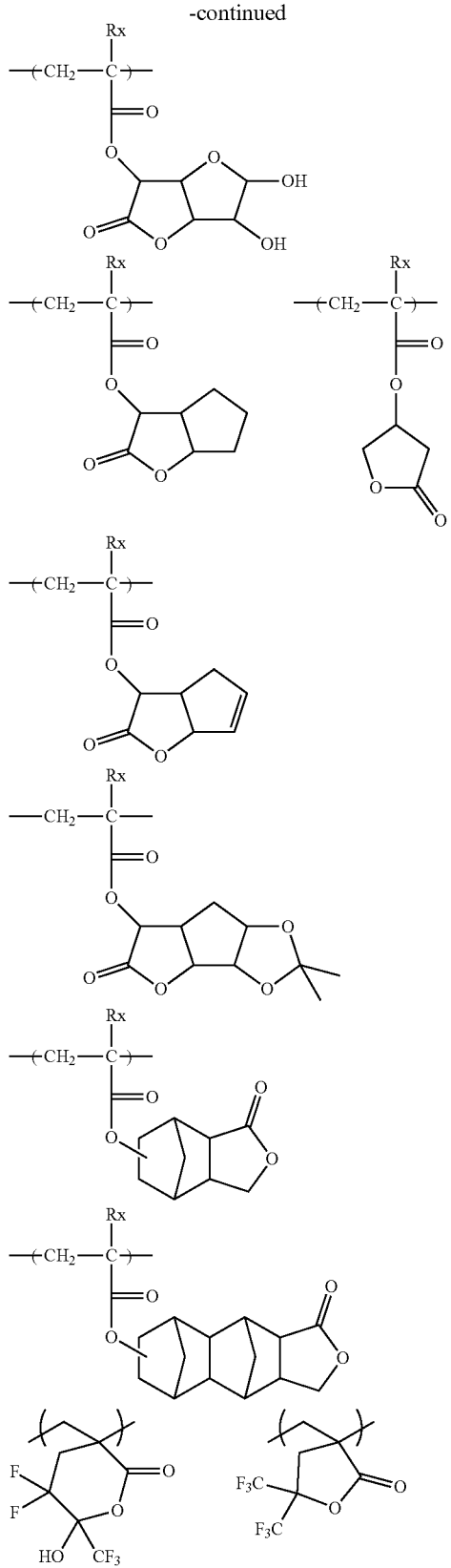

by mass or less, and still more preferably 1% to 40% by mass or less, with respect to all the repeating units of the resin A.

The repeating units having a lactone group or a sultone group may be used singly or in combination of two or more kinds thereof, and in a case where the two or more kinds of the repeating units are used, a total content thereof is preferably within the range.

Repeating Unit Having Group Obtained by Removing Hydrogen Atom from Cyclic Structure Represented by Each of General Formulae (CR-1) to (CR-3)

The resin A may further have a repeating unit having a group obtained by removing a hydrogen atom from a cyclic structure represented by each of General Formulae (CR-1) to (CR-3), in addition to the repeating unit.

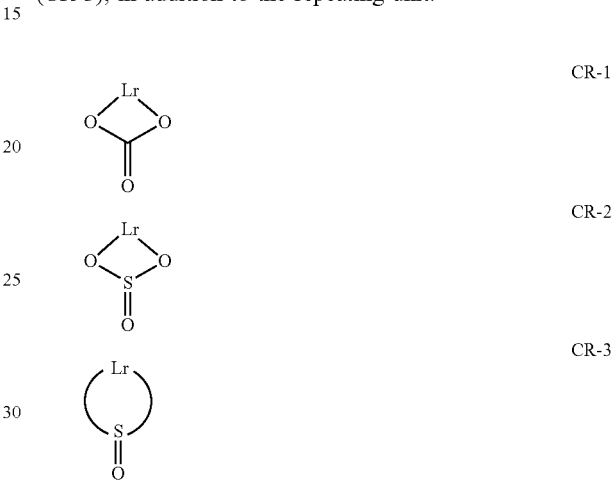

In General Formulae (CR-1) to (CR-3), Lr represents a divalent linking group having one or more hydrogen atoms.

Examples of the divalent linking group include a divalent hydrocarbon group (preferably having 1 to 10 carbon atoms, with examples thereof including an alkylene group, an alkenylene group (for example, —CH=CH—), an alkynylene group (for example, —C≡C—), an arylene group (preferably having 6 to 16 carbon atoms), and a group obtained by combination thereof.

In addition, it is also preferable that the substituents of the divalent hydrocarbon group may be combined with each other to form a ring. That is, the cyclic structure represented by each of General Formulae (CR-1) to (CR-3) may be a polycyclic structure in which two or more rings are fused.

The cyclic structure represented by each of General Formulae (CR-1) to (CR-3) may be directly bonded to the main chain.

Repeating Unit Represented by General Formula (AII)

The repeating unit having a group obtained by removing a hydrogen atom from the cyclic structure represented by each of General Formulae (CR-1) to (CR-3) is preferably a repeating unit represented by General Formula (AII).

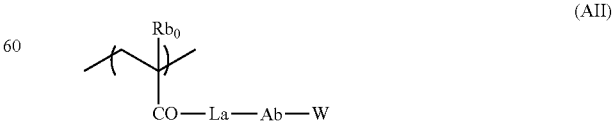

In a case where the resin A has a repeating unit having a lactone group or a sultone group, the content thereof is preferably 50% by mass or less, more preferably 1% to 45%

In General Formula (AII), $Rb_0$, La, and Ab have the same meanings as $Rb_0$, La, and Ab in General Formula (AI), respectively.

W represents a group obtained by removing one hydrogen atom from the cyclic structure represented by any one of Formulae (CR-1) to (CR-3).

In a case where the resin A has a repeating unit having a group formed by removing a hydrogen atom from the cyclic organic structure represented by each of General Formulae (CR-1) to (CR-3), a content thereof is preferably 60% by mass or less, more preferably 50% by mass or less, and still more preferably 40% by mass or less, with respect to all the repeating units of the resin A. The lower limit is not particularly limited, but is, for example, 10% by mass or more with respect to all the repeating units of the resin A.

The repeating units having a group obtained by removing a hydrogen atom from the cyclic organic structure represented by each of General Formulae (CR-1) to (CR-3) may be used singly or in combination of two or more kinds thereof, and in a case where the two or more kinds of the repeating units are used, a total content thereof is preferably within the range.

Repeating Unit Represented by General Formula (B-2)

The resin A may have a repeating unit represented by General Formula (B-2), in addition to the above-mentioned repeating units.

(B-2)

In General Formula (B-2), $TB_2$ represents any group represented by the following structural formula. In the following structural formula, *1 represents a bonding position with another repeating unit and *2 represents a bonding position with $LB_2$.

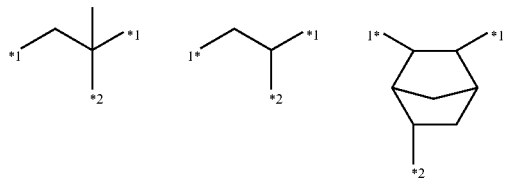

$LB_2$ represents a single bond or a divalent linking group. Examples of the divalent linking group include an ether group (—O—), a carbonyl group (—CO—), an ester group (—COO—), a thioether group (—S—), —$SO_2$—, —$NR_{64}$— ($R_{64}$ represents a hydrogen atom or an alkyl group), a divalent hydrocarbon group (for example, an alkylene group, an alkenylene group (for example, —CH=CH—), an alkynylene group (for example, —C≡C—), and an arylene group), and a group formed by combination thereof (—$CONR_{64}$—, —$CONR_{64}$-alkylene group-, and the like).

Among those, the ester group, the alkylene group, or the -arylene group (preferably a phenylene group)-ester group is preferable.

$XB_2$ represents a single bond or a (mB+1)-valent cyclic organic group. Examples of the cyclic organic group include an aromatic hydrocarbon ring group (preferably a benzene ring group), a non-aromatic hydrocarbon ring group (preferably a cyclohexane ring group, a norbornane ring group, or an adamantane ring group), an aromatic heterocyclic group, and a non-aromatic heterocyclic group. Further, the cyclic organic group is preferably a lactone structure, a sultone structure, or a ring other than the structures represented by General Formulae (CR-1) to (CR-3).

The cyclic organic group may be either a monocycle or a polycycle, and preferably has 5 to 15 carbon atoms.

mB represents an integer of 1 or more, and is preferably 1 to 5. It should be noted that in a case where $XB_2$ is a single bond, mB is 1.

$RB_2$ represents a substituent. The substituent is preferably a carboxy group, a hexafluoroisopropanol group, or a cyclic organic group (preferably a 5- or 6-membered ring) having a group represented by -LN—$SO_2$—$(NRQ)_2$, -LN—NH—$SO_2$—RQ, or —$CF_2$—C(OH)($CF_3$)—.

Furthermore, in a case where $XB_2$ is an aromatic hydrocarbon group or an aromatic heterocyclic group, it is preferable that the substituent is a group other than a hydroxyl group.

In a case where there are a plurality of $RB_2$'s, the plurality of $RB_2$'s may be the same as or different from each other.

$L_N$ represents a single bond or a divalent linking group (for example, the group mentioned in the description of $LB_2$).

$R_Q$ represents a hydrogen atom or a substituent. As the substituent, an alkyl group in which one or more methylene groups may be substituted with oxygen atoms (it is also preferable that the alkyl group further has a fluorine atom as a substituent, resulting in a fluoroalkyl group) is preferable.

In a case where there are a plurality of $R_Q$'s, the plurality of $R_Q$'s may be the same as or different from each other.

In a case where the resin A has a repeating unit represented by General Formula (B-2), a content thereof is preferably 60% by mass or less, more preferably 50% by mass or less, and still more preferably 40% by mass or less, with respect to the total repeating units of the resin A. The lower limit is not particularly limited, but is, for example, 10% by mass or more with respect to all the repeating units of the resin A.

The repeating units represented by General Formula (B-2) may be used singly or in combination of two or more kinds thereof, and in a case where the two or more kinds of the repeating units are used, a total content thereof is within the range.

Repeating Unit Represented by General Formula (B-3) or (B-3b)

The resin A may have a repeating unit represented by General Formula (B-3) and/or a repeating unit represented by General Formula (B-3b), in addition to the above-mentioned repeating units.

(B-3)

(B-3b)

In General Formula (B-3) and General Formula (B-3b), $Ls_1$ and $Ls_2$ each independently represent a single bond or a methylene group. The methylene group is preferably unsubstituted.

In General Formula (B-3), $RB_3a$ and $RB_3b$ each independently represent a hydrogen atom or a substituent. The substituent is preferably an organic group, and the organic group is preferably a group represented by *—C(=O)—O—$RB_3c$. $RB_3c$ represents a hydrogen atom or a substituent (preferably an alkyl group having 1 to 5 carbon atoms). At least one of $RB_3a$ or $RB_3b$ is preferably *—C(=O)—O—$RB_3c$.

In General Formula (B-3) and General Formula (B-3b), $LB_3$ represents a divalent linking group (for example, the groups mentioned in the description of $LB_2$). Among those, a linking group represented by "—single bond or alkylene group-heteroatom or group having a heteroatom-single bond or alkylene group-" is preferable.

The "heteroatom or group having a heteroatom" in the linking group is preferably —CO—$NR_N$—CO— (RN is a hydrogen atom or a substituent (a phenyl group, an alkyl group which may be fluorinated, an alkylsulfonyl group which may be fluorinated, and the like)), or an ether group.

The two alkylene groups which may be present in the linking group each independently preferably have 1 to 3 carbon atoms.

Specific examples of the repeating unit represented by General Formula (B-3) or (B-3b) are shown below, but the present invention is not limited thereto.

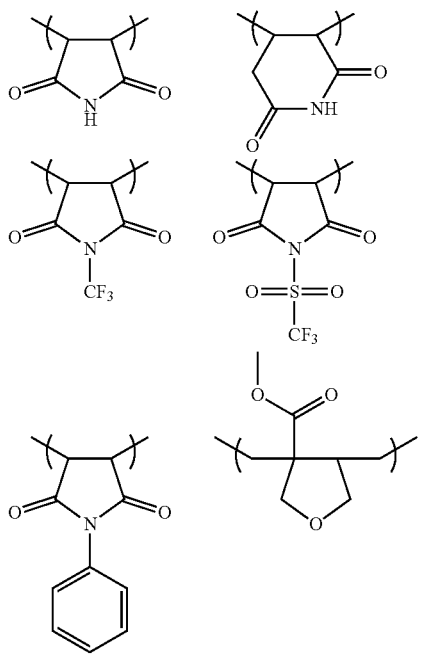

In a case where the resin A has a repeating unit represented by General Formula (B-3) or (B-3b), a content thereof is preferably 60% by mass or less, more preferably 50% by mass or less, and still more preferably 40% by mass or less, with respect to all the repeating units of the resin A. The lower limit is not particularly limited, but is, for example, 10% by mass or more with respect to all the repeating units of the resin A.

The repeating units represented by General Formula (B-3) or (B-3b) may be used singly or in combination of two or more kinds thereof, and in a case where the two or more kinds of the repeating units are used, a total content thereof is preferably within the range.

The resin A can be synthesized in accordance with an ordinary method (for example, radical polymerization).

The weight-average molecular weight of the resin A as a calculated value in terms of polystyrene by a GPC method is preferably 1,000 to 200,000, more preferably 2,000 to 50,000, and still more preferably 4,000 to 20,000. By setting the weight-average molecular weight of the resin A to 1,000 to 200,000, it is possible to prevent the deterioration of heat resistance and dry etching resistance, and also prevent the deterioration of film forming properties due to deteriorated developability or increased viscosity.

The dispersity (molecular weight distribution) of the resin A is usually 1 to 5, preferably 1 to 3, more preferably 1.2 to 3.0, and still more preferably 1.2 to 2.0. As the dispersity is smaller, the resolution and the resist shape are excellent, the side wall of the resist pattern is smooth, and the roughness is excellent.

In the resist composition, the content of the resin A is preferably 50% to 99.9% by mass, and more preferably 60% to 99.0% by mass in the total solid content.

Moreover, the resins A may be used singly or in combination of two or more kinds thereof, and in a case where the two or more kinds of the resins A are used, a total content thereof is preferably within the range.

<Photoacid Generator>

The resist composition includes a photoacid generator. The photoacid generator is a compound that generates an acid upon exposure with EUV light.

The photoacid generator may be in a form of a low-molecular-weight compound or in a form incorporated into a part of a polymer. Further, a combination of the form of a low-molecular-weight compound and the form incorporated into a part of a polymer may also be used.

In a case where the photoacid generator of the present invention is in the form of the low-molecular-weight compound, the molecular weight is preferably 3,000 or less, more preferably 2,000 or less, and still more preferably 1,000 or less.

In a case where the photoacid generator is in the form incorporated into a part of a polymer, it may be incorporated into the resin A or into a resin other than the resin A.

In the present invention, the photoacid generator is preferably in a form of a low-molecular-weight compound.

The photoacid generator is not particularly limited as long as it is a known photoacid generator, but a compound that generates an organic acid upon irradiation with EUV light is preferable, and a photoacid generator having a fluorine atom or an iodine atom in the molecule is more preferable.

Examples of the organic acid include sulfonic acids (an aliphatic sulfonic acid, an aromatic sulfonic acid, and a camphor sulfonic acid), carboxylic acids (an aliphatic carboxylic acid, an aromatic carboxylic acid, and an aralkyl-carboxylic acid), a carbonylsulfonylimide acid, a bis(alkylsulfonyl)imide acid, and a tris(alkylsulfonyl)methide acid.

The volume of an acid generated from the photoacid generator is not particularly limited, but from the viewpoint of suppression of diffusion of an acid generated into the unexposed area upon exposure and improvement of the resolution, the volume is preferably 240 Å$^3$ or more, more preferably 305 Å$^3$ or more, still more preferably 350 Å$^3$ or more, and particularly preferably 400 Å$^3$ or more. Further, from the viewpoints of the sensitivity or the solubility in an applied solvent, the volume of the acid generated from the photoacid generator is preferably 1,500 Å³ or less, more preferably 1,000 Å³ or less, and still more preferably 700 Å³ or less.

The value of this volume is determined using "WinMOPAC" manufactured by Fujitsu Limited. With regard to the calculation of a value of the volume, first, the chemical structure of an acid according to each example is input, next, using this structure as an initial structure, the most stable conformation of each acid is determined by molecular force field calculation using a Molecular Mechanics (MM) 3 method, and thereafter, with respect to the most stable conformation, molecular orbital calculation using a Parameterized Model (PM) 3 method is performed, whereby the "accessible volume" of each acid can be calculated.

The structure of the acid generated from the photoacid generator is not particularly limited, but from the viewpoint that the diffusion of an acid is suppression and the resolution is improved, it is preferable that the interaction between the acid generated from the photoacid generator and the resin A is strong. From this viewpoint, in a case where the acid generated from the photoacid generator is an organic acid, it is preferable that a polar group is further contained, in addition to an organic acid group such as a sulfonic acid group, a carboxylic acid group, a carbonylsulfonylimide acid group, a bissulfonylimide acid group, and a trissulfonylmethide acid group.

Examples of the polar group include an ether group, an ester group, an amido group, an acyl group, a sulfo group, a sulfonyloxy group, a sulfonamido group, a thioether group, a thioester group, a urea group, a carbonate group, a carbamate group, a hydroxyl group, and a mercapto group.

The number of the polar groups contained in the acid generated is not particularly limited, and is preferably 1 or more, and more preferably 2 or more. It should be noted that from the viewpoint that excessive development is suppressed, the number of the polar groups is preferably less than 6, and more preferably less than 4.

As the photoacid generator, photoacid generators that generate acids, as exemplified below, are preferable. Further, in some of the examples, the calculated values of the volumes are added (unit: Å³).

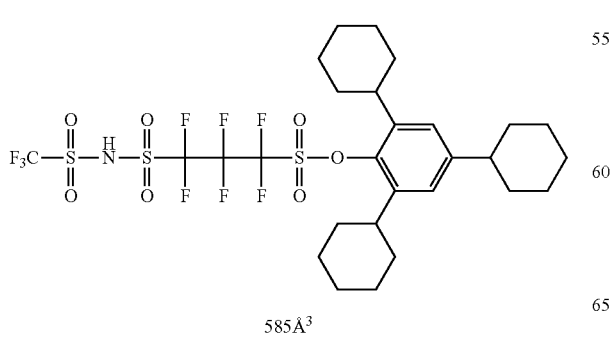

585Å³

-continued

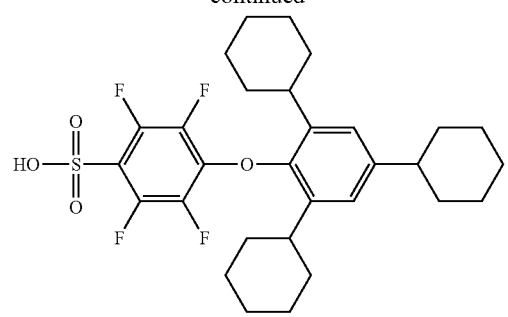

585Å³

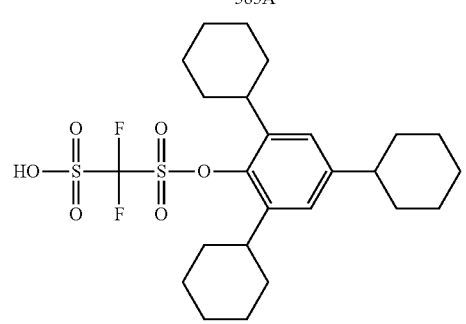

525Å³

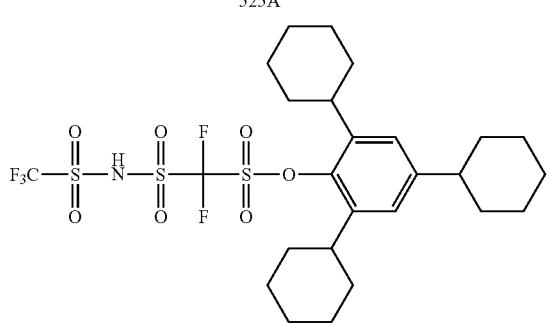

554Å³

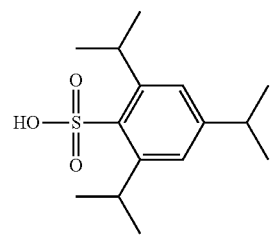

303Å³

437Å³

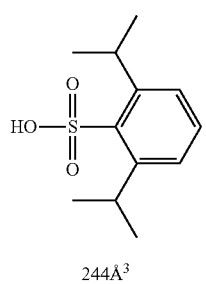
244Å³
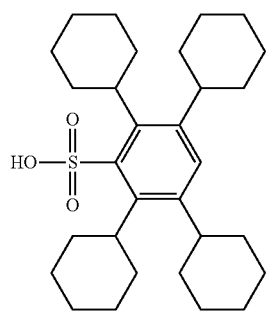
529Å³
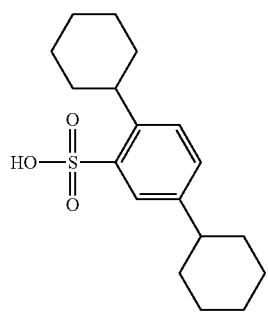
336Å³
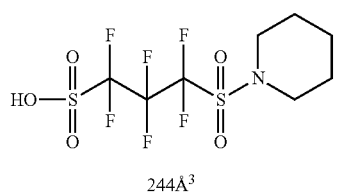
244Å³
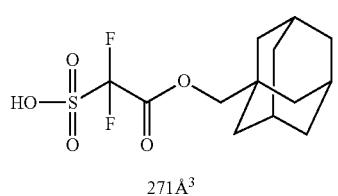
271Å³
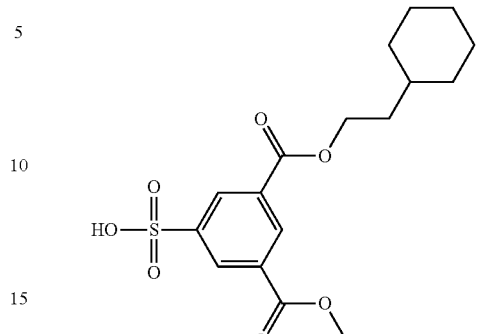
457Å³
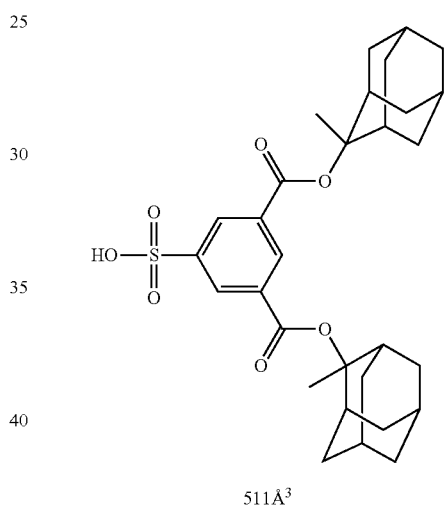
511Å³
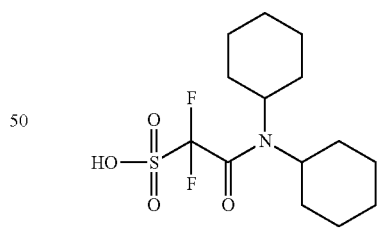
311Å³
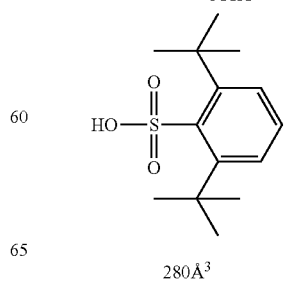
280Å³

-continued
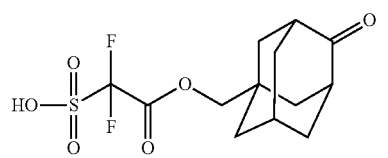
266Å$^3$
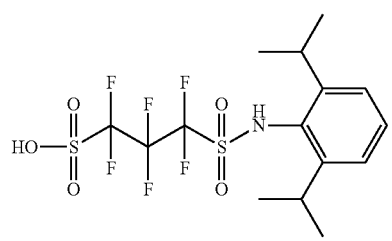
339Å$^3$
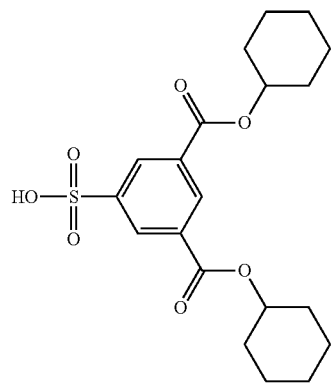
380Å$^3$
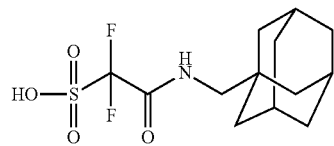
277Å$^3$
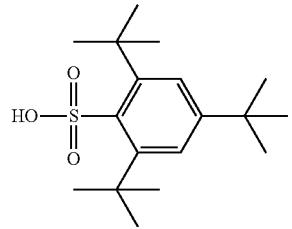
357Å$^3$
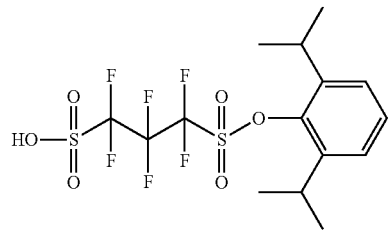
347Å$^3$
-continued
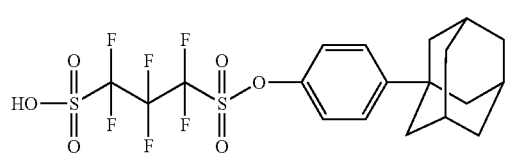
380Å$^3$
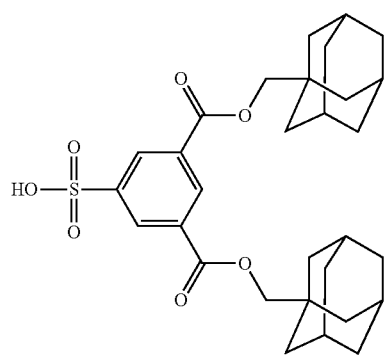
519Å$^3$
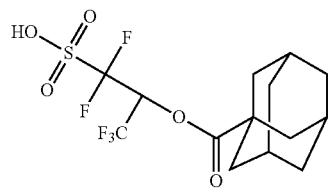
291Å$^3$
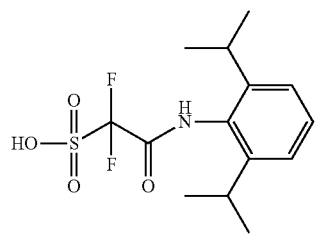
297Å$^3$
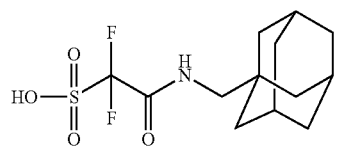
277Å$^3$
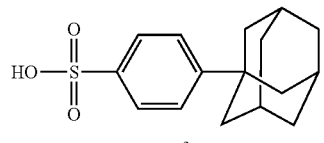
281Å$^3$
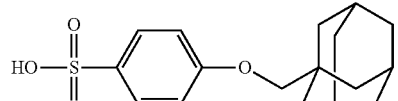
310Å$^3$

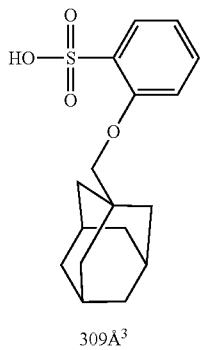

309Å³

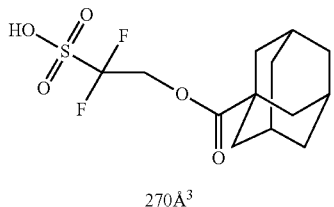

270Å³

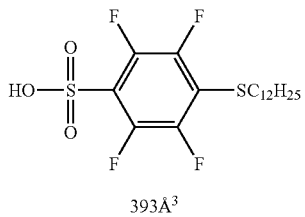

393Å³

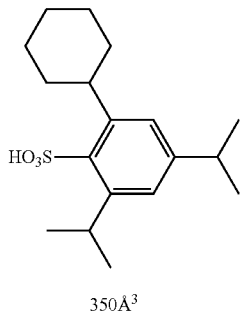

350Å³

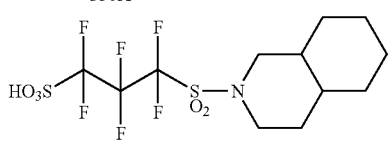

311Å³

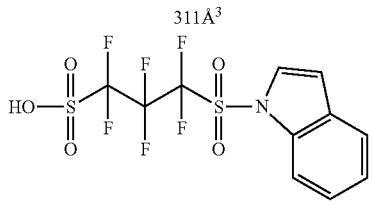

250Å³

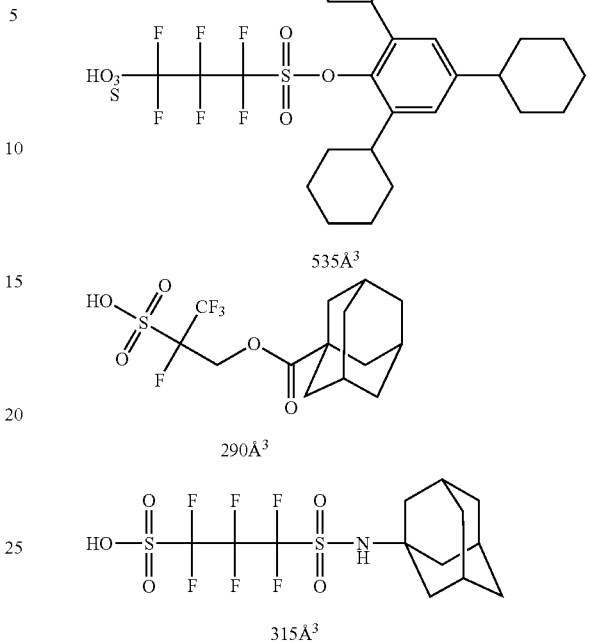

535Å³

290Å³

315Å³

Among those, the photoacid generator is preferably a photoacid generator including an anionic moiety and a cationic moiety from the viewpoint that the effects of the present invention are more excellent.

More specifically, the photoacid generator is preferably a compound represented by General Formula (ZI) or a compound represented by General Formula (ZII).

In General Formula (ZI), $R_{201}$, $R_{202}$, and $R_{203}$ each independently represent an organic group.

The number of carbon atoms of the organic group as each of $R_{201}$, $R_{202}$, and $R_{203}$ is preferably 1 to 30, and more preferably 1 to 20.

Furthermore, two of $R_{201}$ to $R_{203}$ may be bonded to each other to form a ring structure, and the ring may include an oxygen atom, a sulfur atom, an ester group, an amide bond, or a carbonyl group. Examples of the group formed by bonding two of $R_{201}$ to $R_{203}$ include an alkylene group (for example, a butylene group and a pentylene group).

$Z^-$ represents a non-nucleophilic anion (anion having a remarkably low ability of causing a nucleophilic reaction).

Examples of the non-nucleophilic anion include a sulfonate anion (such as an aliphatic sulfonate anion, an aromatic sulfonate anion, and a camphor sulfonate anion), a carboxylate anion (such as an aliphatic carboxylate anion, an aromatic carboxylate anion, and an aralkyl carboxylate anion), a sulfonylimide anion, a bis(alkylsulfonyl)imide anion, and a tris(alkylsulfonyl)methide anion.

The aliphatic moiety in the aliphatic sulfonate anion and the aliphatic carboxylate anion may be an alkyl group or a cycloalkyl group, and is preferably a linear or branched alkyl group having 1 to 30 carbon atoms or a cycloalkyl group having 3 to 30 carbon atoms.

As the aromatic ring group in the aromatic sulfonate anion and the aromatic carboxylate anion, an aryl group having 6 to 14 carbon atoms is preferable, and examples thereof include a phenyl group, a tolyl group, and a naphthyl group.

Specific examples of the substituent which can be contained in the alkyl group (preferably having 1 to 10 carbon atoms, with a fluoroalkyl group (also including a perfluoroalkyl group) being preferable), the cycloalkyl group, and the aryl group exemplified above include a nitro group, a halogen atom such as fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), an alkoxycarbonyloxy group (preferably having 2 to 7 carbon atoms), an alkylthio group (preferably having 1 to 15 carbon atoms), an alkylsulfonyl group (preferably having 1 to 15 carbon atoms), an alkyliminosulfonyl group (preferably having 1 to 15 carbon atoms), an aryloxysulfonyl group (preferably having 6 to 20 carbon atoms), an alkylaryloxysulfonyl group (preferably having 7 to 20 carbon atoms), a cycloalkylaryloxysulfonyl group (preferably having 10 to 20 carbon atoms), an alkyloxyalkyloxy group (preferably having 5 to 20 carbon atoms), and a cycloalkylalkyloxyalkyloxy group (preferably having 8 to 20 carbon atoms).

As the aralkyl group in the aralkyl carboxylate anion, an aralkyl group having 7 to 12 carbon atoms is preferable, and examples thereof include a benzyl group, a phenethyl group, a naphthylmethyl group, a naphthylethyl group, and a naphthylbutyl group.

Examples of the sulfonylimide anion include a saccharin anion.

As the alkyl group in the bis(alkylsulfonyl)imide anion and the tris(alkylsulfonyl)methide anion, an alkyl group having 1 to 5 carbon atoms is preferable. Examples of the substituent of the alkyl group include a halogen atom, an alkyl group substituted with a halogen atom, an alkoxy group, an alkylthio group, an alkyloxysulfonyl group, an aryloxysulfonyl group, and a cycloalkylaryloxysulfonyl group, and the fluorine atom or the alkyl group substituted with a fluorine atom is preferable.

In addition, the alkyl groups in the bis(alkylsulfonyl) imide anion may be bonded to each other to form a ring structure. Thus, the acid strength is increased.

Other examples of the non-nucleophilic anion include fluorinated phosphorus (for example, $PF_6^-$), fluorinated boron (for example, $BF_4^-$), and fluorinated antimony (for example, $SbF_6^-$).

As the non-nucleophilic anion, an aliphatic sulfonate anion substituted with a fluorine atom at least at the α-position of the sulfonic acid, an aromatic sulfonate anion substituted with a fluorine atom or a fluorine atom-containing group, a bis(alkylsulfonyl)imide anion in which the alkyl group is substituted with a fluorine atom, or a tris(alkylsulfonyl)methide anion in which the alkyl group is substituted with a fluorine atom is preferable. Among these, a perfluoroaliphatic sulfonate anion (more preferably having 4 to 8 carbon atoms) or a fluorine atom-containing benzenesulfonate anion is more preferable, and a nonafluorobutanesulfonate anion, a perfluorooctanesulfonate anion, a pentafluorobenzenesulfonate anion, or a 3,5-bis(trifluoromethyl)benzenesulfonate anion is still more preferable.

From the viewpoint of the acid strength, it is preferable that the pKa of an acid generated is −1 or less so as to improve the sensitivity.

Moreover, as the non-nucleophilic anion, an anion represented by General Formula (AN1) is also preferable.

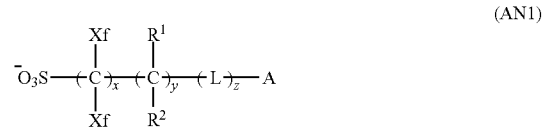

(AN1)

In the formula,

Xf's each independently represent a fluorine atom or an alkyl group substituted with at least one fluorine atom.

$R^1$ and $R^2$ each independently represent a hydrogen atom, a fluorine atom, or an alkyl group, and in a case where $R^1$'s and $R^2$'s are present in plural numbers, they may be the same as or different from each other.

L represents a divalent linking group, and in a case where L's are present in plural number, they may be the same as or different from each other.

A represents a cyclic organic group.

x represents an integer of 1 to 20, y represent an integer of 0 to 10, and z represents an integer of 0 to 10.

General Formula (AN1) will be described in more detail.

As the alkyl group in the alkyl group substituted with a fluorine atom of Xf, an alkyl group having 1 to 10 carbon atoms is preferable, and an alkyl group having 1 to 4 carbon atoms is more preferable. In addition, as the alkyl group in the alkyl group substituted with a fluorine atom of Xf a perfluoroalkyl group is preferable.

Xf is preferably a fluorine atom or a perfluoroalkyl group having or 1 to 4 carbon atoms. Specific examples of Xf include a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, the fluorine atom or $CF_3$ is preferable. Among those, it is preferable that both Xf's are a fluorine atom.

The alkyl group of each of $R^1$ and $R^2$ may have a substituent (preferably a fluorine atom), and the number of carbon atoms in the substituent is preferably 1 to 4. As the substituent, a perfluoroalkyl group having 1 to 4 carbon atoms is preferable. Specific examples of the alkyl group having a substituent of each of $R^1$ and $R^2$ include $CF_3$, $C_2F_5$, $C_3F_7$, $C_4F_9$, $C_5F_{11}$, $C_6F_{13}$, $C_7F_{15}$, $C_8F_{17}$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$, and $CH_2CH_2C_4F_9$, and among these, $CF_3$ is preferable.

As each of $R^1$ and $R^2$, a fluorine atom or $CF_3$ is preferable.

x is preferably an integer of 1 to 10, and more preferably 1 to 5.

y is preferably an integer of 0 to 4, and more preferably 0.

z is preferably an integer of 0 to 5, and more preferably an integer of 0 to 3.

The divalent linking group of L is not particularly limited, and examples thereof include —COO—, —CO—, —O—, —S—, —SO—, —SO$_2$—, an alkylene group, a cycloalkylene group, an alkenylene group, a linking group obtained by linking a plurality of these groups to each other, with the linking group having 12 or less carbon atoms in total being preferable. Among those, —COO—, —OCO—, —CO—, or —O— is preferable, and —COO— or —OCO— is still more preferable.

The cyclic organic group of A is not particularly limited as long as it has a cyclic structure, and examples thereof include an alicyclic group, an aromatic ring group, and a heterocyclic group (including not only an aromatic heterocyclic group but also a non-aromatic heterocyclic group).

The alicyclic group may be either a monocycle or a polycycle, and examples thereof include a monocyclic cycloalkyl group such as a cyclopentyl group, a cyclohexyl group, and a cyclooctyl group, and a polycyclic cycloalkyl group such as a norbornyl group, a tricyclodecanyl group, a tetracyclodecanyl group, a tetracyclododecanyl group, and an adamantyl group. Among those, an alicyclic group with a bulky structure, having 7 or more carbon atoms, such as a norbornyl group, a tricyclodecanyl group, a tetracyclodecanyl group, a tetracyclododecanyl group, and an adamantyl group is preferable from the viewpoints the in-film diffusion in a heating step after exposure can be suppressed and a mask error enhancement factor (MEEF) is improved.

Examples of the aromatic ring group include a benzene ring, a naphthalene ring, a phenanthrene ring, and an anthracene ring.

Examples of the heterocyclic group include a group derived from a furan ring, a thiophene ring, a benzofuran ring, a benzothiophene ring, a dibenzofuran ring, a dibenzothiophene ring, a pyridine ring, or the like. Among those, the group derived from the furan ring, the thiophene ring, or the pyridine ring is preferable.

Moreover, the cyclic organic group also includes a lactone structure, and specific examples thereof include the above-mentioned lactone structures represented by General Formulae (LC1-1) to (LC1-17).

The cyclic organic group may have a substituent. Examples of the substituent include an alkyl group (which may be linear, branched, or cyclic, and preferably has 1 to 12 carbon atoms), a cycloalkyl group (which may be either a monocycle or a polycycle, in a case where the cycloalkyl group is the polycycle, it may be a Spiro ring, and preferably has 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, and a sulfonic ester group. Incidentally, the carbon constituting the cyclic organic group (the carbon contributing to ring formation) may be a carbonyl carbon.

Examples of the organic group of each of $R_{201}$, $R_{202}$, and $R_{203}$ include an aryl group, an alkyl group, and a cycloalkyl group.

It is preferable that at least one of $R_{201}$, $R_{202}$, or $R_{203}$ is an aryl group, and it is more preferable that all of $R_{201}$, $R_{202}$, or $R_{203}$ are aryl groups. As the aryl group, not only a phenyl group or a naphthyl group but also a heteroaryl group such as an indole residue and a pyrrole residue can be used.

As the alkyl group of each of $R_{201}$ to $R_{203}$, a linear or branched alkyl group having 1 to 10 carbon atoms is preferable, and a methyl group, an ethyl group, an n-propyl group, an i-propyl group, an n-butyl group, or the like is more preferable.

As the cycloalkyl group of each of $R_{201}$ to $R_{203}$, a cycloalkyl group having 3 to 10 carbon atoms is preferable, and a cyclopropyl group, a cyclobutyl group, a cyclopentyl group, a cyclohexyl group, or a cycloheptyl group is more preferable.

Examples of the substituent which may be contained in these groups include a nitro group, a halogen atom such as a fluorine atom, a carboxyl group, a hydroxyl group, an amino group, a cyano group, an alkoxy group (preferably having 1 to 15 carbon atoms), a cycloalkyl group (preferably having 3 to 15 carbon atoms), an aryl group (preferably having 6 to 14 carbon atoms), an alkoxycarbonyl group (preferably having 2 to 7 carbon atoms), an acyl group (preferably having 2 to 12 carbon atoms), and an alkoxycarbonyloxy group (preferably having 2 to 7 carbon atoms).

In General Formula (ZII), $R_{204}$ and $R_{205}$ each independently represent an aryl group, an alkyl group, or a cycloalkyl group.

The aryl group, the alkyl group, and the cycloalkyl group of each of $R_{204}$ and $R_{205}$ are the same as the above-mentioned groups as the aryl group, the alkyl group, and the cycloalkyl group of each of $R_{201}$ to $R_{203}$ in General Formula (ZI).

Examples of the substituent which may be contained in the aryl group, the alkyl group, and the cycloalkyl group of each of $R_{204}$ to $R_{205}$ include the same ones which may be contained in the above-mentioned groups as the aryl group, the alkyl group, and the cycloalkyl group of each of $R_{201}$ to $R_{203}$ in the above-described General Formula (ZI).

$Z^-$ represents a non-nucleophilic anion, and examples thereof include the same ones as described as the non-nucleophilic anion of $Z^-$ in General Formula (ZI).

With regard to the photoacid generator, reference can be made to paragraphs [0368] to [0377] of JP2014-041328A and paragraphs [0240] to [0262] of JP2013-228681A (corresponding to paragraph [0339] of US2015/0004533A), the contents of which are incorporated herein by reference. In addition, specific preferred examples of the photoacid generator include, but are not limited to, the following compounds. In addition, a photoacid generator obtained by suitably exchanging a combination of the anion and the cation in the photoacid generator below may also be used.

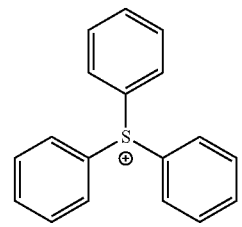

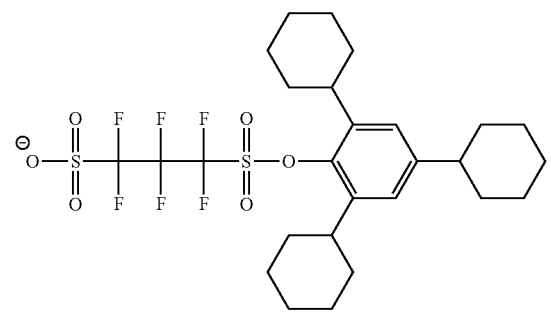

(z1)

(z2)
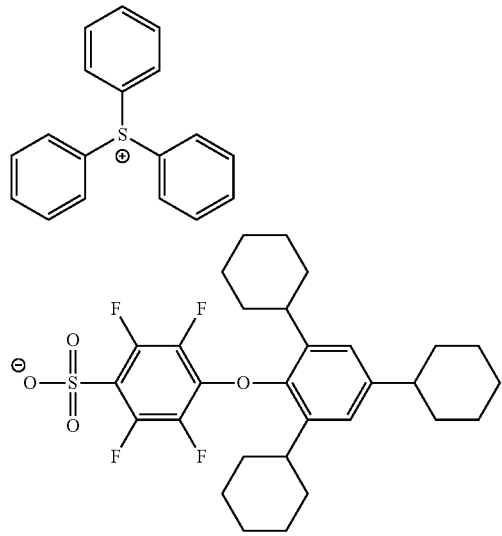
(z3)
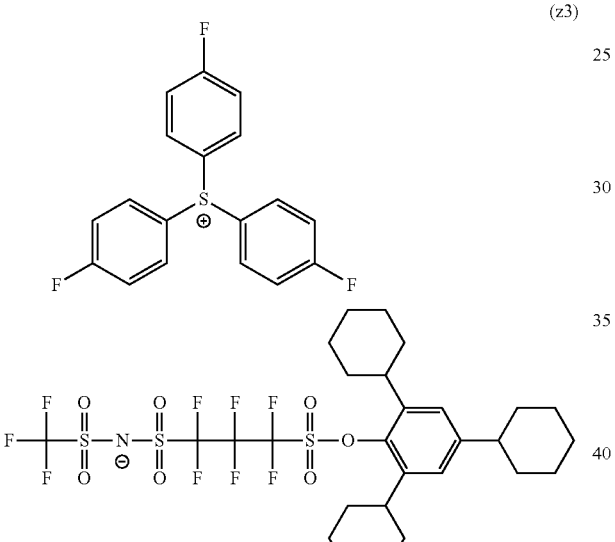
(z4)
(z5)
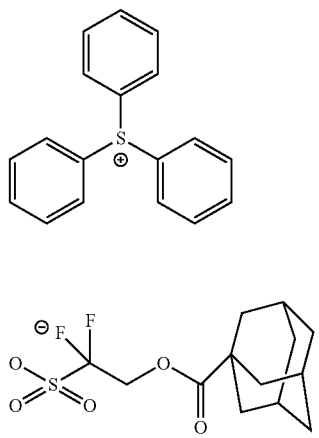
(z6)
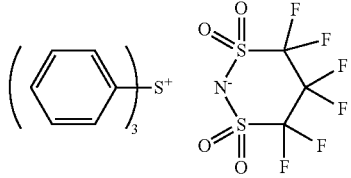
(z7)
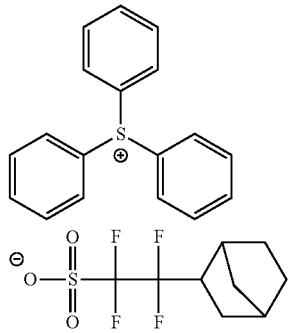
(z8)
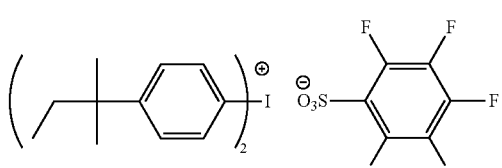
(z9)
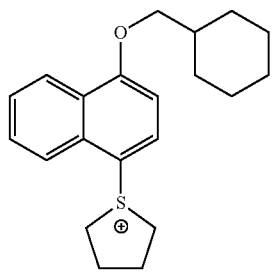

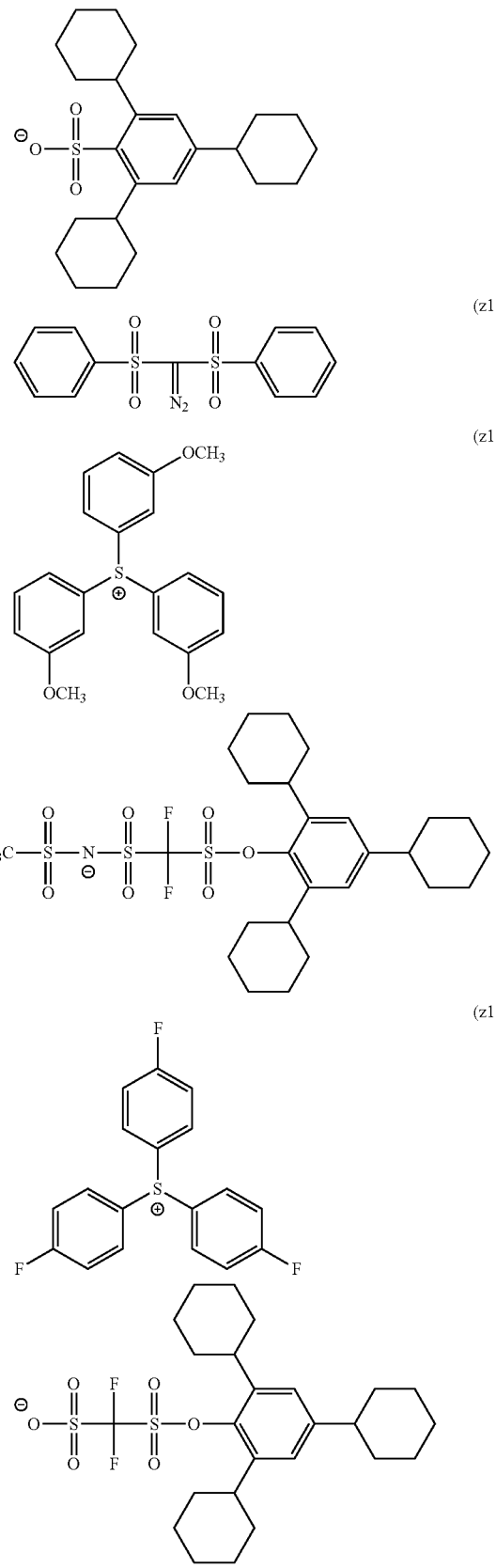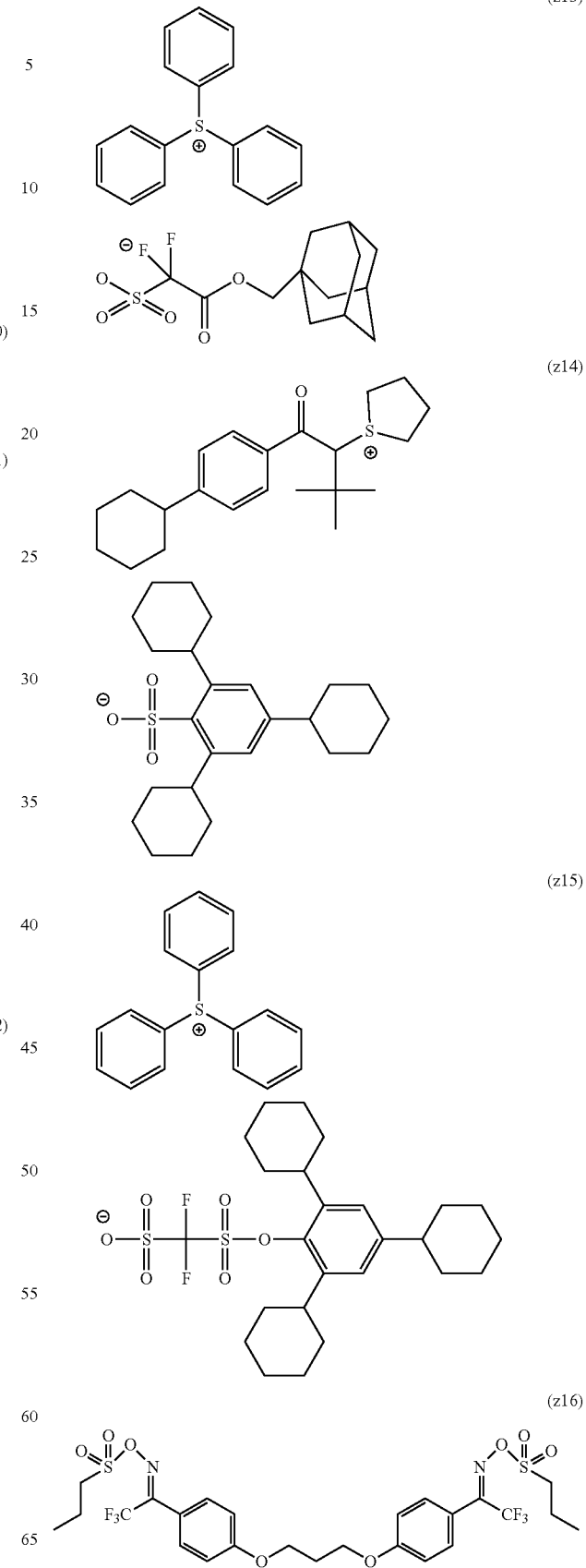

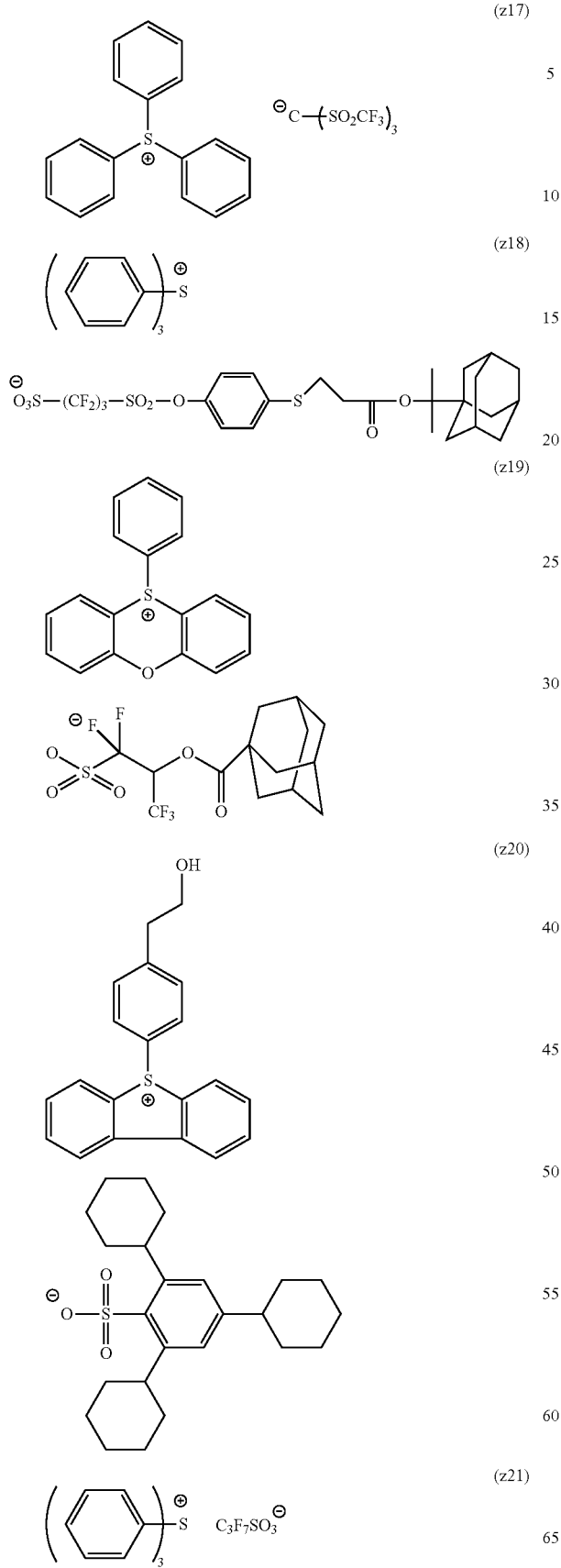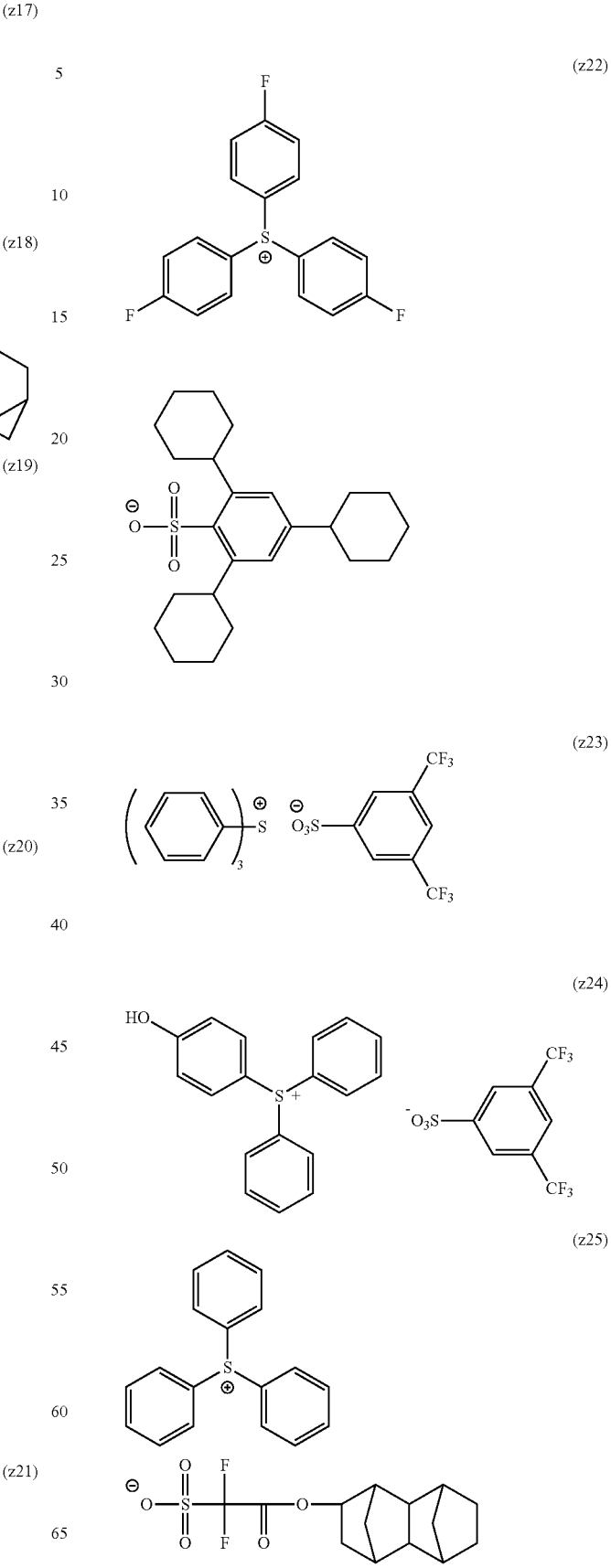

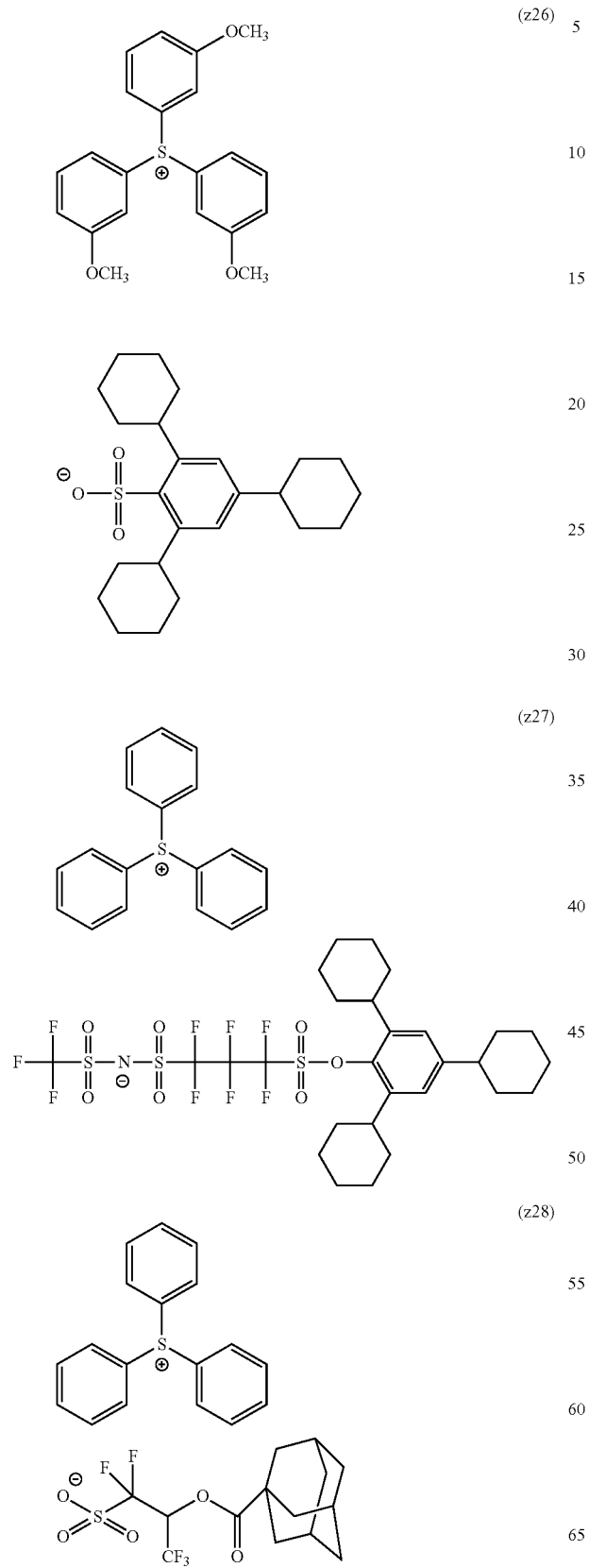
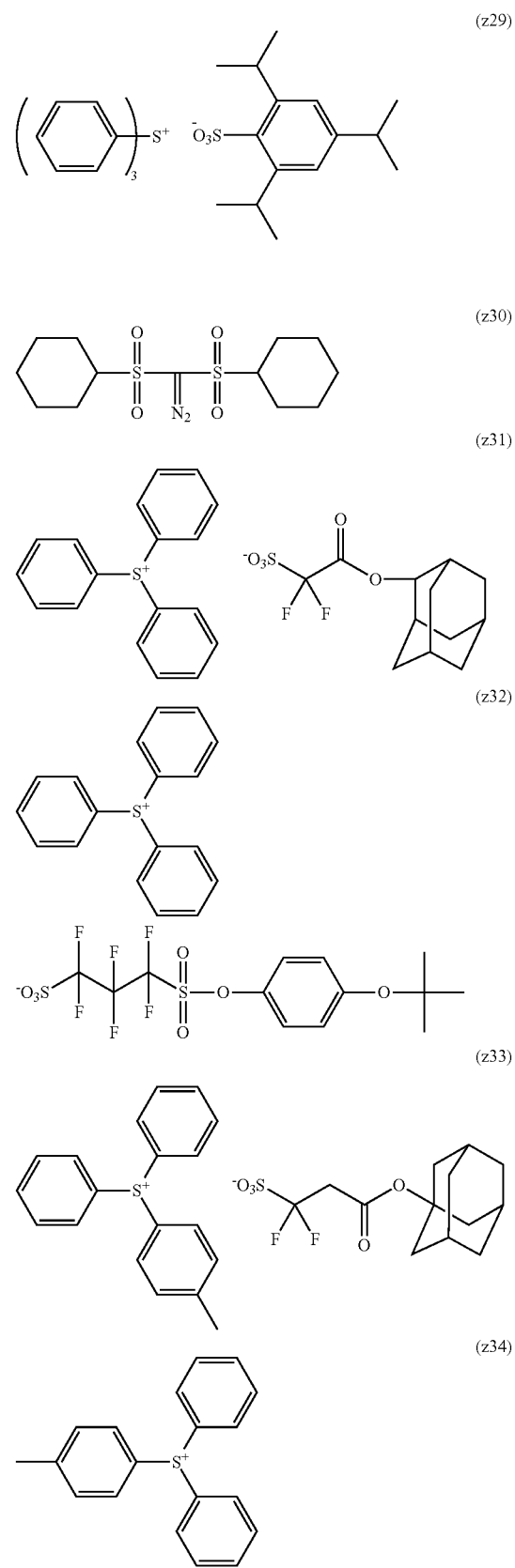

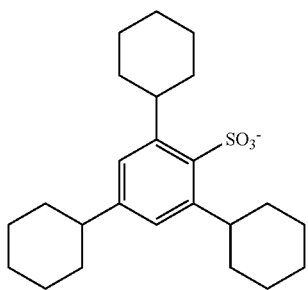
(z35)
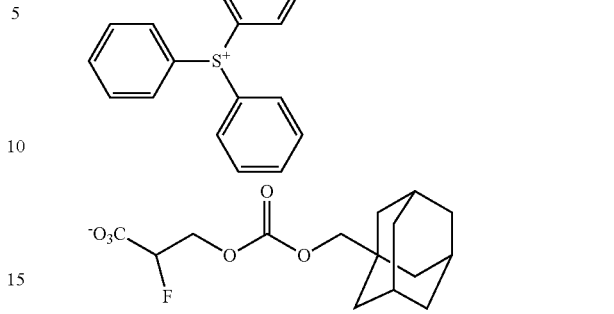
(z39)

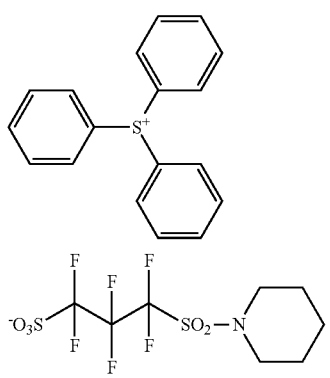
(z36)
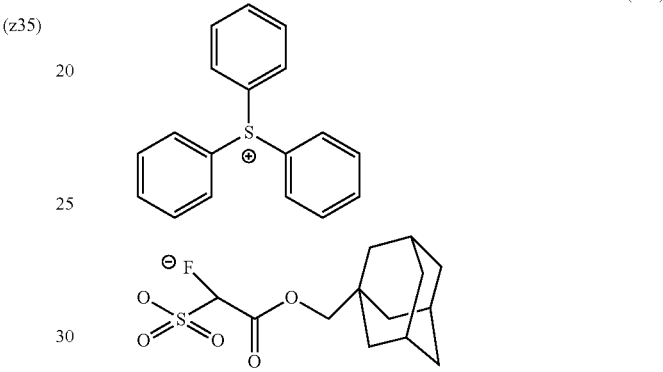
(z40)

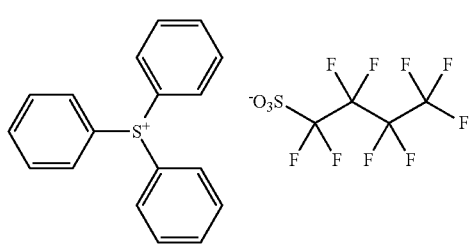
(z37)

The content of the photoacid generator in the resist composition is not particularly limited, but from the viewpoint that the effects of the present invention are more excellent, the content is preferably 5% to 45% by mass, more preferably 10% to 40% by mass, still more preferably 10% to 35% by mass, and particularly preferably 12% to 35% by mass, with respect to the total solid content of the composition.

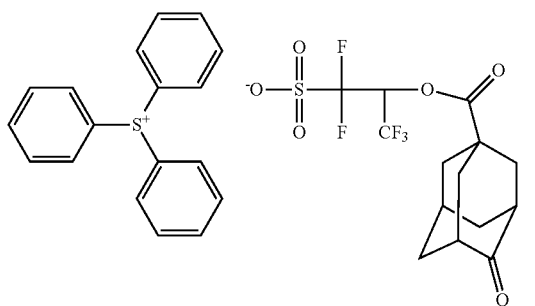

Furthermore, the content of the photoacid generator in 1 g of the solid content of the resist composition is not particularly limited, but from the viewpoint that the effects of the present invention are more excellent, the content is preferably 0.1 to 0.6 mmol, more preferably 0.2 to 0.5 mmol, still more preferably 0.3 to 0.5 mmol, and particularly preferably more than 0.3 mmol and 0.45 mmol or less.

The photoacid generators may be used singly or in combination of two or more kinds thereof, and in a case where the two or more kinds of the photoacid generators are used, a total content thereof is preferably within the range.

<Acid Diffusion Control Agent>

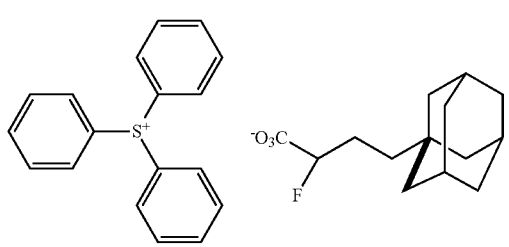
(z38)

The resist composition may further include an acid diffusion control agent. The acid diffusion control agent acts as a quencher that traps an acid generated from a photoacid generator and functions to control the phenomenon of acid diffusion in the resist film.

(Basic Compound)

The acid diffusion control agent may be, for example, a basic compound.

As the basic compound, compounds having structures represented by General Formulae (A) to (E) are preferable.

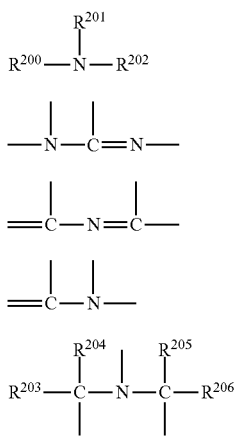

(A)

(B)

(C)

(D)

(E)

In General Formulae (A) and (E), $R^{200}$, $R^{201}$, and $R^{202}$ may be the same as or different from each other, and each represent a hydrogen atom, an alkyl group (preferably having 1 to 20 carbon atoms), a cycloalkyl group (preferably having 3 to 20 carbon atoms), or an aryl group (preferably having 6 to 20 carbon atoms), in which $R^{201}$ and $R^{202}$ may be bonded to each other to form a ring.

With regard to the alkyl group, as the alkyl group containing a substituent, an aminoalkyl group having 1 to 20 carbon atoms, a hydroxyalkyl group having 1 to 20 carbon atoms, or a cyanoalkyl group having 1 to 20 carbon atoms is preferable.

$R^{203}$, $R^{204}$, $R^{205}$, and $R^{206}$ may be the same as or different from each other, and each represent an alkyl group having 1 to 20 carbon atoms.

It is more preferable that the alkyl groups in General Formulae (A) and (E) are unsubstituted.

As the basic compound, guanidine, aminopyrrolidine, pyrazole, pyrazoline, piperazine, aminomorpholine, aminoalkylmorpholine, piperidine, or the like is preferable. Among these, a compound having an imidazole structure, a diazabicyclo structure, an onium hydroxide structure, an onium carboxylate structure, a trialkylamine structure, an aniline structure, or a pyridine structure; an alkylamine derivative having a hydroxyl group and/or an ether bond; an aniline derivative having a hydroxyl group and/or an ether bond; or the like is more preferable.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]non-5-ene, and 1,8-diazabicyclo[5,4,0]undec-7-ene. Examples of the compound having an onium hydroxide structure include triarylsulfonium hydroxide, phenacylsulfonium hydroxide, and sulfonium hydroxide having a 2-oxoalkyl group. Specific examples thereof include triphenylsulfonium hydroxide, tris(t-butylphenyl)sulfonium hydroxide, bis(t-butylphenyl)iodonium hydroxide, phenacylthiophenium hydroxide and 2-oxopropylthiophenium hydroxide. The compound having an onium carboxylate structure is formed by carboxylation of an anionic moiety of a compound having an onium hydroxide structure, and examples thereof include acetate, adamantane-1-carboxylate, and perfluoroalkyl carboxylate. Examples of the compound having a trialkylamine structure include tri(n-butyl)amine and tri(n-octyl)amine. Examples of the aniline compound include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethyl)amine. Examples of the aniline derivative having a hydroxyl group and/or an ether bond include N,N-bis(hydroxyethyl)aniline.

Preferred examples of the basic compound include an amine compound having a phenoxy group and an ammonium salt compound having a phenoxy group.

As the amine compound, a primary, secondary, or tertiary amine compound can be used, and an amine compound in which at least one alkyl group is bonded to a nitrogen atom is preferable. The amine compound is more preferably the tertiary amine compound. In the amine compound, as long as at least one alkyl group (preferably having 1 to 20 carbon atoms) is bonded to a nitrogen atom, a cycloalkyl group (preferably having 3 to 20 carbon atoms) or an aryl group (preferably having 6 to 12 carbon atoms), in addition to the alkyl group, may be bonded to the nitrogen atom.

In addition, the amine compound preferably has an oxyalkylene group. The number of the oxyalkylene groups contained in the amine compounds is preferably 1 or more, more preferably 3 to 9, and still more preferably 4 to 6, within the molecule. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and the oxyethylene group is more preferable.

Examples of the ammonium salt compound include primary, secondary, tertiary, and quaternary ammonium salt compounds, and an ammonium salt compound in which at least one alkyl group is bonded to a nitrogen atom is preferable. Any ammonium salt compound is available as long as at least one alkyl group (preferably having 1 to 20 carbon atoms) is bonded to a nitrogen atom, and a cycloalkyl group (preferably having 3 to 20 carbon atoms) or an aryl group (preferably having 6 to 12 carbon atoms) may be bonded to the nitrogen atom, in addition to the alkyl group.

It is preferable that the ammonium salt compound has an oxyalkylene group. The number of the oxyalkylene groups contained in the amine compounds is preferably 1 or more, more preferably 3 to 9, and still more preferably 4 to 6, within the molecule. Among the oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and the oxyethylene group is more preferable.

Examples of the anion of the ammonium salt compound include a halogen atom, a sulfonate, a borate, and a phosphate, and among these, the halogen atom or the sulfonate is preferable. As the halogen atom, chloride, bromide, or iodide is preferable. As the sulfonate, an organic sulfonate having 1 to 20 carbon atoms is preferable. Examples of the organic sulfonate include alkyl sulfonate having 1 to 20 carbon atoms, and aryl sulfonate. The alkyl group of the alkyl sulfonate may have a substituent, and examples of the substituent include a fluorine atom, a chlorine atom, a bromine atom, an alkoxy group, an acyl group, and an aromatic ring group. Specific examples of the alkyl sulfonate include methanesulfonate, ethanesulfonate, butanesulfonate, hexanesulfonate, octanesulfonate, benzyl sulfonate, trifluoromethanesulfonate, pentafluoroethanesulfonate, and nonafluorobutanesulfonate. Examples of the aryl group of the aryl sulfonate include a benzene ring group, a naphthalene ring group, and an anthracene ring group. As the substituent which can be contained in the benzene ring group, the naphthalene ring group, and the anthracene ring group, a linear or branched alkyl group having 1 to 6 carbon atoms or a cycloalkyl group having 3 to 6 carbon atoms is preferable. Specific examples of the linear or branched alkyl group and the cycloalkyl group include a methyl group, an ethyl group, an n-propyl group, an isopropyl group, an n-butyl group, an i-butyl group, a t-butyl group, an n-hexyl group, and a cyclohexyl group. Examples of other substituents include an alkoxy group having 1 to 6 carbon atoms, a halogen atom, a cyano group, a nitro group, an acyl group, and an acyloxy group.

The amine compound having a phenoxy group and the ammonium salt compound having a phenoxy group are each a compound having a phenoxy group at the terminal on the opposite side to the nitrogen atom of the alkyl group which is contained in the amine compound or the ammonium salt compound.

Examples of the substituent of the phenoxy group include an alkyl group, an alkoxy group, a halogen atom, a cyano group, a nitro group, a carboxyl group, a carboxylic ester group, a sulfonic ester group, an aryl group, an aralkyl group, an acyloxy group, and an aryloxy group.

The substitution position of the substituent may be any of 2- to 6-positions. The number of the substituents may be any one of 1 to 5.

This compound preferably has at least one oxyalkylene group between the phenoxy group and the nitrogen atom. The number of the oxyalkylene groups contained in the amine compounds is preferably 1 or more, more preferably 3 to 9, and still more preferably 4 to 6, within the molecule. Among oxyalkylene groups, an oxyethylene group (—CH$_2$CH$_2$O—) or an oxypropylene group (—CH(CH$_3$)CH$_2$O— or —CH$_2$CH$_2$CH$_2$O—) is preferable, and the oxyethylene group is more preferable.

The amine compound having a phenoxy group can be obtained by heating a primary or secondary amine having a phenoxy group and a haloalkyl ether to perform a reaction, then adding an aqueous solution of a strong base (for example, sodium hydroxide, potassium hydroxide, and tetraalkylammonium) to the reaction system, and extracting a reaction product with an organic solvent (for example, ethyl acetate and chloroform). Alternatively, the amine compound having a phenoxy group can also be obtained by heating a primary or secondary amine and a haloalkyl ether having a phenoxy group at a terminal to perform a reaction, then adding an aqueous solution of a strong base to the reaction system, and extracting a reaction product with an organic solvent.

(Compound (PA) which has Proton-Accepting Functional Group and Generates Compound that Decomposes Upon Irradiation with Actinic Rays or Radiation to Exhibit Deterioration in Proton-Accepting Properties, No Proton-Accepting Properties, or Change from Proton-Accepting Properties to Acidic Properties)

The resist composition may include a compound (hereinafter also referred to as a "compound (PA)") which has a proton-accepting functional group and generates a compound that decomposes upon irradiation with actinic rays or radiation to exhibit deterioration in proton-accepting properties, no proton-accepting properties, or a change from the proton-accepting properties to acidic properties as the basic compound.

The proton-accepting functional group is a functional group having a group or an electron which is capable of electrostatically interacting with a proton, and means, for example, a functional group with a macrocyclic structure, such as a cyclic polyether, or a functional group having a nitrogen atom having an unshared electron pair not contributing to π-conjugation. The nitrogen atom having an unshared electron pair not contributing to π-conjugation is, for example, a nitrogen atom having a partial structure represented by the following general formula.

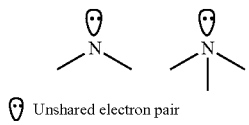

⊖ Unshared electron pair

Preferred examples of the partial structure of the proton-accepting functional group include crown ether, azacrown ether, primary to tertiary amines, pyridine, imidazole, and pyrazine structures.

The compound (PA) generates a compound which decomposes upon irradiation with actinic rays or radiation to exhibit deterioration in proton-accepting properties, no proton-accepting properties, or a change from the proton-accepting properties to acidic properties. Here, an expression of generating a compound which exhibits deterioration in proton-accepting properties, no proton-accepting properties, or a change from the proton-accepting properties to acidic properties is a change of proton-accepting properties due to the proton being added to the proton-accepting functional group. Specifically, the expression means a decrease in the equilibrium constant at chemical equilibrium in a case where a proton adduct is generated from the compound (PA) having the proton-accepting functional group and the proton.

With regard to specific examples of the compound (PA), reference can be made to those described in paragraphs [0421] to [0428] of JP2014-041328A or paragraphs [0108] to of JP2014-134686A, the contents of which are incorporated herein by reference.

(Onium Salt Compound Consisting of Anion and Cation (Compound (DB)))

The acid diffusion control agent is also preferably an onium salt compound (compound (DB)) consisting of an anion and a cation other than the above-mentioned basic compound and compound (PA). Examples of such an onium salt compound include a compound consisting of a combination of an anion and a cation described below.

The compound (DB) is also preferably a compound that generates an acid upon exposure to EUV light, in which case an acid generated is preferably a weaker acid (for example, more than pKa-1) than the acid generated from the photoacid generator.

Anion

A form preferable as the anion contained in the compound (DB) which is an onium salt compound consisting of an anion and a cation will be described. In other words, the acid diffusion control agent is also preferably a compound having an anion which will be described below.

As the anion contained in the compound (DB) which is an onium salt compound consisting of an anion and a cation, for example, anions represented by General Formulae (d1-1) to (d1-3) are preferable.

(d1-1)

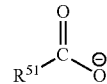

-continued

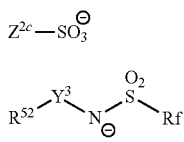
(d1-2)

(d1-3)

In the formula, $R^{51}$ represents a hydrocarbon group which may have a substituent. The hydrocarbon group is preferably, for example, an aryl group having 6 to 12 carbon atoms. Further, examples of the substituent include an alkyl group (preferably a fluoroalkyl group, more preferably a perfluoroalkyl group, and still more preferably a trifluoromethyl group).

$Z^{2c}$ represents a hydrocarbon group having 1 to 30 carbon atoms which may have a substituent (provided that carbon adjacent to S is not substituted with a fluorine atom).

$R^{52}$ represents an organic group, $Y^3$ represents a linear, branched, or cyclic alkylene group or an arylene group, and Rf represents a hydrocarbon group containing a fluorine atom.

Cation

Examples of the cation contained in the compound (DB) which is an onium salt compound consisting of an anion and a cation include an ammonium cation, and the cations described as the cations which may be contained in the compound represented by General Formula (ZI) and the compound represented by General Formula (ZII). Examples of the ammonium cation include a tetraalkylammonium cation, and the alkyl group moieties thereof each independently preferably have 1 to 10 carbon atoms.

Furthermore, in the compound (DB) which is an onium salt compound consisting of an anion and a cation, it is also preferable that the cation is a cation having a basic site including a nitrogen atom. It is preferable that the basic site is an amino group, and more preferably an aliphatic amino group. It is more preferable that all of the atoms adjacent to the nitrogen atom in the basic site are hydrogen atoms or carbon atoms. Further, from the viewpoint of improving the basicity, it is preferable that an electron-withdrawing functional group (a carbonyl group, a sulfonyl group, a cyano group, a halogen atom or the like) is not directly bonded to a nitrogen atom.

Specific structures of such cations include, but are not limited to, the cations in the compounds disclosed in paragraph [0203] of US2015/0309408A1.

Specific examples of the acid diffusion control agent are shown below, but the present invention is not limited.

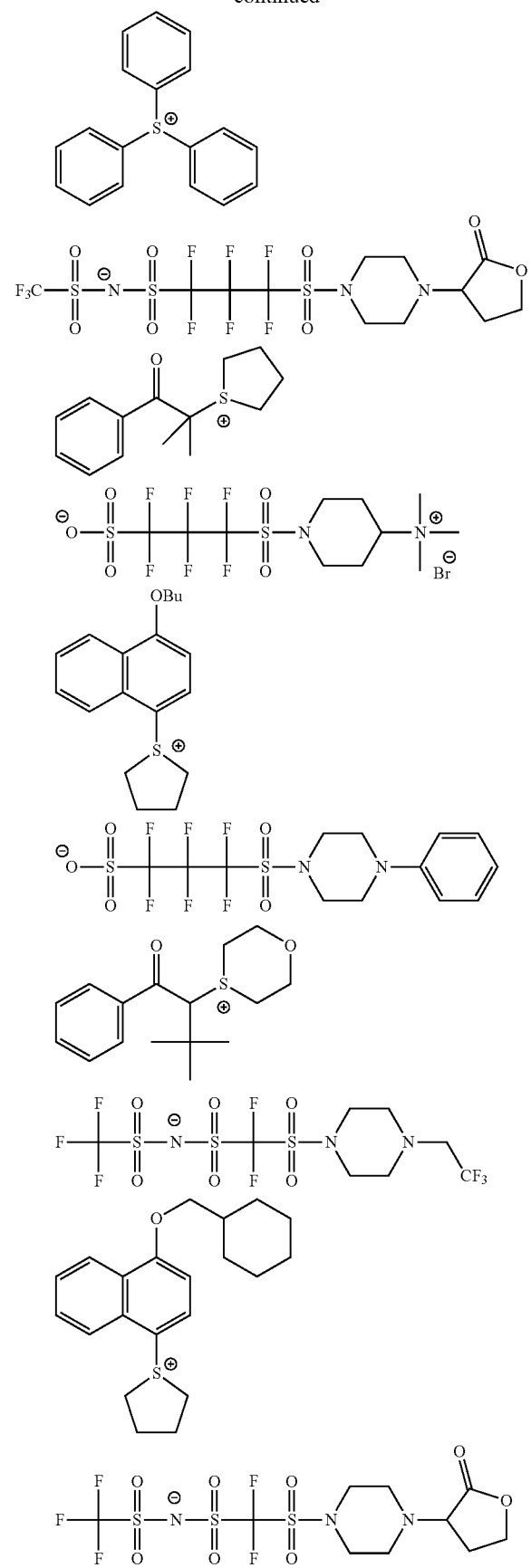

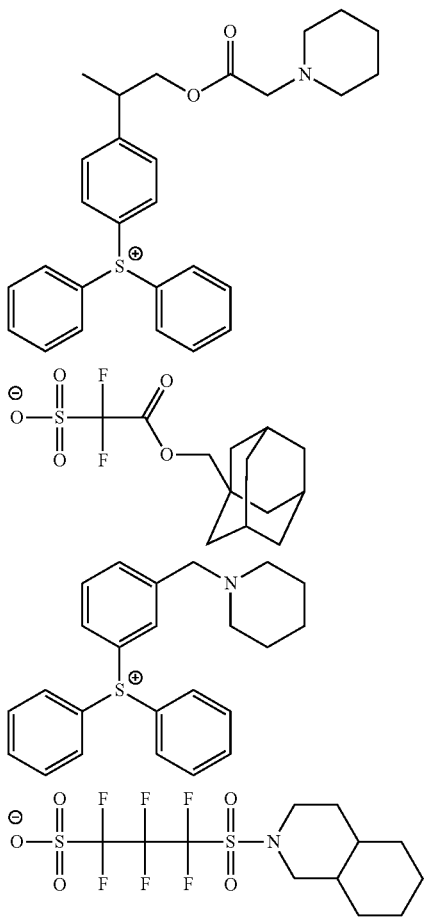

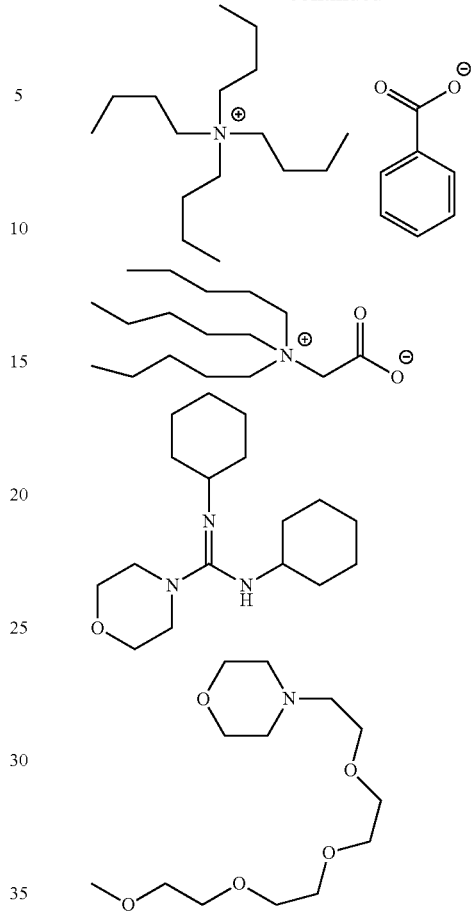

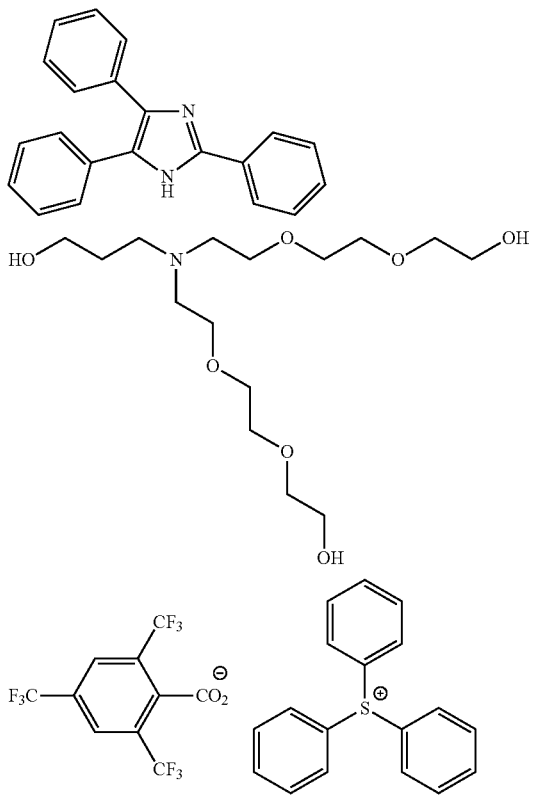

The content of the acid diffusion control agent in the resist composition is preferably 0.001% to 20% by mass, more preferably 0.001% to 15% by mass, and still more preferably 0.5% to 12% by mass, with respect to the total solid content of the composition.

Furthermore, the content of the acid diffusion control agent in 1 g of the solid content of the resist composition is not particularly limited, but from the viewpoint that the effects of the present invention are more excellent, the content is preferably 0.05 to 0.50 mmol, more preferably 0.10 to 0.30 mmol, and still more preferably 0.10 to 0.18 mmol.

The acid diffusion control agents may be used singly or in combination of two or more kinds thereof, and in a case where the two or more kinds of the acid diffusion control agents are used, a total content thereof is preferably within the range.

The ratio of the photoacid generator and the acid diffusion control agent in the resist composition, photoacid generator/acid diffusion control agent (molar ratio), is preferably 1 to 300.

Examples of the acid diffusion control agent include the compounds (amine compounds, amido group-containing compounds, urea compounds, nitrogen-containing heterocyclic compounds, and the like) described in paragraphs [0140] to [0144] of JP2013-011833A.

<Solvent>

The resist composition may include a solvent.

The solvent preferably includes (M1) propylene glycol monoalkyl ether carboxylate, or (M2) at least one selected from the group consisting of a propylene glycol monoalkyl ether, a lactic ester, an acetic ester, an alkoxypropionic ester, a chained ketone, a cyclic ketone, a lactone, and alkylene carbonate. Further, the solvent may further include components other than the component (M1) and the component (M2).

The present inventors have found that by using such a solvent and the above-mentioned resin in combination, the coatability of the composition is improved, and a pattern having a small number of development defects can also be formed. A reason therefor is not necessarily clear, but is thought to be as follows by the present inventors: these solvents have a good balance among the solubility, the boiling point, and the viscosity of the above-mentioned resin, and therefore, unevenness of the film thickness of a composition film, generation of precipitates during spin coating, and the like can be suppressed.

As the component (M1), at least one selected from the group consisting of propylene glycol monomethyl ether acetate (PGMEA), propylene glycol monomethyl ether propionate, and propylene glycol monoethyl ether acetate is preferable, and propylene glycol monomethyl ether acetate (PGMEA) is more preferable.

As the component (M2), the following ones are preferable.

As the propylene glycol monoalkyl ether, propylene glycol monomethyl ether (PGME) or propylene glycol monoethyl ether is preferable.

As the lactic ester, preferably ethyl lactate, butyl lactate, or propyl lactate is preferable.

As the acetic ester, methyl acetate, ethyl acetate, butyl acetate, isobutyl acetate, propyl acetate, isoamyl acetate, methyl formate, ethyl formate, butyl formate, propyl formate, or 3-methoxybutyl acetate is preferable.

In addition, butyl butyrate is also preferable.

As the alkoxypropionic ester, methyl 3-methoxypropionate (MMP) or ethyl 3-ethoxypropionate (EEP) is preferable.

As the chain ketone, 1-octanone, 2-octanone, 1-nonanone, 2-nonanone, acetone, 2-heptanone, 4-heptanone, 1-hexanone, 2-hexanone, diisobutyl ketone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, or methyl amyl ketone is preferable.

As the cyclic ketone, methyl cyclohexanone, isophorone, or cyclohexanone is preferable.

As the lactone, γ-butyrolactone is preferable.

As the alkylene carbonate, propylene carbonate is preferable.

As the component (M2), propylene glycol monomethyl ether (PGME), ethyl lactate, ethyl 3-ethoxypropionate, methyl amyl ketone, cyclohexanone, butyl acetate, pentyl acetate, g-butyrolactone, or propylene carbonate is more preferable.

It is preferable to use an ester-based solvent having 7 or more carbon atoms (preferably 7 to 14 carbon atoms, more preferably 7 to 12 carbon atoms, and still more preferably 7 to 10 carbon atoms) and 2 or less heteroatoms, in addition to the components.

Preferred examples of the ester-based solvent having 7 or more carbon atoms and 2 or less heteroatoms include amyl acetate, isoamyl acetate, 2-methylbutyl acetate, 1-methylbutyl acetate, hexyl acetate, pentyl propionate, hexyl propionate, butyl propionate, isobutyl isobutyrate, heptyl propionate, and butyl butanoate, and isoamyl acetate is preferable.

As the component (M2), a component having a flash point (hereinafter also referred to as fp) of 37° C. or higher is preferably used. As such a component (M2), propylene glycol monomethyl ether (fp: 47° C.), ethyl lactate (fp: 53° C.), ethyl 3-ethoxypropionate (fp: 49° C.), methyl amyl ketone (fp: 42° C.), cyclohexanone (fp: 44° C.), pentyl acetate (fp: 45° C.), methyl 2-hydroxyisobutyrate (fp: 45° C.), g-butyrolactone (fp: 101° C.), or propylene carbonate (fp: 132° C.) is preferable. Among these, propylene glycol monoethyl ether, ethyl lactate, pentyl acetate, or cyclohexanone is more preferable, and propylene glycol monoethyl ether or ethyl lactate is still more preferable.

In addition, the "flash point" herein is intended to mean the value described in a reagent catalog of Tokyo Chemical Industry Co., Ltd. or Sigma-Aldrich Co. LLC.

It is preferable that the solvent includes the component (M1). It is more preferable that the solvent is formed of substantially only the component (M1) or is a mixed solvent formed by a combined use of the component (M1) and other components. In a case where the solvent is the mixed solvent, it is still more preferable that the solvent includes both the component (M1) and the component (M2).

The mass ratio (M1/M2) of the content of the component (M1) to the component (M2) is preferably in the range of "100/0" to "15/85", more preferably in the range of "100/0" to "40/60", and still more preferably in the range of "100/0" to "60/40". That is, the solvent includes only the component (M1) or includes both of the component (M1) and the component (M2), and a mass ratio thereof is preferably as follows. That is, in the latter case, the mass ratio of the component (M1) to the component (M2) is preferably 15/85 or more, more preferably 40/60 or more, and still more preferably 60/40 or more. In a case of employing such a configuration, it is possible to further reduce the number of development defects.

Moreover, in a case where both of the component (M1) and the component (M2) are included in the solvent, the mass ratio of the component (M1) to the component (M2) is set to, for example, 99/1 or less.

As described above, the solvent may further include components other than the components (M1) and (M2). In this case, the content of the components other than the components (M1) and (M2) is preferably in the range of 5% to 30% by mass with respect to a total amount of the solvent.

The content of the solvent in the resist composition is preferably set such that the concentration of the solid content is 0.5% to 30% by mass, and more preferably set such that the concentration of the solid content is 1% to 20% by mass. Thus, it is possible to further improve the coatability of the resist composition.

<Other Components>

The resist composition may further include a hydrophobic resin, a surfactant, a dissolution inhibiting compound, a dye, a plasticizer, a photosensitizer, a light absorber, or a compound that accelerates a solubility in a developer (for example, a phenol compound having a molecular weight of 1,000 or less, or an alicyclic or aliphatic compound including a carboxyl group).

The resist composition may further include a dissolution inhibiting compound. Here, the "dissolution inhibiting compound" is intended to mean a compound having a molecular weight of 3,000 or less, which decomposes by the action of an acid and thus, has a decreased solubility in an organic developer.

<Preparation Method>

The composition of the embodiment of the present invention is preferably used by dissolving the above-mentioned components in a predetermined organic solvent (preferably the above-mentioned mixed solvent), filtering the solution, and then applying the solution onto a predetermined support (substrate).

The pore size of a filter to be used for filtration using the filter is preferably 0.1 µm or less, more preferably 0.05 µm or less, and still more preferably 0.03 µm or less. This filter is preferably a polytetrafluoroethylene-, polyethylene-, or nylon-made filter. In the filtration using the filter, for example, circulating filtration may be performed or the filtration may be performed by connecting plural kinds of filters in series or in parallel, as disclosed in JP2002-062667A, for example. In addition, the composition may be filtered a plurality of times. Furthermore, the composition may be subjected to a deaeration treatment or the like before or after filtration using the filter.

[Pattern Forming Method]

The procedure of the pattern forming method using the resist composition is not particularly limited, but preferably has the following steps.

Step 1: A step of forming a resist film on a substrate, using a resist composition.

Step 2: A step of exposing the resist film to EUV light.

Step 3: A step of developing the exposed resist film using a developer including an organic solvent to form a pattern.

Hereinafter, the procedure of each of the steps will be described in detail.

<Step 1: Resist Film Forming Step>

The step 1 is a step of forming a resist film on a substrate, using a resist composition.

The definition of the resist composition is as described above.

Examples of a method in which a resist film is formed on a substrate, using a resist composition, include a method in which a resist composition is applied onto a substrate.

In addition, it is preferable that the resist composition before the application is filtered through a filter, as desired. The pore size of the filter is preferably 0.1 µm or less, more preferably 0.05 µm or less, and still more preferably 0.03 µm or less. Further, the filter is preferably a polytetrafluoroethylene-, polyethylene-, or nylon-made filter.

The resist composition is applied to a substrate (examples: a silicon- or silicon dioxide-coated substrate) as used for the manufacture of an integrated circuit element, by an appropriate application method such as a method using a spinner, a coater, or the like. The spin application using a spinner is preferable as the coating method. The rotation speed upon the spin application using a spinner is preferably 1,000 to 3,000 rpm.

After the application of the resist composition, the substrate may be dried to form a resist film. In addition, various base films (an inorganic film, an organic film, or an antireflection film) may be formed below the resist film, as desired.

Examples of the drying method include a method of drying by heating (PB: prebaking). The heating can usually be performed using a unit comprised in a typical exposure and/or developing machine, and may be performed using a hot plate or the like. The heating temperature is preferably 80° C. to 150° C., more preferably 80° C. to 140° C., and still more preferably 80° C. to 130° C. The heating time is preferably 30 to 1,000 seconds, more preferably 60 to 800 seconds, and still more preferably 60 to 600 seconds.

The film thickness of the resist film formed in the step 1 is preferably a film thickness so that the film thickness of the exposed resist film in the step after the step 2 described later and/or the film thickness of a pattern obtained after the step 3 is preferably 50 nm or less (more preferably 40 nm or less, still more preferably 35 nm or less, and particularly preferably 30 nm or less).

Therefore, in order to obtain the exposed resist film and/or the pattern having such a film thickness, the film thickness of the resist film formed in the step 1 is, for example, preferably 20 to 150 nm, more preferably 20 to 120 nm, still more preferably 35 to 120 nm, and particularly preferably 50 to 120 nm.

Moreover, a topcoat may be formed on the upper layer of the resist film using a topcoat composition.

It is preferable that the topcoat composition is not mixed with the resist film and can be uniformly applied onto the upper layer of the resist film.

In addition, it is preferable that the resist film is dried before forming the topcoat. Subsequently, a topcoat composition can be applied onto the obtained resist film by the same means as for the method for forming the resist film, and further dried to form a topcoat.

The film thickness of the topcoat is preferably 10 to 200 nm, more preferably 20 to 100 nm, and still more preferably 40 to 80 nm.

The topcoat is not particularly limited, a topcoat known in the related art can be formed by the methods known in the related art, and the topcoat can be formed, based on the description in paragraphs [0072] to [0082] of JP2014-059543A, for example.

It is preferable that a topcoat including a basic compound as described in JP2013-061648A, for example, is formed on a resist film. Specific examples of the basic compound which can be included in the topcoat include basic compounds which can be included in the resist composition which will be described later.

In addition, the topcoat preferably includes a compound including at least one of a group or bond selected from the group consisting of an ether bond, a thioether bond, a hydroxyl group, a thiol group, a carbonyl bond, and an ester group.

<Step 2: Exposing Step>

The step 2 is a step of exposing the resist film to EUV light.

Examples of the exposing method include a method in which a resist film formed is irradiated with EUV light through a predetermined mask.

After exposure, it is preferable to perform baking (heating) before performing development. The reaction of the exposure area is accelerated by baking, which leads to better sensitivity and pattern shape.

The heating temperature is preferably 80° C. to 150° C., more preferably 80° C. to 140° C., and still more preferably 80° C. to 130° C.

The heating time is preferably 10 to 1,000 seconds, more preferably 10 to 180 seconds, and still more preferably 30 to 120 seconds.

Heating may be performed using a means comprised in an exposure machine and/or a development machine, or may also be performed using a hot plate or the like.

This step is also called post-exposure baking (PEB).

As described above, the film thickness of the resist film exposed through the step 2 is preferably 50 nm or less, more preferably 40 nm or less, still more preferably 35 nm or less, and particularly preferably 30 nm or less. The lower limit is, for example, preferably 10 nm or more, and more preferably 20 nm or more.

Furthermore, the "film thickness of the exposed resist film" as mentioned herein is intended to mean the film thickness of a resist film after PEB in a case where the PEB is performed before performing development after exposure.

Moreover, in a case where there is a difference in the film thickness of the resist film between a location where EUV light is irradiated and a location where the EUV light is not irradiated due to the presence of a mask or the like, the film thickness at the center of the location where the EUV light is irradiated (for example, the center of a portion which will be a line after development in the case of forming a line-and-space pattern, and for example, the center of a portion which will be a dot after development in the case of forming a dot pattern) is taken as a film thickness of the exposed resist film.

In addition, in a case where it is difficult to measure the film thickness at the above-mentioned "center of a portion which will be a line after development", "center of a portion which will be a dot after development", and the like, a resist film whose whole surface is exposed is manufactured under the same conditions, except that the entire surface is exposed not through a mask or the like, and the film thickness of the resist film whose whole surface is thus exposed may be regarded as the film thickness at the above-mentioned "center of a portion which will be a line after development" and "center of a portion which will be a dot after development".

<Step 3: Developing Step>

The step 3 is a step of forming a pattern by developing the exposed resist film using a developer including an organic solvent (hereinafter also referred to as an organic developer).

The organic developer is preferably a developer including at least one organic solvent selected from the group consisting of a ketone-based solvent, an ester-based solvent, an alcohol-based solvent, an amide-based solvent, an ether-based solvent, and a hydrocarbon-based solvent.

Examples of the ketone-based solvent include 1-octanone, 2-octanone, 1-nonanone, 2-nonanone, acetone, 2-heptanone (methyl amyl ketone), 4-heptanone, 1-hexanone, 2-hexanone, diisobutyl ketone, cyclohexanone, methylcyclohexanone, phenyl acetone, methyl ethyl ketone, methyl isobutyl ketone, acetyl acetone, acetonyl acetone, ionone, diacetonyl alcohol, acetyl carbinol, acetophenone, methyl naphthyl ketone, isophorone, and propylene carbonate.

Examples of the ester-based solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, propyl lactate, butyl butanoate, methyl 2-hydroxyisobutyrate, isoamyl acetate, isobutyl isobutyrate, and butyl propionate.

As the alcohol-based solvent, the amide-based solvent, the ether-based solvent, and the hydrocarbon-based solvent, the solvents disclosed in paragraphs [0715] to [0718] of US2016/0070167A1 can be used.

A plurality of the solvents may be mixed or the solvent may be used in admixture with a solvent other than those described above or water. A moisture content in the entire developer is preferably less than 50% by mass, more preferably less than 20% by mass, and still more preferably less than 10% by mass, and particularly preferably, the moisture is not substantially included.

The content of the organic solvent with respect to the organic developer is preferably 50% to 100% by mass, more preferably 80% to 100% by mass, still more preferably 90% to 100% by mass, and particularly preferably 95% to 100% by mass, with respect to the total amount of the developer.

The developer may include an appropriate amount of a known surfactant, as desired.

The content of the surfactant is usually 0.001% to 5% by mass, preferably 0.005% to 2% by mass, and still more preferably 0.01% to 0.5% by mass, with respect to the total amount of the developer.

The organic developer may include an acid diffusion control agent.

Examples of the developing method include a method in which a substrate is immersed in a tank filled with a developer for a certain period of time (a dip method), a method in which a developer is heaped up to the surface of a substrate by surface tension and developed by leaving it to stand for a certain period of time (a puddle method), a method in which a developer is sprayed on the surface of a substrate (a spray method), and a method in which a developer is continuously discharged on a substrate rotated at a constant rate while scanning a developer discharging nozzle at a constant rate (a dynamic dispense method).

In addition, a step of stopping development while replacing the solvent with another solvent may be performed after the developing step.

The developing time is not particularly limited as long as it is a period of time where the non-exposed area of a resin is sufficiently dissolved and is preferably 10 to 300 seconds, and more preferably 20 to 120 seconds.

The temperature of the developer is preferably 0° C. to 50° C., and more preferably 15° C. to 35° C.

<Other Steps>

The pattern forming method may include a step of performing washing using a rinsing liquid after the step 3.

The rinsing liquid used in the rinsing step is not particularly limited as long as it does not dissolve a pattern, and a solution including a general organic solvent can be used. As the rinsing liquid, a rinsing liquid including at least one organic solvent selected from the group consisting of a hydrocarbon-based solvent, a ketone-based solvent, an ester-based solvent, an alcohol-based solvent, an amide-based solvent, and an ether-based solvent is preferably used.

Specific examples of the hydrocarbon-based solvent, the ketone-based solvent, the ester-based solvent, the alcohol-based solvent, the amide-based solvent, and the ether-based solvent include the same as those described for the developer including an organic solvent.

The rinsing liquid used in the rinsing step in this case is more preferably a rinsing liquid including a monohydric alcohol.

Examples of the monohydric alcohol used in the rinsing step include linear, branched, or cyclic monohydric alcohols. Specific examples thereof include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol, 4-octanol, and methyl isobutyl carbinol.

The monohydric alcohol preferably has 5 or more carbon atoms, and examples thereof include 1-hexanol, 2-hexanol, 4-methyl-2-pentanol, 1-pentanol, 3-methyl-1-butanol, and methyl isobutyl carbinol.

The respective component may be used as a mixture of a plurality of the components or in admixture with an organic solvent other than those described above.

The moisture content in the rinsing liquid used in the rinsing step after the development step using a developer including the organic solvent is preferably 10% by mass or less, more preferably 5% by mass or less, and still more preferably 3% by mass or less. By setting the moisture content to 10% by mass or less, good development characteristics can be obtained.

The rinsing liquid may include an appropriate amount of a surfactant.

In the rinsing step, the developed substrate is subjected to a washing treatment with a rinsing liquid. A method for the washing treatment is not particularly limited, but examples thereof include a method in which a rinsing liquid is continuously discharged on a substrate rotated at a constant rate (a rotation application method), a method in which a substrate is immersed in a tank filled with a rinsing liquid for a certain period of time (a dip method), or a method in which a rinsing liquid is sprayed on a substrate surface (a spray method).

Furthermore, it is also preferable to include a heating step (post-baking) after the rinsing step. The developer and the rinsing liquid remaining between and inside the patterns are removed by the baking step. In the heating step after the rinsing step, the heating temperature is usually 40° C. to 160° C., and preferably 70° C. to 95° C. The heating time is usually 10 seconds to 3 minutes, and preferably 30 to 90 seconds.

The film thickness (height of a pattern) of a pattern formed by developing the resist film is preferably 50 nm or less, more preferably 40 nm or less, still more preferably 35 nm or less, and particularly preferably 30 nm or less. The lower limit is, for example, preferably 10 nm or more, and more preferably 20 nm or more.

In a case where a pattern formed is in the form of a line, an aspect ratio determined by dividing a height of the pattern with a line width is preferably 2.5 or less, more preferably 2.1 or less, and still more preferably 1.7 or less.

In a case where a pattern formed is in the form of a trench (groove) pattern or a contact hole pattern, an aspect ratio determined by dividing a height of the pattern with the trench width or the hole diameter is preferably 4.0 or less, more preferably 3.5 or less, and still more preferably 3.0 or less.

Moreover, an etching treatment of a substrate may be carried out using the formed pattern as a mask. That is, the substrate (or the underlayer film and the substrate) is processed using the pattern formed in the step 3 as a mask, thereby forming a pattern on the substrate.

A method for processing the substrate (or the underlayer film and the substrate) is not particularly limited, but a method in which a pattern is formed on a substrate by subjecting the substrate (or the underlayer film and the substrate) to dry etching using the pattern formed in the step 3 as a mask is preferable.

The dry etching may be one-stage etching or multi-stage etching. In a case where the etching is etching including a plurality of stages, the etchings at the respective stages maybe the same treatment or different treatment.

For etching, any of known methods can be used, and various conditions and the like are appropriately determined according to the type of a substrate, applications, and the like. Etching can be carried out, for example, in accordance with The International Society for Optical Engineering (Proc. of SPIE), Vol. 6924, 692420 (2008), JP2009-267112A, and the like. In addition, etching can also be carried out in accordance with "Chapter 4 Etching" in "Semiconductor Process Text Book, 4$^{th}$ Ed., published in 2007, publisher: SEMI Japan".

Among those, the dry etching is preferably oxygen plasma etching.

It is preferable that various materials (for example, a solvent, a developer, a rinsing liquid, a composition for forming an antireflection film, and a composition for forming a topcoat) used in the resist composition and the pattern forming method of the embodiment of the present invention do not include impurities such as metals. The content of the impurities included in these materials is preferably 1 ppm by mass or less, more preferably 10 ppb by mass or less, still more preferably 100 ppt by mass or less, particularly preferably 10 ppt by mass or less, and most preferably 1 ppt by mass or less. Here, examples of the metal impurities include Na, K, Ca, Fe, Cu, Mg, Al, Li, Cr, Ni, Sn, Ag, As, Au, Ba, Cd, Co, Pb, Ti, V, W, and Zn.

Examples of a method for removing impurities such as metals from the various materials include filtration using a filter. As for the filter pore diameter, the pore size is preferably less than 100 nm, more preferably 10 nm or less, and still more preferably 5 nm or less. As the filter, a polytetrafluoroethylene-made filter, a polyethylene-made filter, or a nylon-made filter is preferable. The filter may be constituted with a composite material formed by combining the filter material with an ion exchange medium. As the filter, a filter which had been washed with an organic solvent in advance may be used. In the step of filtration using a filter, a plurality of kinds of filters may be connected in series or in parallel, and used. In a case of using the plurality of kinds of filters, a combination of filters having different pore diameters and/or materials may be used. In addition, various materials may be filtered plural times, and the step of filtering plural times may be a circulatory filtration step.

In the production of the resist composition, it is preferable that after dissolving the respective components such as a resin and a photoacid generator in a solvent, circulatory filtration is performed using a plurality of filters with different materials. For example, it is preferable to connect a polyethylene-made filter with a pore diameter of 50 nm, a nylon-made filter with a pore diameter of 10 nm, and a polyethylene-made filter with a pore diameter of 3 nm in permuted connection, and then perform circulatory filtration ten times or more. A smaller pressure difference among the filters is preferable, and the pressure difference is generally 0.1 MPa or less, preferably 0.05 MPa or less, and more preferably 0.01 MPa or less. A smaller pressure difference between the filter and the charging nozzle is also preferable, and the pressure difference is generally 0.5 MPa or less, preferably 0.2 MPa or less, and more preferably 0.1 MPa or less.

It is preferable to subject the inside of an apparatus for producing the resist composition to gas replacement with inert gas such as nitrogen. Thus, it is possible to suppress active gas such as oxygen from being dissolved in the composition.

After being filtered by a filter, the resist composition is charged into a clean container. It is preferable that the resist composition charged in the container is subjected to refrigeration storage. Thus, it is possible to suppress performance degradation over time. A shorter time from completion of the charge of the composition into the container to initiation of refrigeration storage is preferable, and the time is generally within 24 hours, preferably within 16 hours, more preferably within 12 hours, and still more preferably 10 hours. The storage temperature is preferably 0° C. to 15° C., more preferably 0° C. to 10° C., and still more preferably 0° C. to 5° C.

Moreover, examples of the method for reducing the impurities such as a metal included in various materials include a method of selecting raw materials having a low content of metals as raw materials constituting various materials, a method of subjecting raw materials constituting various materials to filtration using a filter, and a method of performing distillation under the condition for suppressing the contamination as much as possible by, for example, lining the inside of a device with TEFLON (registered trademark).

In addition to filtration using a filter, removal of impurities by an adsorbing material may be performed, or a combination of filtration using a filter and an adsorbing material may be used. As the adsorbing material, known adsorbing materials may be used, and for example, inorganic adsorbing materials such as silica gel and zeolite, and organic adsorbing materials such as activated carbon can be used. It is necessary to prevent the incorporation of metal impurities in the producing step in order to reduce the impurities such as metals included in the various materials. Sufficient removal of metal impurities from a production device can be checked by measuring the content of metal components included in a washing liquid used to wash the production device. The content of the metal components included in the washing liquid after the use is preferably 100 parts per trillion (ppt) by mass or less, more preferably 10 ppt by mass or less, and still more preferably 1 ppt by mass or less.

An electrically conductive compound may be added to an organic treatment liquid such as a developer and a rinsing liquid in order to prevent failure of chemical liquid pipe and various parts (a filter, an O-ring, a tube, or the like) due to electrostatic charge, and subsequently generated electrostatic discharge. The electrically conductive compound is not particularly limited and examples thereof include methanol. The addition amount is not particularly limited, but from the viewpoint that preferred development characteristics or rinsing characteristics are maintained, the addition amount is preferably 10% by mass or less, and more preferably 5% by mass or less.

For members of the chemical liquid pipe, various pipes coated with stainless steel (SUS), or a polyethylene, polypropylene, or fluorine resin (a polytetrafluoroethylene or perfluoroalkoxy resin, or the like) that has been subjected to an antistatic treatment can be used. In the same manner, for the filter or the O-ring, polyethylene, polypropylene, or a fluorine resin (a polytetrafluoroethylene or perfluoroalkoxy resin, or the like) that has been subjected to an antistatic treatment can be used.

A method for improving the surface roughness of a pattern may be applied to a pattern formed by the method of the present invention. Examples of the method for improving the surface roughness of the pattern include the method of treating a pattern by a plasma of a hydrogen-containing gas disclosed in WO2014/002808A1. Additional examples of the method include known methods as described in JP2004-235468A, US2010/0020297A, JP2008-083384A, and Proc. of SPIE Vol. 8328 83280N-1 "EUV Resist Curing Technique for LWR Reduction and Etch Selectivity Enhancement".

The pattern forming method of the embodiment of the present invention can be used for guide pattern formation in a directed self-assembly (DSA) (see, for example, ACS Nano Vol. 4, No. 8, Pages 4815-4823).

In addition, a pattern formed by the method can be used as a core material (core) of the spacer process disclosed in JP1991-270227A (JP-H03-270227A) and JP2013-164509A.

[Method for Manufacturing Electronic Device]

Moreover, the present invention further relates to a method for manufacturing an electronic device, including the above-described pattern forming method, and an electronic device manufactured by the manufacturing method.

The electronic device of an embodiment of the present invention is suitably mounted on electrical and electronic equipment (for example, home electronics, office automation (OA)-related equipment, media-related equipment, optical equipment, telecommunication equipment, and the like).

EXAMPLES

Hereinafter, the present invention will be described in more details with reference to Examples, but the present invention is not limited thereto.

[Preparation of Negative Tone Photosensitive Composition for EUV Light]

A negative tone photosensitive composition for EUV light (resist composition) was prepared using raw materials shown below.

<Resin (Resin A)>

Resins (p-1) to (p-97) having repeating units corresponding to monomers M1 to M65 shown below were synthesized by a known method.

In the following monomers, the repeating units corresponding to M43 to M58, M60, M62, and M64 correspond to repeating units having an acid-decomposable group with a polar group being protected with a protective group that is eliminated by the action of an acid.

M1

M2

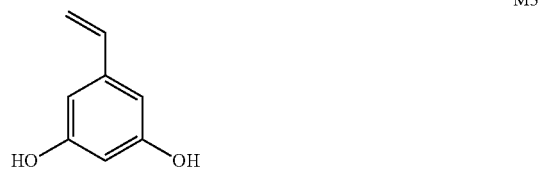

M3

M4

| | |
|---|---|
| M5 | M10 |
| M6 | M11 |
| M7 | M12 |
| M8 | M13 |
| M9 | M14 |

M15 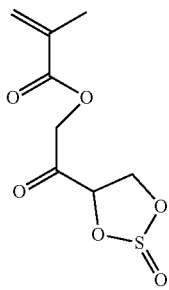
M16 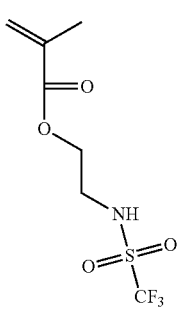
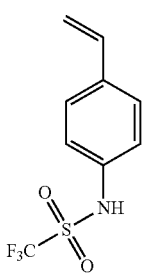
M17 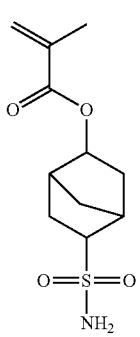
M18 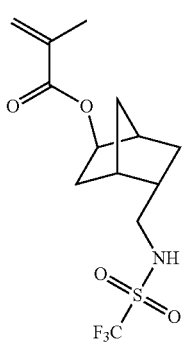
M20 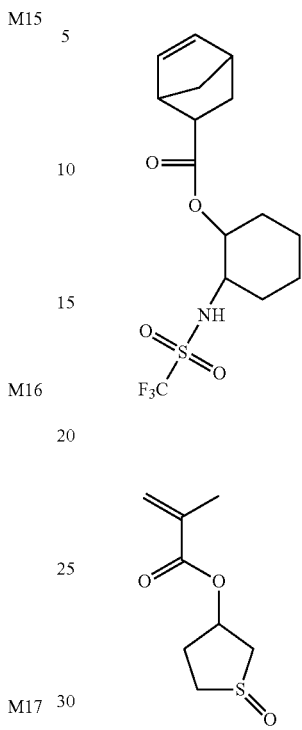
M21
M22 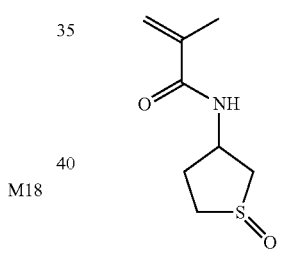
M23 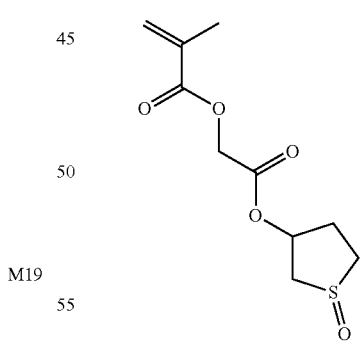
M19
M24 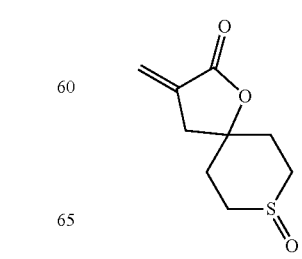

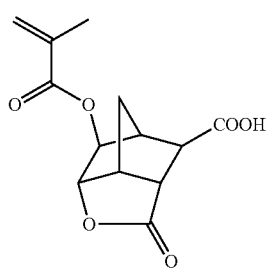
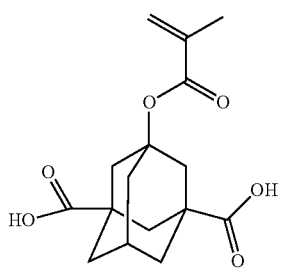
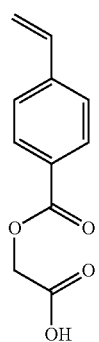
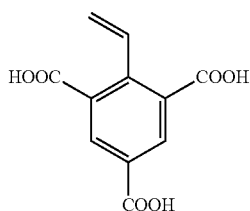
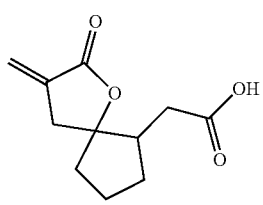
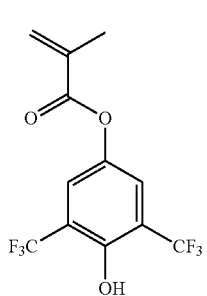
M25
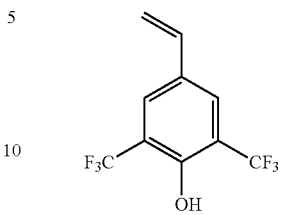
M26
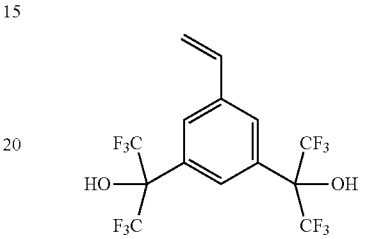
M27
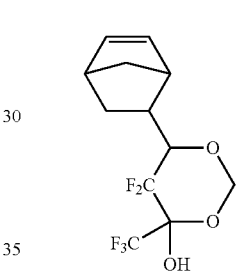
M28
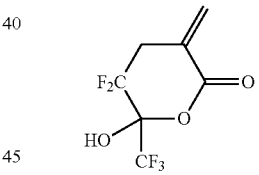
M29
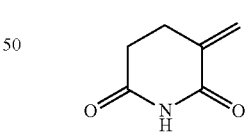
M30
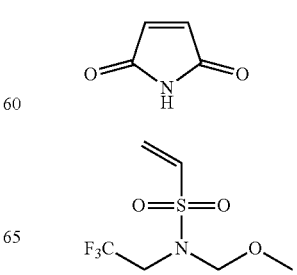
M31
M32
M33
M34
M35
M36
M37

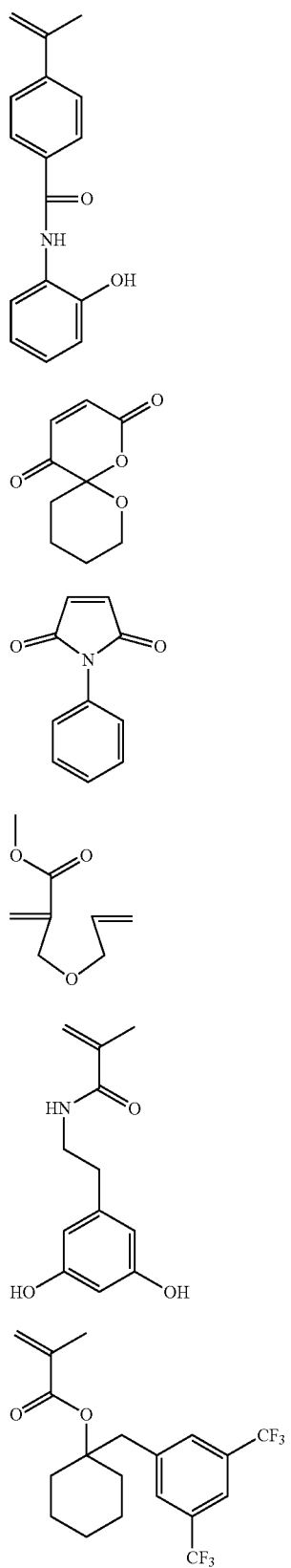
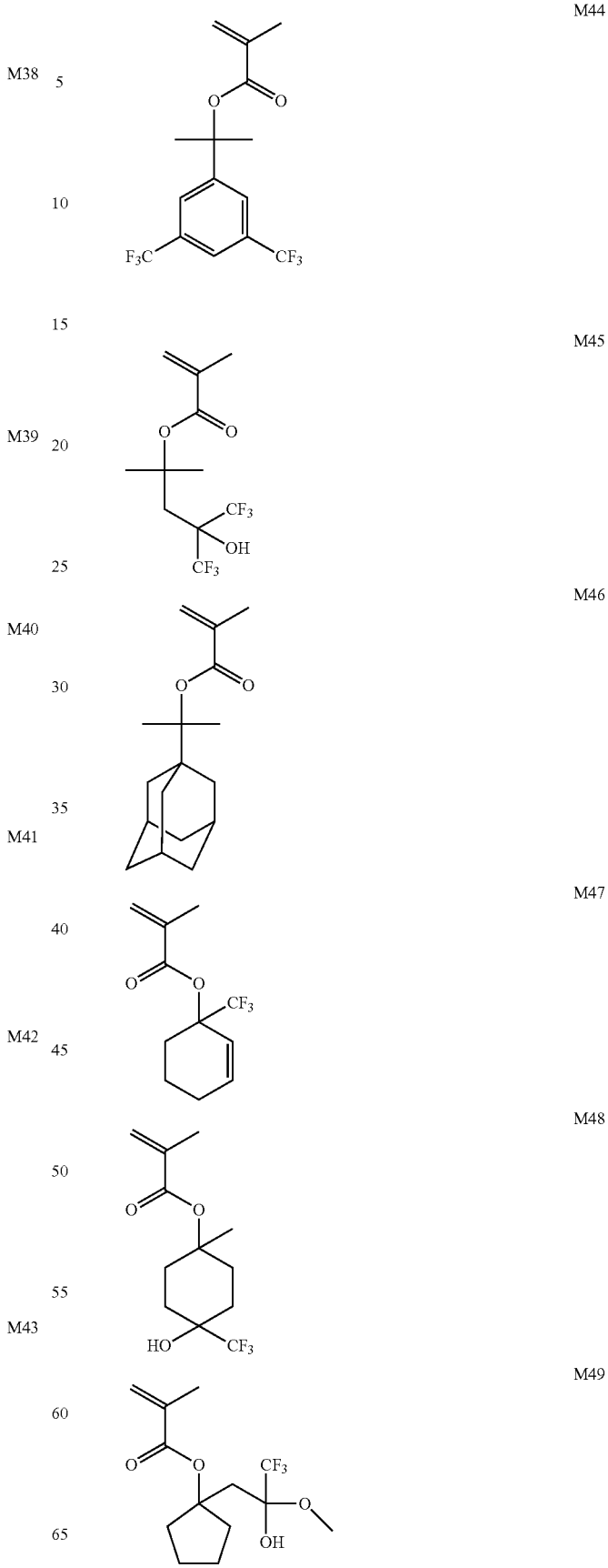

M50
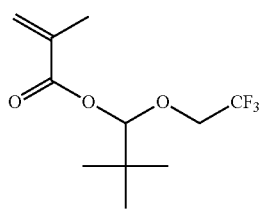
M51
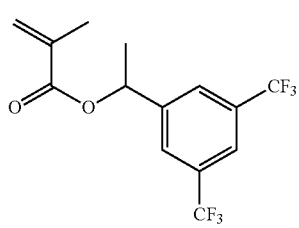
M52
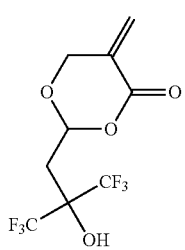
M53
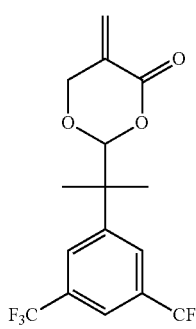
M54
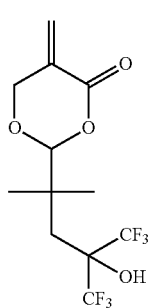
M55
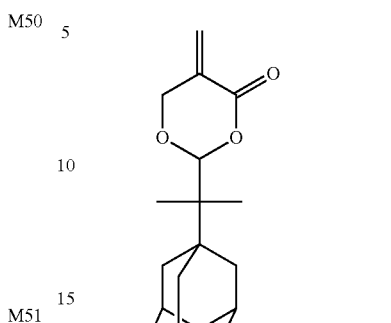
M56
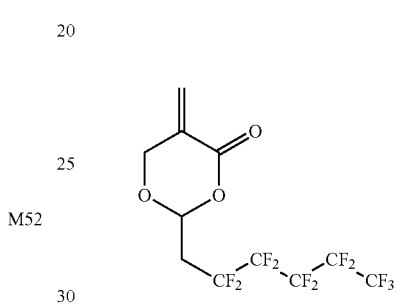
M57
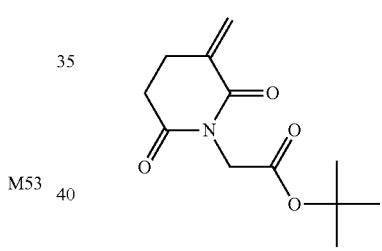
M58
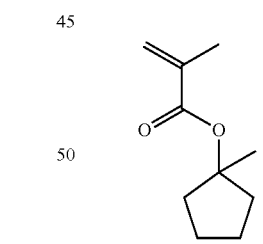
M59
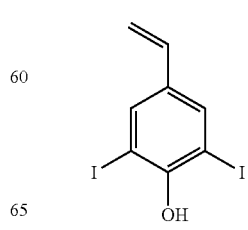

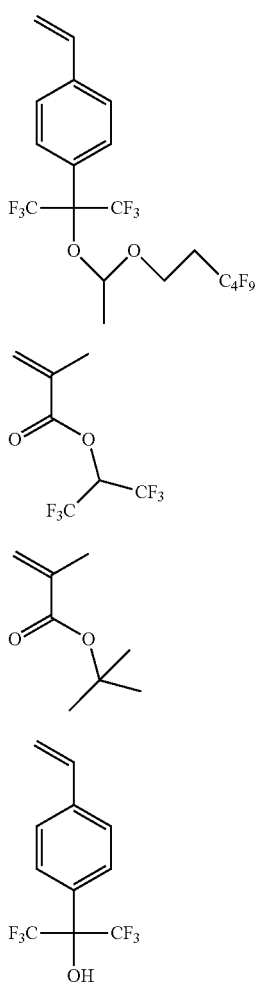

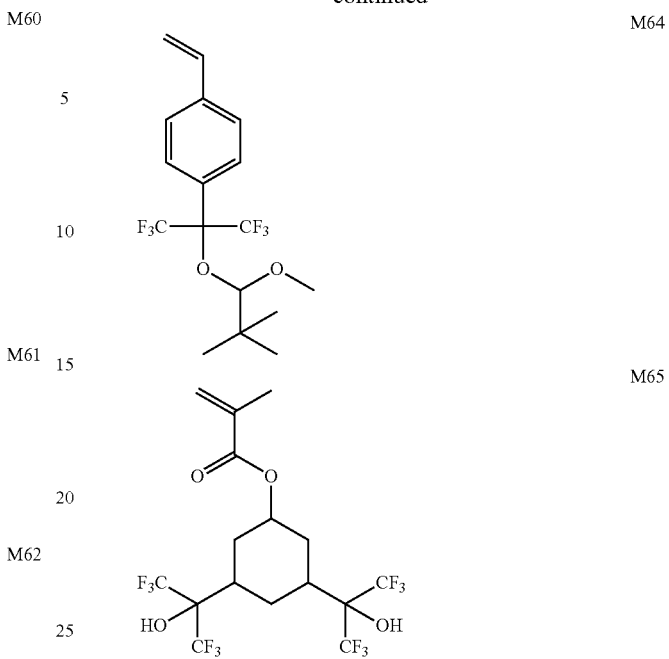

The compositions of the resins (p-1) to (p-97) used in the respective resist compositions are shown in the following tables.

The numbers in the tables indicate the content (% by mass) of the repeating unit derived from each monomer in each resin. For example, in the resin (p-1), the content of the repeating unit corresponding to M3 is 10% by mass with respect to the total mass of the resin, the content of the repeating unit corresponding to M35 is 10% by mass with respect to the total mass of the resin, and the content of the repeating unit corresponding to M50 is 80% by mass with respect to the total mass of the resin.

TABLE 1

| Table 1-1a | Resin | M1 | M2 | M3 | M4 | M5 | M6 | M7 | M8 | M9 | M10 | M11 | M12 | M13 |
|---|---|---|---|---|---|---|---|---|---|---|---|---|---|---|
| Composition 1 | p-1 | | | 10 | | | | | | | | | | |
| Composition 2 | p-2 | | | | | | | | 10 | | | | | |
| Composition 3 | p-3 | | | 10 | | | | | | | | | | |
| Composition 4 | p-4 | | | | | | | | | | 20 | | | |
| Composition 5 | p-5 | | | | | 15 | | | | | | | | |
| Composition 6 | p-6 | | | | | | | | | | | | | |
| Composition 7 | p-7 | | | | | | | | | | | | | 30 |
| Composition 8 | p-8 | | | 10 | | | | | | | | | | |
| Composition 9 | p-9 | | | 15 | | | | | | | | | | |
| Composition 10 | p-10 | | | | | | | | | | | | | |
| Composition 11 | p-11 | | | | | 30 | | | | | | | | |
| Composition 12 | p-12 | | | | | | | | | | | | | |
| Composition 13 | p-13 | | | | | | | | | | | | | |
| Composition 14 | p-14 | | | | | | | | | | 20 | | | |
| Composition IS | p-15 | | | | | | | | | | | 10 | | |
| Composition 16 | p-16 | | | | | 5 | | | | | | | | |
| Composition 17 | p-17 | | | | | | | 20 | | | | | | |
| Composition 18 | p-18 | | | | | | | | | | | | | |
| Composition 19 | p-19 | | | | | | | | | | | | 25 | |
| Composition 20 | p-20 | | | | | | | | | | | | | |
| Composition 21 | p-21 | | | | | | | | | | | | 25 | |
| Composition 22 | p-22 | | | | 30 | | | | | | | | | 20 |
| Composition 23 | p-23 | | | 20 | | | | | | | | | | |
| Composition 24 | p-24 | | | | | 30 | | | | | | | | 20 |
| Composition 25 | p-25 | | | 15 | | | | | | | | | | |
| Composition 26 | p-26 | | | | | | 30 | | | | | | | |
| Composition 27 | p-27 | | | | | | | | | | 20 | | | |

TABLE 1-continued

| Table 1-1a | Resin | M1 | M2 | M3 | M4 | M5 | M6 | M7 | M8 | M9 | M10 | M11 | M12 | M13 |
|---|---|---|---|---|---|---|---|---|---|---|---|---|---|---|
| Composition 28 | p-28 | | | | | | | | | | | | | 10 |
| Composition 29 | p-29 | | | | | | | 10 | | | | | | |
| Composition 30 | p-30 | | | | | | | | | | | | | |
| Composition 31 | p-31 | | | | | 20 | | | | | | | | |
| Composition 32 | p-32 | | | 20 | | | | | | | | | | |
| Composition 33 | p-33 | | | | | | | | | | | | | |
| Composition 34 | p-34 | | | | | | | | 30 | | | | | |
| Composition 35 | p-35 | | | | | | | | | | | | 10 | |
| Composition 36 | p-36 | | | | | | | | | | | 20 | | |
| Composition 37 | p-37 | | | | | | | | | | | | | |
| Composition 38 | p-38 | | | | | | | | | | | | | |
| Composition 39 | p-39 | | | | | | | | | | 30 | | | |
| Composition 40 | p-40 | | | | | | | | | | | 10 | | |
| Composition 41 | p-41 | | | 15 | | | | | | | | | | |
| Composition 42 | p-42 | | | | | | | | | | | | | |
| Composition 43 | p-43 | | | | | | | | | | | | | |
| Composition 44 | p-44 | | | | | | | | | 10 | | | | |
| Composition 45 | p-45 | | | 10 | | 10 | | | | | | | | |
| Composition 46 | p-46 | | | | | | | 20 | | | | | | |
| Composition 47 | p-47 | | | 10 | | | | | | | | | | |
| Composition 48 | p-48 | 20 | | | | | | | | | | | | |
| Composition 49 | p-49 | | 20 | | | | | | | | | | | |
| Composition 50 | p-50 | | | | | | | | | | | | | |

TABLE 2

| Table 1-1b | Resin | M14 | M15 | M16 | M17 | M18 | M19 | M20 | M21 | M22 | M23 | M24 | M25 | M26 |
|---|---|---|---|---|---|---|---|---|---|---|---|---|---|---|
| Composition 1 | p-1 | | | | | | | | | | | | | |
| Composition 2 | p-2 | | | | | | | | | 10 | | | | |
| Composition 3 | p-3 | | | | | | | | | | | | | |
| Composition 4 | p-4 | | | | | | | | 30 | | | | | |
| Composition 5 | p-5 | | | | | 10 | | | | | | | | |
| Composition 6 | p-6 | | 10 | | | | | | | | | | | |
| Composition 7 | p-7 | 30 | | | | | | | | | | | | |
| Composition 8 | p-8 | | | | | | | 10 | | | | | | |
| Composition 9 | p-9 | | | | | | | | | | | | | |
| Composition 10 | p-10 | | | | | | | | | 10 | | | 10 | |
| Composition 11 | p-11 | | | | | | | | | | | | | |
| Composition 12 | p-12 | | | | | 10 | | | | | | | | |
| Composition 13 | p-13 | | 10 | | | | | | | | | | | |
| Composition 14 | p-14 | 30 | | | | | | | | | | | | |
| Composition 15 | p-15 | | | | | | | | | | | | | |
| Composition 16 | p-16 | | | | | | | | | | | | | |
| Composition 17 | p-17 | | | | | | | | | | | | | |
| Composition 18 | p-18 | 10 | | | | | | | | | | | | |
| Composition 19 | p-19 | | | | | | | 20 | | | | 10 | | |
| Composition 20 | p-20 | | | | | 20 | | | | | | | 30 | |
| Composition 21 | p-21 | | | | | | 20 | | | | | | | |
| Composition 22 | p-22 | | | | | | | | | | | | | |
| Composition 23 | p-23 | | | | | | | | | | | | | |
| Composition 24 | p-24 | | | | | | | | | | | | | |
| Composition 25 | p-25 | | | | | | | | | | | | | |
| Composition 26 | p-26 | | | | | | | | | | | | 30 | |
| Composition 27 | p-27 | | | | | | | | | | | | | |
| Composition 28 | p-28 | | | | | | | | | | | | | |
| Composition 29 | p-29 | | | | | | | | | | | | | |
| Composition 30 | p-30 | | | | | | | | | | 30 | | | |
| Composition 31 | p-31 | | | | | | | | | | | | | |
| Composition 32 | p-32 | | | | | | | | | | | | | |
| Composition 33 | p-33 | | | | 10 | | | | | | 20 | | | |
| Composition 34 | p-34 | | | | | | 20 | | | | | | | |
| Composition 35 | p-35 | | 10 | | | | | | | | | | | |
| Composition 36 | p-36 | | | | | | | | | | | | | |
| Composition 37 | p-37 | | 20 | | | | | | | | 20 | | | |
| Composition 38 | p-38 | | | | | | | | | 20 | | | | |
| Composition 39 | p-39 | | | | | | | | | | | | | |
| Composition 40 | p-40 | | 10 | | | | | | | | | | | |
| Composition 41 | p-41 | | | | | | | | | | | | | |
| Composition 42 | p-42 | | | | | 20 | 20 | | | | | | | |
| Composition 43 | p-43 | | | | | 15 | | | | | | | | |
| Composition 44 | p-44 | | | | | | | | | | | 10 | | |
| Composition 45 | p-45 | | | | | | | | | | | | | |
| Composition 46 | p-46 | | | | | | | | | | | | | |
| Composition 47 | p-47 | | | | | | | | | | | | | |

TABLE 2-continued

| Table 1-1b | Resin | M14 | M15 | M16 | M17 | M18 | M19 | M20 | M21 | M22 | M23 | M24 | M25 | M26 |
|---|---|---|---|---|---|---|---|---|---|---|---|---|---|---|
| Composition 48 | p-48 | | | | | | | | | | | | | |
| Composition 49 | p-49 | | | | | | | | | | | | | |
| Composition 50 | p-50 | | | | 10 | | | | | | | | | |

TABLE 3

| Table 1-1c | Resin | M27 | M28 | M29 | M30 | M31 | M32 | M33 | M34 | M35 | M36 | M37 | M38 | M39 |
|---|---|---|---|---|---|---|---|---|---|---|---|---|---|---|
| Composition 1 | p-1 | | | | | | | | | 10 | | | | |
| Composition 2 | p-2 | | | | | | | | | | | | | |
| Composition 3 | p-3 | | 20 | | | | | | 25 | | | | | |
| Composition 4 | p-4 | | | | | | | | | | | | | |
| Composition 5 | p-5 | | | | | | | | | | | | | |
| Composition 6 | p-6 | | | | 20 | | | | | | | | | |
| Composition 7 | p-7 | | | | | | | | | | | | | |
| Composition 8 | p-8 | | | | | | | | | | | | | |
| Composition 9 | p-9 | | | | | | | | | | | | | |
| Composition 10 | p-10 | | | | | | | | | | | | | |
| Composition 11 | p-11 | | | | | | 20 | | | | | 10 | | |
| Composition 12 | p-12 | | | | | | | | | | | 10 | | |
| Composition 13 | p-13 | | | | | | | | 10 | | | | | |
| Composition 14 | p-14 | | | | | | | | | | | | | |
| Composition 15 | p-15 | 20 | | | | | | | | | | | | |
| Composition 16 | p-16 | | | | | | | 40 | | | | | | |
| Composition 17 | p-17 | | | | | 20 | | | | | | | | |
| Composition 18 | p-18 | | | 10 | | | | | | | | | | |
| Composition 19 | p-19 | | | | | | | | | | | | | |
| Composition 20 | p-20 | | | | | | | | | | | | | |
| Composition 21 | p-21 | | | | | | | | | | | | | |
| Composition 22 | p-22 | | | | | | | | | | | | | |
| Composition 23 | p-23 | | | | | | | | | | | | 20 | |
| Composition 24 | p-24 | | | | | | | | | | | | | |
| Composition 25 | p-25 | | | | | | | | | | | | | |
| Composition 26 | p-26 | | | | | | | | | | | | | |
| Composition 27 | p-27 | | | | | | | | | | | | | |
| Composition 28 | p-28 | | | | | | | | | | | | | 10 |
| Composition 29 | p-29 | | | | | 10 | | | | | | | | |
| Composition 30 | p-30 | | | | | | | | | | | 30 | | |
| Composition 31 | p-31 | | | | | | | 20 | | | | | | |
| Composition 32 | p-32 | | | | | | | | | | | | 20 | |
| Composition 33 | p-33 | | | | | | | | | | | | | |
| Composition 34 | p-34 | | | | | | | | | | | | | |
| Composition 35 | p-35 | | | | | | | | | | | | | |
| Composition 36 | p-36 | | | | 20 | | | | | | | | | |
| Composition 37 | p-37 | | | | | | | | | | | | | |
| Composition 38 | p-38 | | | 10 | | | | | | | | | | |
| Composition 39 | p-39 | | | | | | | | | | | | 20 | |
| Composition 40 | p-40 | | | | | | | | | | | | | |
| Composition 41 | p-41 | | | | | | | | | | | | | |
| Composition 42 | p-42 | | | | | | | | | | | | | |
| Composition 43 | p-43 | | | | | | 40 | | | | | | | |
| Composition 44 | p-44 | | | | | | | | | | | | | |
| Composition 45 | p-45 | | | | | | | | | | | | | |
| Composition 46 | p-46 | | | | | | | | | | | 33 | | |
| Composition 47 | p-47 | | | | | | | | | | | 10 | | |
| Composition 48 | p-48 | | | | | | | | | | 30 | | | |
| Composition 49 | p-49 | | | | | 10 | | | | | | | | |
| Composition 50 | p-50 | | | 10 | | | | | | | | | | |

TABLE 4

| Table 1-1d | Resin | M40 | M41 | M42 | M43 | M44 | M45 | M46 | M47 | M48 | M49 | M50 | M51 | M52 |
|---|---|---|---|---|---|---|---|---|---|---|---|---|---|---|
| Composition 1 | p-1 | | | | | | | | | | | 80 | | |
| Composition 2 | p-2 | | | | | | | | | 80 | | | | |
| Composition 3 | p-3 | | | | | | | 45 | | | | | | |
| Composition 4 | p-4 | | | | | | | | | | 50 | | | |
| Composition 5 | p-5 | | | | | | | 35 | | | 40 | | | |
| Composition 6 | p-6 | | | | | | | | | | 70 | | | |
| Composition 7 | p-7 | | | | | | | | | | | | | |
| Composition 8 | p-8 | | | | | | | | | | | | | 80 |
| Composition 9 | p-9 | | | | | 85 | | | | | | | | |
| Composition 10 | p-10 | | | | | | 80 | | | | | | | |

TABLE 4-continued

| Table 1-1d | Resin | M40 | M41 | M42 | M43 | M44 | M45 | M46 | M47 | M48 | M49 | M50 | M51 | M52 |
|---|---|---|---|---|---|---|---|---|---|---|---|---|---|---|
| Composition 11 | p-11 | | | | | | | | 50 | | | | | |
| Composition 12 | p-12 | | | | | | | | | | | | | |
| Composition 13 | p-13 | | | | | | | | | | | | | |
| Composition 14 | p-14 | | | | | | | | | | | | | |
| Composition 15 | p-15 | | | | 70 | | | | | | | | | |
| Composition 16 | p-16 | | | | | | | | | | | | | |
| Composition 17 | p-17 | | | | | | | | | | | | | |
| Composition 18 | p-18 | | | | | | | | | | | | 80 | |
| Composition 19 | p-19 | | | | | | | 45 | | | | | | |
| Composition 20 | p-20 | | | | | 50 | | | | | | | | |
| Composition 21 | p-21 | | | | | | | | | | | | | 35 |
| Composition 22 | p-22 | | | | | | | 50 | | | | | | |
| Composition 23 | p-23 | | | | 60 | | | | | | | | | |
| Composition 24 | p-24 | | | | | | | | | | | | | |
| Composition 25 | p-25 | | | | | | 85 | | | | | | | |
| Composition 26 | p-26 | | | | | | 40 | | | | | | | |
| Composition 27 | p-27 | | 10 | | | | | | | | 70 | | | |
| Composition 28 | p-28 | | | | | | | | 40 | | | 40 | | |
| Composition 29 | p-29 | | | | | | | | | | | | | |
| Composition 30 | p-30 | | | | | | | | | | | | | |
| Composition 31 | p-31 | | | | | | | | | | | | | |
| Composition 32 | p-32 | | | | 60 | | | | | | | | | |
| Composition 33 | p-33 | | | | | | | | | | | | 70 | |
| Composition 34 | p-34 | | | | | | | | | | | | | |
| Composition 35 | p-35 | | | | | | | | | | | 80 | | |
| Composition 36 | p-36 | | | | | | | | | | 60 | | | |
| Composition 37 | p-37 | | | | | | | 60 | | | | | | |
| Composition 38 | p-38 | | | | | | | 70 | | | | | | |
| Composition 39 | p-39 | | | | | | | | | | | | 50 | |
| Composition 40 | p-40 | | | | | | | | | | | 80 | | |
| Composition 41 | p-41 | | | | | 85 | | | | | | | | |
| Composition 42 | p-42 | | | | | | | | | 60 | | | | |
| Composition 43 | p-43 | | | | | | | | | | | | | |
| Composition 44 | p-44 | | | | | | | | | 80 | | | | |
| Composition 45 | p-45 | | | | | | | 80 | | | | | | |
| Composition 46 | p-46 | | | | | | | | | | | | 48 | |
| Composition 47 | p-47 | | | | | | | | | | | | | 80 |
| Composition 48 | p-48 | | | | | | | | | | 50 | | | |
| Composition 49 | p-49 | | | | | | | | | | | | | |
| Composition 50 | p-50 | | | | | | | | | | | | 80 | |

TABLE 5

| Table 1-1e | Resin | M53 | M54 | M55 | M56 | M57 | M58 | M59 | M60 | M61 | M62 | M63 | M64 | M65 |
|---|---|---|---|---|---|---|---|---|---|---|---|---|---|---|
| Composition 1 | p-1 | | | | | | | | | | | | | |
| Composition 2 | p-2 | | | | | | | | | | | | | |
| Composition 3 | p-3 | | | | | | | | | | | | | |
| Composition 4 | p-4 | | | | | | | | | | | | | |
| Composition 5 | p-5 | | | | | | | | | | | | | |
| Composition 6 | p-6 | | | | | | | | | | | | | |
| Composition 7 | p-7 | 40 | | | | | | | | | | | | |
| Composition 8 | p-8 | | | | | | | | | | | | | |
| Composition 9 | p-9 | | | | | | | | | | | | | |
| Composition 10 | p-10 | | | | | | | | | | | | | |
| Composition 11 | p-11 | | | | | | | | | | | | | |
| Composition 12 | p-12 | | 80 | | | | | | | | | | | |
| Composition 13 | p-13 | | | 60 | | 20 | | | | | | | | |
| Composition 14 | p-14 | | 50 | | | | | | | | | | | |
| Composition 15 | p-15 | | | | | | | | | | | | | |
| Composition 16 | p-16 | | | 55 | | | | | | | | | | |
| Composition 17 | p-17 | 60 | | | | | | | | | | | | |
| Composition 18 | p-18 | | | | | | | | | | | | | |
| Composition 19 | p-19 | | | | | | | | | | | | | |
| Composition 20 | p-20 | | | | | | | | | | | | | |
| Composition 21 | p-21 | | | | | | | 20 | | | | | | |
| Composition 22 | p-22 | | | | | | | | | | | | | |
| Composition 23 | p-23 | | | | | | | | | | | | | |
| Composition 24 | p-24 | 50 | | | | | | | | | | | | |
| Composition 25 | p-25 | | | | | | | | | | | | | |
| Composition 26 | p-26 | | | | | | | | | | | | | |
| Composition 27 | p-27 | | | | | | | | | | | | | |
| Composition 28 | p-28 | | | | | | | | | | | | | |
| Composition 29 | p-29 | 80 | | | | | | | | | | | | |
| Composition 30 | p-30 | | 40 | | | | | | | | | | | |

TABLE 5-continued

| Table 1-1e | Resin | M53 | M54 | M55 | M56 | M57 | M58 | M59 | M60 | M61 | M62 | M63 | M64 | M65 |
|---|---|---|---|---|---|---|---|---|---|---|---|---|---|---|
| Composition 31 | p-31 |  | 60 |  |  |  |  |  |  |  |  |  |  |  |
| Composition 32 | p-32 |  |  |  |  |  |  |  |  |  |  |  |  |  |
| Composition 33 | p-33 |  |  |  |  |  |  |  |  |  |  |  |  |  |
| Composition 34 | p-34 |  |  |  | 50 |  |  |  |  |  |  |  |  |  |
| Composition 35 | p-35 |  |  |  |  |  |  |  |  |  |  |  |  |  |
| Composition 36 | p-36 |  |  |  |  |  |  |  |  |  |  |  |  |  |
| Composition 37 | p-37 |  |  |  |  |  |  |  |  |  |  |  |  |  |
| Composition 38 | p-38 |  |  |  |  |  |  |  |  |  |  |  |  |  |
| Composition 39 | p-39 |  |  |  |  |  |  |  |  |  |  |  |  |  |
| Composition 40 | p-40 |  |  |  |  |  |  |  |  |  |  |  |  |  |
| Composition 41 | p-41 |  |  |  |  |  |  |  |  |  |  |  |  |  |
| Composition 42 | p-42 |  |  |  |  |  |  |  |  |  |  |  |  |  |
| Composition 43 | p-43 |  |  | 45 |  |  |  |  |  |  |  |  |  |  |
| Composition 44 | p-44 |  |  |  |  |  |  |  |  |  |  |  |  |  |
| Composition 45 | p-45 |  |  |  |  |  |  |  |  |  |  |  |  |  |
| Composition 46 | p-46 |  |  |  |  |  |  |  |  |  |  |  |  |  |
| Composition 47 | p-47 |  |  |  |  |  |  |  |  |  |  |  |  |  |
| Composition 48 | p-48 |  |  |  |  |  |  |  |  |  |  |  |  |  |
| Composition 49 | p-49 | 70 |  |  |  |  |  |  |  |  |  |  |  |  |
| Composition 50 | p-50 |  |  |  |  |  |  |  |  |  |  |  |  |  |

TABLE 6

| Table 1-2a | Resin | M1 | M2 | M3 | M4 | M5 | M6 | M7 | M8 | M9 | M10 | M11 | M12 | M13 |
|---|---|---|---|---|---|---|---|---|---|---|---|---|---|---|
| Composition 51 | p-51 |  |  | 20 |  |  |  |  |  |  |  |  |  |  |
| Composition 52 | p-52 |  |  |  |  |  |  |  |  |  |  |  |  |  |
| Composition 53 | p-53 |  |  |  |  |  |  |  |  |  |  |  |  |  |
| Composition 54 | p-54 |  |  |  |  |  | 30 |  |  |  |  |  |  |  |
| Composition 55 | p-55 |  |  |  |  |  |  |  |  |  |  |  | 10 |  |
| Composition 56 | p-56 |  |  |  |  |  |  |  |  |  |  |  |  | 20 |
| Composition 57 | p-57 |  |  |  | 10 |  |  |  |  |  |  |  | 20 |  |
| Composition 58 | p-58 |  |  |  |  |  |  |  |  |  |  |  |  |  |
| Composition 59 | p-59 |  |  | 20 |  |  |  |  |  |  |  |  |  |  |
| Composition 60 | p-60 |  |  |  |  |  |  |  |  | 30 |  |  |  |  |
| Composition 61 | p-61 |  |  |  |  |  |  |  |  |  |  |  | 10 |  |
| Composition 62 | p-62 |  |  |  |  |  |  |  |  |  |  | 10 |  |  |
| Composition 63 | p-63 |  |  |  |  |  |  |  |  |  |  |  |  |  |
| Composition 64 | p-64 | 20 |  |  |  | 10 |  |  |  |  |  |  |  |  |
| Composition 65 | p-65 |  |  | 20 |  |  |  |  |  |  |  |  |  |  |
| Composition 66 | p-66 |  |  |  |  |  |  |  |  | 20 |  |  |  | 10 |
| Composition 67 | p-67 |  |  |  |  |  |  |  |  |  |  |  |  |  |
| Composition 68 | p-68 |  |  |  |  | 20 |  |  |  |  |  |  |  |  |
| Composition 69 | p-69 |  |  |  |  |  |  |  |  |  |  |  |  |  |
| Composition 70 | p-70 |  |  | 5 |  |  |  |  |  |  |  |  |  |  |
| Composition 71 | p-71 |  |  |  |  |  |  |  |  |  |  | 20 |  |  |
| Composition 72 | p-72 |  |  |  |  | 30 |  |  |  |  |  |  |  |  |
| Composition 73 | p-73 |  |  |  |  |  |  |  |  |  |  |  |  |  |
| Composition 74 | p-74 |  |  | 5 |  |  |  |  |  |  |  |  |  |  |
| Composition 75 | p-75 |  |  |  |  |  |  |  |  |  | 10 |  |  |  |
| Composition 76 | p-76 |  |  |  |  | 30 |  |  |  |  |  |  |  |  |
| Composition 77 | p-77 |  |  |  |  |  |  | 20 |  | 20 |  |  |  |  |
| Composition 78 | p-78 |  |  |  | 10 |  |  |  |  |  | 10 |  |  |  |
| Composition 79 | p-79 |  | 10 |  |  |  |  |  |  |  |  |  |  |  |
| Composition 80 | p-80 |  | 10 |  |  |  |  |  |  |  |  |  |  |  |
| Composition 81 | p-81 | 30 |  |  |  | 10 |  |  |  |  |  |  |  |  |
| Composition 82 | p-82 |  | 30 |  |  | 10 |  |  |  |  |  |  |  |  |
| Composition 83 | p-83 |  |  |  |  |  |  |  | 20 |  |  |  |  |  |
| Composition 84 | p-84 |  |  |  |  |  |  |  |  |  |  |  |  |  |
| Composition 85 | p-85 |  |  |  |  |  |  |  |  |  |  |  |  |  |
| Composition 86 | p-86 |  |  |  |  |  |  |  |  |  |  |  | 20 |  |
| Composition 87 | p-87 |  |  |  |  |  |  |  | 20 |  |  |  |  |  |
| Composition 88 | p-88 |  |  |  |  | 20 |  |  |  |  |  |  |  |  |
| Composition 89 | p-89 |  |  |  |  |  | 30 |  |  |  |  |  |  |  |
| Composition 90 | p-90 |  |  |  |  | 40 |  |  |  |  |  |  |  |  |
| Composition 91 | p-91 |  |  |  |  | 30 |  |  |  |  |  |  |  |  |
| Composition 92 | p-92 |  |  |  |  | 20 |  |  |  |  |  |  |  |  |
| Composition 93 | p-93 |  |  |  |  |  |  |  |  |  |  |  |  |  |
| Composition 94 | p-94 |  |  |  |  |  |  |  |  |  |  |  |  |  |
| Composition 95 | p-95 |  |  |  |  |  |  |  |  |  |  |  |  |  |
| Composition 96 | p-96 | 30 |  |  |  |  |  |  |  |  |  |  |  |  |
| Composition 97 | p-97 |  | 10 |  |  |  |  |  |  |  |  |  |  |  |

TABLE 7

| Table 1-2b | Resin | M14 | M15 | M16 | M17 | M18 | M19 | M20 | M21 | M22 | M23 | M24 | M25 | M26 |
|---|---|---|---|---|---|---|---|---|---|---|---|---|---|---|
| Composition 51 | p-51 | | | | | | | | | | | 20 | | |
| Composition 52 | p-52 | | | | | | | | | | 20 | | | |
| Composition 53 | p-53 | | | | | | | | | | | | | |
| Composition 54 | p-54 | | | | 20 | | | | | | | | | |
| Composition 55 | p-55 | | | | | 10 | | | | | | | | |
| Composition 56 | p-56 | | | | | | | | | | | | | |
| Composition 57 | p-57 | | | | | | | | | | | | | |
| Composition 58 | p-58 | | | | 10 | | | | 10 | | | | | |
| Composition 59 | p-59 | | | | | | | | | | | | | |
| Composition 60 | p-60 | | | | | | | | | | | | | |
| Composition 61 | p-61 | | | | | 10 | | | | | | | | |
| Composition 62 | p-62 | | | | | | | | | | | | | |
| Composition 63 | p-63 | | | | | | | | | | | | 10 | |
| Composition 64 | p-64 | | | | | | | | | | | | | |
| Composition 65 | p-65 | | | | | | | | | | | | | |
| Composition 66 | p-66 | | | | | | | | | | | | | |
| Composition 67 | p-67 | | | | | | 10 | | | | | | | |
| Composition 68 | p-68 | | | | | | | | | | | | | |
| Composition 69 | p-69 | | | | 10 | | | | 10 | | | | | |
| Composition 70 | p-70 | | | | | | | | | | | | | |
| Composition 71 | p-71 | | | | | | | | | | | | | |
| Composition 72 | p-72 | | | | | | | | | | | | | 30 |
| Composition 73 | p-73 | | 10 | | | | | | | | | | | |
| Composition 74 | p-74 | | | | | | | | | | | | | |
| Composition 75 | p-75 | | | | | | | | | | | | | |
| Composition 76 | p-76 | | | | | | | | | | | | | |
| Composition 77 | p-77 | | | | | | | | | | | | | |
| Composition 78 | p-78 | | | | | | | | | | | | | |
| Composition 79 | p-79 | | | | | | | | | | | | | |
| Composition 80 | p-80 | | | | | | | | | | | | | |
| Composition 81 | p-81 | | | | | | | | | | | | | |
| Composition 82 | p-82 | | | | | | | | | | | | | |
| Composition 83 | p-83 | | | | | | | | | | | | | |
| Composition 84 | p-84 | | | | | | | | | | | | | |
| Composition 85 | p-85 | | | | | | | | | | | | 20 | |
| Composition 86 | p-86 | | | | | | | | | | | | | |
| Composition 87 | p-87 | 20 | | | | | | | | | | | | |
| Composition 88 | p-88 | | | | | | | | | | | | | |
| Composition 89 | p-89 | | | | | | | | | | | | 20 | |
| Composition 90 | p-90 | | | | | | | | | | | | | |
| Composition 91 | p-91 | | | | | | | | | | | | | |
| Composition 92 | p-92 | | | | | | | | | | | | | |
| Composition 93 | p-93 | | | | | | | | | | | | | |
| Composition 94 | p-94 | | | | | | | | | | | | | |
| Composition 95 | p-95 | | | | | | | | | | | | | |
| Composition 96 | p-96 | | | | | | | | | | | | | |
| Composition 97 | p-97 | | | | | | | | | | | | | |

TABLE 8

| Table 1-2c | Resin | M27 | M28 | M29 | M30 | M31 | M32 | M33 | M34 | M35 | M36 | M37 | M38 | M39 |
|---|---|---|---|---|---|---|---|---|---|---|---|---|---|---|
| Composition 51 | p-51 | | | | | | | | | 20 | | | | 20 |
| Composition 52 | p-52 | | | | | | | | | | | | | |
| Composition 53 | p-53 | | | | | | | | 10 | 10 | | | | |
| Composition 54 | p-54 | | | | | | | | | | | | | |
| Composition 55 | p-55 | | | | | | | | | | | | | |
| Composition 56 | p-56 | | | | | 30 | | | | | | | | |
| Composition 57 | p-57 | | | | | | | | | | | | | |
| Composition 58 | p-58 | | | | | | | | | | | | 20 | |
| Composition 59 | p-59 | | | | | | | | | | | | 20 | |
| Composition 60 | p-60 | | | | | | | | | | 20 | | | |
| Composition 61 | p-61 | | | | | | | | | | | | | |
| Composition 62 | p-62 | | 45 | | | | | | | | | | | |
| Composition 63 | p-63 | | | | | 20 | | | | | | | | |
| Composition 64 | p-64 | | | | | | | | | | | | | |
| Composition 65 | p-65 | | | | | | | | | | | | 20 | |
| Composition 66 | p-66 | | | | | | | | | | | | | |
| Composition 67 | p-67 | | | | | | | 20 | | | | | | |
| Composition 68 | p-68 | | | | | | | | | | 20 | | | |
| Composition 69 | p-69 | | | | | | | | | | | | | |
| Composition 70 | p-70 | | | | | | | | 5 | | | | | |
| Composition 71 | p-71 | | | | | | | | | | | 20 | | |
| Composition 72 | p-72 | | | | | | | | | | | | | |
| Composition 73 | p-73 | | | | | | 10 | | | | | | | |

TABLE 8-continued

| Table 1-2c | Resin | M27 | M28 | M29 | M30 | M31 | M32 | M33 | M34 | M35 | M36 | M37 | M38 | M39 |
|---|---|---|---|---|---|---|---|---|---|---|---|---|---|---|
| Composition 74 | p-74 | | | | | | | | 5 | | | | | |
| Composition 75 | p-75 | | | | | | | | | | | | | |
| Composition 76 | p-76 | | | | | 20 | | | | | | | | |
| Composition 77 | p-77 | | | | | | | | | | | | | |
| Composition 78 | p-78 | | | | | | | | | | | | | |
| Composition 79 | p-79 | | | | | | | | | | 5 | | | |
| Composition 80 | p-80 | | | | | | | | | | | | | |
| Composition 81 | p-81 | | | | | | | | | | | | | |
| Composition 82 | p-82 | | | | | | | | | | | | | |
| Composition 83 | p-83 | | | | | | | | | | | 10 | | |
| Composition 84 | p-84 | | | 10 | | | | | | | | | | |
| Composition 85 | p-85 | | | | | | | | | | | | 20 | |
| Composition 86 | p-86 | | | | | | | | | | | | | |
| Composition 87 | p-87 | | | | | | | | | | | | | |
| Composition 88 | p-88 | | | | | | | | | | | 20 | | |
| Composition 89 | p-89 | | | | | | | | | | | | | |
| Composition 90 | p-90 | | | | | | | | | | | | | |
| Composition 91 | p-91 | | | | | | | | | | | | | |
| Composition 92 | p-92 | | | | | | | | | | | | | |
| Composition 93 | p-93 | | | | | | | | | | | | | |
| Composition 94 | p-94 | | | | | | | | | | | | | |
| Composition 95 | p-95 | | | | | | | | | | | | | |
| Composition 96 | p-96 | | | | | | | | | | | | | |
| Composition 97 | p-97 | | | | | | | | | | | | | |

TABLE 9

| Table 1-2d | Resin | M40 | M41 | M42 | M43 | M44 | M45 | M46 | M47 | M48 | M49 | M50 | M51 | M52 |
|---|---|---|---|---|---|---|---|---|---|---|---|---|---|---|
| Composition 51 | p-51 | | | | | | | | | | | | | 60 |
| Composition 52 | p-52 | | | | | | | | | | | | 60 | |
| Composition 53 | p-53 | | | | | | 50 | | | | | | | |
| Composition 54 | p-54 | | | | | | | | | | | 50 | | |
| Composition 55 | p-55 | | | | | 80 | | | | | | | | |
| Composition 56 | p-56 | | | | | | | | | | | 30 | | |
| Composition 57 | p-57 | | | | 70 | | | | | | | | | |
| Composition 58 | p-58 | | | | 80 | | | | | | | | | |
| Composition 59 | p-59 | | | | 60 | | | | | | | | | |
| Composition 60 | p-60 | | | | | | | | | | | | | 50 |
| Composition 61 | p-61 | | | | | 80 | | | | | | | | |
| Composition 62 | p-62 | | | | 25 | | | | | | 20 | | | |
| Composition 63 | p-63 | | | | | 40 | | | | | | | | |
| Composition 64 | p-64 | | | | | | | | 70 | | | | | |
| Composition 65 | p-65 | | | | 60 | | | | | | | | | |
| Composition 66 | p-66 | | | | | | | | | | | 70 | | |
| Composition 67 | p-67 | | | | | | | | | | | | | 70 |
| Composition 68 | p-68 | | | | | | | | | | 60 | | | |
| Composition 69 | p-69 | | | | 80 | | | | | | | | | |
| Composition 70 | p-70 | | | | | | | | | | | 35 | | |
| Composition 71 | p-71 | | | | 60 | | | | | | | | | |
| Composition 72 | p-72 | | | | | | | | | | | | | 40 |
| Composition 73 | p-73 | | | | | | | | | | | | | |
| Composition 74 | p-74 | | | | | | | | | | | 35 | | |
| Composition 75 | p-75 | | 20 | | | | | | | | | | | |
| Composition 76 | p-76 | | | | | | | | 50 | | | | | |
| Composition 77 | p-77 | | | | | | | | | | | 60 | | |
| Composition 78 | p-78 | | | | | | | | | | | 40 | | |
| Composition 79 | p-79 | | | | | | | | | | | 85 | | |
| Composition 80 | p-80 | | | | | | | | | | | 40 | | |
| Composition 81 | p-81 | | | | | | | | | | | | | |
| Composition 82 | p-82 | | | | | | | | | | | | | |
| Composition 83 | p-83 | | | | | | | | | | | | | |
| Composition 84 | p-84 | | | | 20 | | | | | | | | | |
| Composition 85 | p-85 | | | | | | | | | | | | | |
| Composition 86 | p-86 | 20 | | | | | | | | | | | | |
| Composition 87 | p-87 | | | | | | | | | | | | | |
| Composition 88 | p-88 | | | | | | | | | | | | | |
| Composition 89 | p-89 | | | | | | | | | | | | | |
| Composition 90 | p-90 | | | | | | 60 | | | | | | | |
| Composition 91 | p-91 | | | | | | 70 | | | | | | | |
| Composition 92 | p-92 | | | | | | 80 | | | | | | | |
| Composition 93 | p-93 | | | | | | | | | | | | | |
| Composition 94 | p-94 | | | | | | | | | | | | | |

TABLE 9-continued

| Table 1-2d | Resin | M40 | M41 | M42 | M43 | M44 | M45 | M46 | M47 | M48 | M49 | M50 | M51 | M52 |
|---|---|---|---|---|---|---|---|---|---|---|---|---|---|---|
| Composition 95 | p-95 | | | | | | | | | | | | | |
| Composition 96 | p-96 | | | | | | | | | | | | | |
| Composition 97 | p-97 | | | | | | | | | | | | | |

TABLE 10

| Table 1-2e | Resin | M53 | M54 | M55 | M56 | M57 | M58 | M59 | M60 | M61 | M62 | M63 | M64 | M65 |
|---|---|---|---|---|---|---|---|---|---|---|---|---|---|---|
| Composition 51 | p-51 | | | | | | | | | | | | | |
| Composition 52 | p-52 | | | | | | | | | | | | | |
| Composition 53 | p-53 | | | | | | 30 | | | | | | | |
| Composition 54 | p-54 | | | | | | | | | | | | | |
| Composition 55 | p-55 | | | | | | | | | | | | | |
| Composition 56 | p-56 | | | | | 20 | | | | | | | | |
| Composition 57 | p-57 | | | | | | | | | | | | | |
| Composition 58 | p-58 | | | | | | | | | | | | | |
| Composition 59 | p-59 | | | | | | | | | | | | | |
| Composition 60 | p-60 | | | | | | | | | | | | | |
| Composition 61 | p-61 | | | | | | | | | | | | | |
| Composition 62 | p-62 | | | | | | | | | | | | | |
| Composition 63 | p-63 | | | | | | 30 | | | | | | | |
| Composition 64 | p-64 | | | | | | | | | | | | | |
| Composition 65 | p-65 | | | | | | | | | | | | | |
| Composition 66 | p-66 | | | | | | | | | | | | | |
| Composition 67 | p-67 | | | | | | | | | | | | | |
| Composition 68 | p-68 | | | | | | | | | | | | | |
| Composition 69 | p-69 | | | | | | | | | | | | | |
| Composition 70 | p-70 | | 55 | | | | | | | | | | | |
| Composition 71 | p-71 | | | | | | | | | | | | | |
| Composition 72 | p-72 | | | | | | | | | | | | | |
| Composition 73 | p-73 | | | | | 80 | | | | | | | | |
| Composition 74 | p-74 | | 55 | | | | | | | | | | | |
| Composition 75 | p-75 | | 70 | | | | | | | | | | | |
| Composition 76 | p-76 | | | | | | | | | | | | | |
| Composition 77 | p-77 | | | | | | | | | | | | | |
| Composition 78 | p-78 | | | 40 | | | | | | | | | | |
| Composition 79 | p-79 | | | | | | | | | | | | | |
| Composition 80 | p-80 | 50 | | | | | | | | | | | | |
| Composition 81 | p-81 | | | | | | 60 | | | | | | | |
| Composition 82 | p-82 | | | | | | 60 | | | | | | | |
| Composition 83 | p-83 | | | | | | 70 | | | | | | | |
| Composition 84 | p-84 | | | | | | 70 | | | | | | | |
| Composition 85 | p-85 | | | | | | 60 | | | | | | | |
| Composition 86 | p-86 | | | | | | | | | | 60 | | | |
| Composition 87 | p-87 | | | | | | | | | | 60 | | | |
| Composition 88 | p-88 | | | | | | | | | | 60 | | | |
| Composition 89 | p-89 | | | | | | 50 | | | | | | | |
| Composition 90 | p-90 | | | | | | | | | | | | | |
| Composition 91 | p-91 | | | | | | | | | | | | | |
| Composition 92 | p-92 | | | | | | | | | | | | | |
| Composition 93 | p-93 | | | | | | | 35 | 40 | 25 | | | | |
| Composition 94 | p-94 | | | | | | | 35 | 40 | 25 | | | | |
| Composition 95 | p-95 | | | | | | | 35 | 40 | 25 | | | | |
| Composition 96 | p-96 | | | | | | | | | | | 20 | 50 | |
| Composition 97 | P-97 | | | | | | | 10 | 50 | | | | | 30 |

The weight-average molecular weight (Mw) and the dispersity (weight-average molecular weight/number-average molecular weight) of each resin, and the ClogP value of the resin after elimination of the protective group from the resin by the action of an acid are shown in the following table.

TABLE 11

| Table 2 | Resin | Mw | Dispersity | ClogP after deprotection |
|---|---|---|---|---|
| Composition 1 | p-1 | 15,000 | 1.5 | 0.64 |
| Composition 2 | p-2 | 11,300 | 1.7 | 0.50 |
| Composition 3 | p-3 | 9,500 | 1.5 | 1.32 |
| Composition 4 | p-4 | 12,800 | 1.6 | 0.35 |
| Composition 5 | p-5 | 11,500 | 1.7 | 0.97 |

TABLE 11-continued

| Table 2 | Resin | Mw | Dispersity | ClogP after deprotection |
|---|---|---|---|---|
| Composition 6 | p-6 | 13,900 | 1.5 | 0.61 |
| Composition 7 | p-7 | 11,300 | 1.4 | −0.18 |
| Composition 8 | p-8 | 9,500 | 1.4 | 0.11 |
| Composition 9 | p-9 | 13,300 | 1.3 | 0.80 |
| Composition 10 | p-10 | 9,200 | 1.3 | 0.43 |
| Composition 11 | p-11 | 11,100 | 1.5 | 1.33 |
| Composition 12 | p-12 | 11,800 | 1.7 | −0.25 |
| Composition 13 | p-13 | 9,400 | 1.5 | −0.34 |
| Composition 14 | p-14 | 11,600 | 1.3 | −0.11 |
| Composition 15 | p-15 | 11,900 | 1.6 | 0.96 |
| Composition 16 | p-16 | 14,300 | 1.6 | 1.25 |
| Composition 17 | p-17 | 12,800 | 1.4 | 0.41 |

TABLE 11-continued

| Table 2 | Resin | Mw | Dispersity | ClogP after deprotection |
|---|---|---|---|---|
| Composition 18 | p-18 | 11,600 | 1.3 | 0.63 |
| Composition 19 | p-19 | 14,000 | 1.4 | 1.26 |
| Composition 20 | p-20 | 14,500 | 1.7 | 0.54 |
| Composition 21 | p-21 | 13,300 | 1.5 | 1.30 |
| Composition 22 | p-22 | 14,400 | 1.5 | 0.94 |
| Composition 23 | p-23 | 13,100 | 1.6 | 1.38 |
| Composition 24 | p-24 | 12,800 | 1.3 | −0.24 |
| Composition 25 | p-25 | 13,600 | 1.6 | 0.80 |
| Composition 26 | p-26 | 14,700 | 1.3 | 0.72 |
| Composition 27 | p-27 | 8,100 | 1.4 | 0.65 |
| Composition 28 | p-28 | 15,000 | 1.3 | 0.51 |
| Composition 29 | p-29 | 11,000 | 1.3 | −0.03 |
| Composition 30 | p-30 | 10,000 | 1.3 | −0.17 |
| Composition 31 | p-31 | 14,700 | 1.4 | 0.42 |
| Composition 32 | p-32 | 12,500 | 1.3 | 1.38 |
| Composition 33 | p-33 | 12,700 | 1.5 | 0.77 |
| Composition 34 | p-34 | 11,300 | 1.3 | 0.72 |
| Composition 35 | p-35 | 12,300 | 1.6 | 0.84 |
| Composition 36 | p-36 | 10,300 | 1.7 | 1.23 |
| Composition 37 | p-37 | 12,500 | 1.5 | 0.46 |
| Composition 38 | p-38 | 12,600 | 1.7 | 0.83 |
| Composition 39 | p-39 | 9,300 | 1.7 | 0.39 |
| Composition 40 | p-40 | 12,200 | 1.3 | 0.84 |
| Composition 41 | p-41 | 8,400 | 1.4 | 0.80 |
| Composition 42 | p-42 | 14,900 | 1.4 | 1.30 |
| Composition 43 | p-43 | 10,800 | 1.6 | 1.38 |
| Composition 44 | p-44 | 9,600 | 1.4 | 0.42 |
| Composition 45 | p-45 | 9,600 | 1.3 | 0.67 |
| Composition 46 | p-46 | 8,400 | 1.7 | 0.46 |
| Composition 47 | p-47 | 8,900 | 1.4 | −0.47 |
| Composition 48 | p-48 | 9,200 | 1.7 | 0.63 |
| Composition 49 | p-49 | 11,300 | 1.5 | 0.24 |
| Composition 50 | p-50 | 9,400 | 1.3 | 0.95 |
| Composition 51 | p-51 | 8,800 | 1.4 | −0.23 |
| Composition 52 | p-52 | 8,100 | 1.4 | 0.33 |
| Composition 53 | p-53 | 14,100 | 1.4 | 0.63 |
| Composition 54 | p-54 | 12,300 | 1.4 | 1.03 |
| Composition 55 | p-55 | 11,800 | 1.4 | 0.65 |
| Composition 56 | p-56 | 8,600 | 1.5 | 1.39 |
| Composition 57 | p-57 | 13,900 | 1.5 | 0.80 |
| Composition 58 | p-58 | 10,300 | 1.5 | 0.89 |
| Composition 59 | p-59 | 9,900 | 1.7 | 1.38 |
| Composition 60 | p-60 | 12,100 | 1.6 | −0.36 |
| Composition 61 | p-61 | 9,100 | 1.3 | 0.65 |
| Composition 62 | p-62 | 12,700 | 1.3 | 1.35 |
| Composition 63 | p-63 | 13,700 | 1.5 | 1.39 |
| Composition 64 | p-64 | 9,600 | 1.5 | 0.96 |
| Composition 65 | p-65 | 11,800 | 1.3 | 1.38 |
| Composition 66 | p-66 | 12,600 | 1.4 | 0.51 |
| Composition 67 | p-67 | 9,100 | 1.4 | 0.77 |
| Composition 68 | p-68 | 13,400 | 1.7 | 0.30 |
| Composition 69 | p-69 | 10,800 | 1.7 | 0.89 |
| Composition 70 | p-70 | 9,700 | 1.5 | −0.03 |
| Composition 71 | p-71 | 14,600 | 1.3 | 0.49 |
| Composition 72 | p-72 | 10,400 | 1.4 | 0.23 |
| Composition 73 | p-73 | 14,300 | 1.3 | −0.21 |
| Composition 74 | p-74 | 10,300 | 1.6 | −0.03 |
| Composition 75 | p-75 | 13,500 | 1.3 | −0.22 |
| Composition 76 | p-76 | 8,500 | 1.6 | 1.33 |
| Composition 77 | p-77 | 9,700 | 1.5 | 0.75 |
| Composition 78 | p-78 | 13,600 | 1.4 | 0.26 |
| Composition 79 | p-79 | 10,000 | 1.5 | 0.70 |
| Composition 80 | p-80 | 14,700 | 1.5 | 0.05 |
| Composition 81 | p-81 | 8,400 | 1.6 | 1.12 |
| Composition 82 | p-82 | 12,700 | 1.3 | 0.94 |
| Composition 83 | p-83 | 9,200 | 1.6 | 0.51 |
| Composition 84 | p-84 | 9,100 | 1.4 | 0.60 |
| Composition 85 | p-85 | 13,800 | 1.5 | 0.19 |
| Composition 86 | p-86 | 14,300 | 1.6 | 0.58 |
| Composition 87 | p-87 | 13,300 | 1.3 | 0.60 |
| Composition 88 | p-88 | 14,100 | 1.4 | 0.46 |
| Composition 89 | p-89 | 10,400 | 1.3 | 0.75 |
| Composition 90 | p-90 | 8,100 | 1.3 | 0.64 |
| Composition 91 | p-91 | 10,800 | 1.4 | 0.65 |
| Composition 92 | p-92 | 11,200 | 1.7 | 0.65 |
| Composition 93 | p-93 | 10,400 | 1.7 | 3.45 |
| Composition 94 | p-94 | 10,500 | 1.4 | 3.45 |
| Composition 95 | p-95 | 14,500 | 1.4 | 3.45 |
| Composition 96 | p-96 | 9,300 | 1.5 | 3.09 |
| Composition 97 | p-97 | 14,600 | 1.3 | 1.54 |

<Photoacid Generator>

A photoacid generator consisting of a combination of an anion and a cation shown below was used.

(Anion)

The following anions were used as anions.

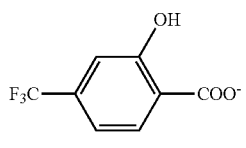

A1

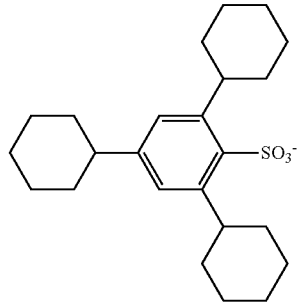

A2

A3

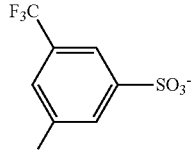

A4

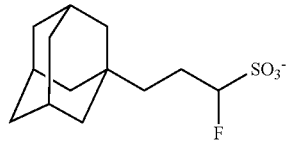

A5

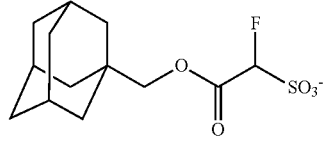

A6

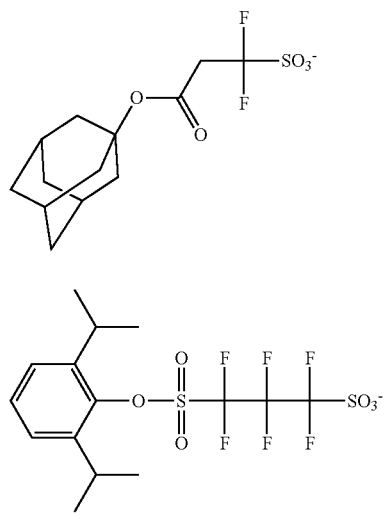
A7
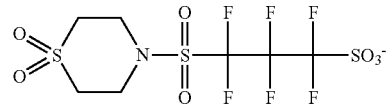
A14
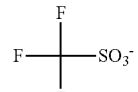
A15
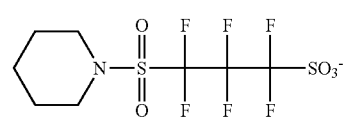
A16
A8
A9
(Cation)
The following cations were used as cations.
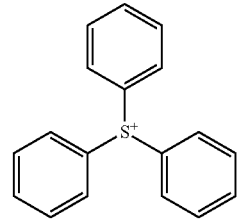
C1
A10
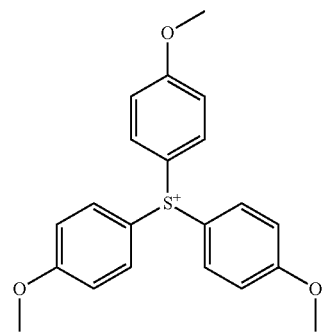
C2
A11
A12
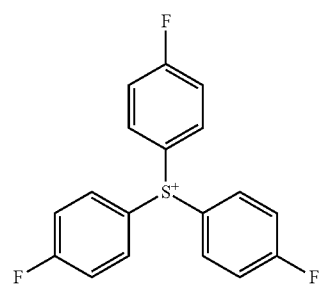
C3
A13
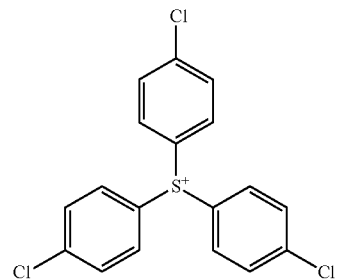
C4

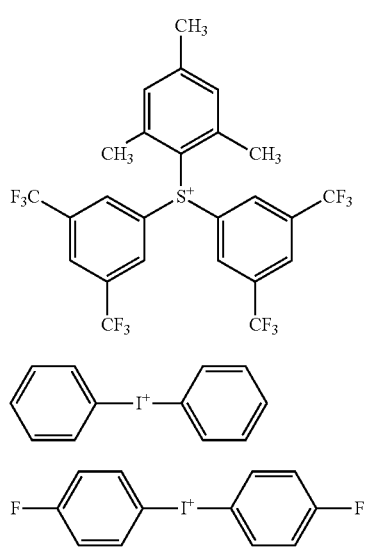

The following tables show combinations and addition amounts of anions and cations in the photoacid generators used in the respective resist composition.

The numerical values in the tables indicate the content (mmol) of each component in 1 g of the solid content of the resist composition.

Furthermore, in a case where two kinds of anions are present with respect to one kind of cation, it means that the composition includes two kinds of photoacid generators.

For example, the composition 3 includes 0.2 mmol of a photoacid generator consisting of a combination of A1 and C1 and 0.1 mmol of a photoacid generator consisting of a combination of A10 and C1 in 1 g of the solid content of the resist composition.

TABLE 12

| Table 3-1 | Anion (mmol/g) | | | | | | | | | | | | | | | |
|---|---|---|---|---|---|---|---|---|---|---|---|---|---|---|---|---|
| | A1 | A2 | A3 | A4 | A5 | A6 | A7 | A8 | A9 | A10 | A11 | A12 | A13 | A14 | A15 | A16 |
| Composition 1 | | | | | | 0.10 | | | | | | | | | | |
| Composition 2 | | 0.20 | | | | | 0.20 | | | | | | | | | |
| Composition 3 | 0.20 | | | | | | | | | 0.10 | | | | | | |
| Composition 4 | | | | | | | | | | | | 0.30 | | | | |
| Composition 5 | | | | | | | | 0.10 | | | | | | | 0.50 | |
| Composition 6 | | | | | 0.30 | | | | | | | | | | | |
| Composition 7 | | | 0.10 | | | | | | | | | | | | 0.20 | |
| Composition 8 | | 0.10 | | | | | | 0.30 | | | | | | | | |
| Composition 9 | | | | | | 0.30 | 0.10 | | | | | | | | | |
| Composition 10 | | | | | | | | | | | | | 0.30 | | | |
| Composition 11 | | | | | | | | 0.30 | | | | | | | | |
| Composition 12 | | | | | | | | | | | | 0.30 | | | | |
| Composition 13 | | | | | | 0.10 | | | | | | | | | 0.30 | |
| Composition 14 | 0.30 | | | | | 0.10 | | | | | | | | | | |
| Composition 15 | | | 0.20 | | | 0.20 | | | | | | | | | | |
| Composition 16 | | | | | 0.30 | | | | | 0.10 | | | | | | |
| Composition 17 | | | | | | | 0.30 | | | | | | | | | |
| Composition 18 | | | | | 0.30 | | | | | | | | | | | |
| Composition 19 | | 0.30 | | | | | | | | | | | | 0.10 | | |
| Composition 20 | | | | 0.30 | | | | | | | | | | | | |
| Composition 21 | | | | | | | | | | | | | | | | 0.30 |
| Composition 22 | | | | | | | | | | | | | 0.30 | | | |
| Composition 23 | | | | | | | | | | | | | | | 0.20 | |
| Composition 24 | 0.30 | | | | | | | | | 0.10 | | | | | | |
| Composition 25 | | | | | | 0.30 | 0.10 | | | | | | | | | |

| Table 3-1 | Cation (mmol/g) | | | | | | | |
|---|---|---|---|---|---|---|---|---|
| | C1 | C2 | C3 | C4 | C5 | C6 | C7 | C8 |
| Composition 1 | 0.10 | | | | | | | |
| Composition 2 | 0.40 | | | | | | | |
| Composition 3 | 0.30 | | | | | | | |
| Composition 4 | 0.30 | | | | | | | |
| Composition 5 | 0.60 | | | | | | | |
| Composition 6 | | | 0.30 | | | | | |
| Composition 7 | 0.30 | | | | | | | |
| Composition 8 | 0.40 | | | | | | | |
| Composition 9 | 0.40 | | | | | | | |
| Composition 10 | | 0.30 | | | | | | |
| Composition 11 | 0.30 | | | | | | | |
| Composition 12 | 0.30 | | | | | | | |
| Composition 13 | | | | | | 0.40 | | |
| Composition 14 | 0.40 | | | | | | | |
| Composition 15 | 0.40 | | | | | | | |
| Composition 16 | 0.40 | | | | | | | |

TABLE 12-continued

| Composition | Col A | Col B | Col C |
|---|---|---|---|
| Composition 17 | 0.30 | | |
| Composition 18 | | 0.30 | |
| Composition 19 | 0.40 | | |
| Composition 20 | 0.30 | | |
| Composition 21 | 0.30 | | |
| Composition 22 | 0.30 | | |
| Composition 23 | | | 0.20 |
| Composition 24 | 0.40 | | |
| Composition 25 | 0.40 | | |

TABLE 13

| Table 3-2 | A1 | A2 | A3 | A4 | A5 | A6 | A7 | A8 | A9 | A10 | A11 | A12 | A13 | A14 | A15 | A16 |
|---|---|---|---|---|---|---|---|---|---|---|---|---|---|---|---|---|
| Composition 26 | | | | 0.50 | | | | | | | | | | | | |
| Composition 27 | | | | 0.30 | | | | | | | | | | | | |
| Composition 28 | | | | | | | | | 0.30 | | | | | | | |
| Composition 29 | | | | | | | | | | | | | | 0.30 | | |
| Composition 30 | | | | | | | | | 0.30 | | | | | | | |
| Composition 31 | | | | | | | | 0.30 | | | | | | | | |
| Composition 32 | | | | | | | | | | | | | | | 0.30 | |
| Composition 33 | | | | | | | | | | | 0.30 | | | | | |
| Composition 34 | | | | 0.20 | | | | | 0.10 | | | | | | | |
| Composition 35 | | | | | | | | 0.20 | | | | | | | | |
| Composition 36 | 0.20 | | | | | | | | | 0.10 | | | | | | |
| Composition 37 | | | | | | | 0.30 | | | | | | | | | |
| Composition 38 | | 0.20 | | | | | | | | | 0.20 | | | | | |
| Composition 39 | | | | | | | 0.30 | | | | | 0.10 | | | | |
| Composition 40 | | | | | | | | 0.20 | | | | | | | | |
| Composition 41 | | | | | 0.30 | 0.10 | | | | | | | | | | |
| Composition 42 | | | | | | | | | | | 0.30 | | | | | |
| Composition 43 | | | | 0.40 | | | | | | | | | | | | |
| Composition 44 | | | | | | | | | | | 0.30 | | | | | |
| Composition 45 | | | | | 0.30 | 0.10 | | | | | | | | | | |
| Composition 46 | | | | | 0.40 | | | | 0.10 | | | | | | | |
| Composition 47 | | | | | 0.30 | 0.10 | | | | | | | | | | |
| Composition 48 | | | | | | | | | | | | | | 0.30 | | |
| Composition 49 | | | | | | 0.30 | | | | | | | | | | |
| Composition 50 | | | | | | | | | | | 0.30 | | | | | |

| Table 3-2 | C1 | C2 | C3 | C4 | C5 | C6 | C7 | C8 |
|---|---|---|---|---|---|---|---|---|
| Composition 26 | 0.50 | | | | | | | |
| Composition 27 | | | | | | | | 0.30 |
| Composition 28 | 0.30 | | | | | | | |
| Composition 29 | 0.30 | | | | | | | |
| Composition 30 | 0.30 | | | | | | | |
| Composition 31 | 0.30 | | | | | | | |
| Composition 32 | | | | | | 0.30 | | |
| Composition 33 | 0.30 | | | | | | | |
| Composition 34 | 0.30 | | | | | | | |
| Composition 35 | 0.20 | | | | | | | |
| Composition 36 | 0.30 | | | | | | | |
| Composition 37 | 0.30 | | | | | | | |
| Composition 38 | 0.40 | | | | | | | |
| Composition 39 | 0.40 | | | | | | | |
| Composition 40 | 0.20 | | | | | | | |
| Composition 41 | 0.40 | | | | | | | |
| Composition 42 | 0.30 | | | | | | | |
| Composition 43 | 0.40 | | | | | | | |
| Composition 44 | 0.30 | | | | | | | |
| Composition 45 | 0.40 | | | | | | | |
| Composition 46 | 0.50 | | | | | | | |
| Composition 47 | 0.40 | | | | | | | |
| Composition 48 | | | | | | 0.30 | | |
| Composition 49 | 0.30 | | | | | | | |
| Composition 50 | | | 0.30 | | | | | |

TABLE 14

| Table 3-3 | Anion (mmol/g) | | | | | | | | | | | | | | |
|---|---|---|---|---|---|---|---|---|---|---|---|---|---|---|---|
| | A1 | A2 | A3 | A4 | A5 | A6 | A7 | A8 | A9 | A10 | A11 | A12 | A13 | A14 | A15 |
| Composition 51 | | | | | | 0.40 | | | | | | | | | |
| Composition 52 | | | | | | | | | | | | | | | |
| Composition 53 | 0.20 | | | | | | 0.10 | | | | | | | | |
| Composition 54 | | | | | | | | 0.30 | | | | | | | |
| Composition 55 | | | 0.20 | | 0.20 | | | | | | | | | | |
| Composition 56 | | | | 0.40 | | | | | | | | | | | |
| Composition 57 | | | | | | | | 0.20 | | | | | | | |
| Composition 58 | | | 0.20 | | 0.20 | | | | | | | | | | |
| Composition 59 | | | | | | | | | | | | | | | 0.40 |
| Composition 60 | | | | 0.40 | | | | | | | | | | | |
| Composition 61 | | | 0.20 | | 0.20 | | | | | | | | | | |
| Composition 62 | | | | | | | | | | | | | 0.40 | | |
| Composition 63 | | | | | | 0.40 | | | | | | | | | |
| Composition 64 | | | | | | | | 0.30 | | | | | | | |
| Composition 65 | | | | | | | | | | | | | | | 0.30 |
| Composition 66 | | | | | | 0.40 | | | | | | | | | |
| Composition 67 | | | | | | | | | | | | | | | 0.40 |
| Composition 68 | | | | | | | | | | | | | 0.30 | | |
| Composition 69 | | | 0.20 | | 0.20 | | | | | | | | | | |
| Composition 70 | | | | | | | 0.45 | | | | | | | | |
| Composition 71 | | | | | | 0.30 | | | | | | | | | |
| Composition 72 | | | | | | | | | | 0.40 | | | | | |
| Composition 73 | | | | | | 0.10 | | | | | | | | | 0.30 |
| Composition 74 | | | 0.20 | | | | 0.15 | | | | | | | | |
| Composition 75 | | | | | 0.30 | | | | | | | | | | |

| Table 3-3 | | Cation (mmol/g) | | | | | | | |
|---|---|---|---|---|---|---|---|---|---|
| | A16 | C1 | C2 | C3 | C4 | C5 | C6 | C7 | C8 |
| Composition 51 | | 0.40 | | | | | | | |
| Composition 52 | 0.30 | 0.30 | | | | | | 0.30 | |
| Composition 53 | | | | | | | | 0.30 | |
| Composition 54 | | 0.30 | | | | | | | |
| Composition 55 | | 0.40 | | | | | | | |
| Composition 56 | | 0.40 | | | | | | | |
| Composition 57 | | 0.20 | | | | | | | |
| Composition 58 | | 0.40 | | | | | | | |
| Composition 59 | | | | | | | 0.40 | | |
| Composition 60 | | 0.40 | | | | | | | |
| Composition 61 | | 0.40 | | | | | | | |
| Composition 62 | | 0.40 | | | | | | | |
| Composition 63 | | 0.40 | | | | | | | |
| Composition 64 | | 0.30 | | | | | | | |
| Composition 65 | | | | | | | 0.30 | | |
| Composition 66 | | | | | | 0.40 | | | |
| Composition 67 | | | | | | | 0.40 | | |
| Composition 68 | | 0.30 | | | | | | | |
| Composition 69 | | 0.40 | | | | | | | |
| Composition 70 | | 0.45 | | | | | | | |
| Composition 71 | | 0.30 | | | | | | | |
| Composition 72 | | 0.40 | | | | | | | |
| Composition 73 | | | | | | | 0.40 | | |
| Composition 74 | | 0.35 | | | | | | | |
| Composition 75 | | 0.30 | | | | | | | |

TABLE 15

| Table 3-4 | Anion (mmol/g) | | | | | | | | | | | | | | | |
|---|---|---|---|---|---|---|---|---|---|---|---|---|---|---|---|---|
| | A1 | A2 | A3 | A4 | A5 | A6 | A7 | A8 | A9 | A10 | A11 | A12 | A13 | A14 | A15 | A16 |
| Composition 76 | | | | | | | | 0.30 | | | | | | | | |
| Composition 77 | | | | | | | 0.30 | | | | | | | | | |
| Composition 78 | | | | | | | 0.30 | | | | | | | | | |
| Composition 79 | | | | | | 0.20 | | | | | | | | | | |
| Composition 80 | | | | | 0.20 | | 0.10 | | | | | | | | | |
| Composition 81 | | | | | | 0.30 | | | | | | | | | | |
| Composition 82 | | | | | | 0.30 | | | | | | | | | | |

TABLE 15-continued

| | | | | | | | | | |
|---|---|---|---|---|---|---|---|---|---|
| Composition 83 | 0.20 | | | | | | 0.20 | | |
| Composition 84 | | | 0.40 | | | | | | |
| Composition 85 | | 0.30 | | | | | | | |
| Composition 86 | | | | | | 0.30 | | | |
| Composition 87 | 0.20 | | | | | | | 0.10 | |
| Composition 88 | | | 0.40 | | | | | | |
| Composition 89 | | 0.20 | | | | | | | 0.10 |
| Composition 90 | | | | 0.20 | | | | | |
| Composition 91 | | | | 0.20 | | | | | |
| Composition 92 | | | | 0.20 | | | | | |
| Composition 93 | | | | | 0.30 | | | | |
| Composition 94 | | | | | 0.30 | | | | |
| Composition 95 | | | | | 0.30 | | | | |
| Composition 96 | | | | | | | 0.30 | | |
| Composition 97 | | | | | | | | 0.30 | |

| | | Cation (mmol/g) | | | | | | | |
|---|---|---|---|---|---|---|---|---|---|
| Table 3-4 | | C1 | C2 | C3 | C4 | C5 | C6 | C7 | C8 |
| Composition 76 | | 0.30 | | | | | | | |
| Composition 77 | | 0.30 | | | | | | | |
| Composition 78 | | | | | | 0.30 | | | |
| Composition 79 | | 0.20 | | | | | | | |
| Composition 80 | | 0.30 | | | | | | | |
| Composition 81 | | 0.30 | | | | | | | |
| Composition 82 | | 0.30 | | | | | | | |
| Composition 83 | | 0.40 | | | | | | | |
| Composition 84 | | 0.40 | | | | | | | |
| Composition 85 | | 0.30 | | | | | | | |
| Composition 86 | | 0.30 | | | | | | | |
| Composition 87 | | 0.30 | | | | | | | |
| Composition 88 | | 0.40 | | | | | | | |
| Composition 89 | | 0.30 | | | | | | | |
| Composition 90 | | 0.20 | | | | | | | |
| Composition 91 | | 0.20 | | | | | | | |
| Composition 92 | | 0.20 | | | | | | | |
| Composition 93 | | | | | | 0.30 | | | |
| Composition 94 | | | | | | 0.30 | | | |
| Composition 95 | | | | | | 0.30 | | | |
| Composition 96 | | 0.30 | | | | | | | |
| Composition 97 | | | | 0.30 | | | | | |

<Acid Diffusion Control Agent>

The acid diffusion control agents shown below were used.

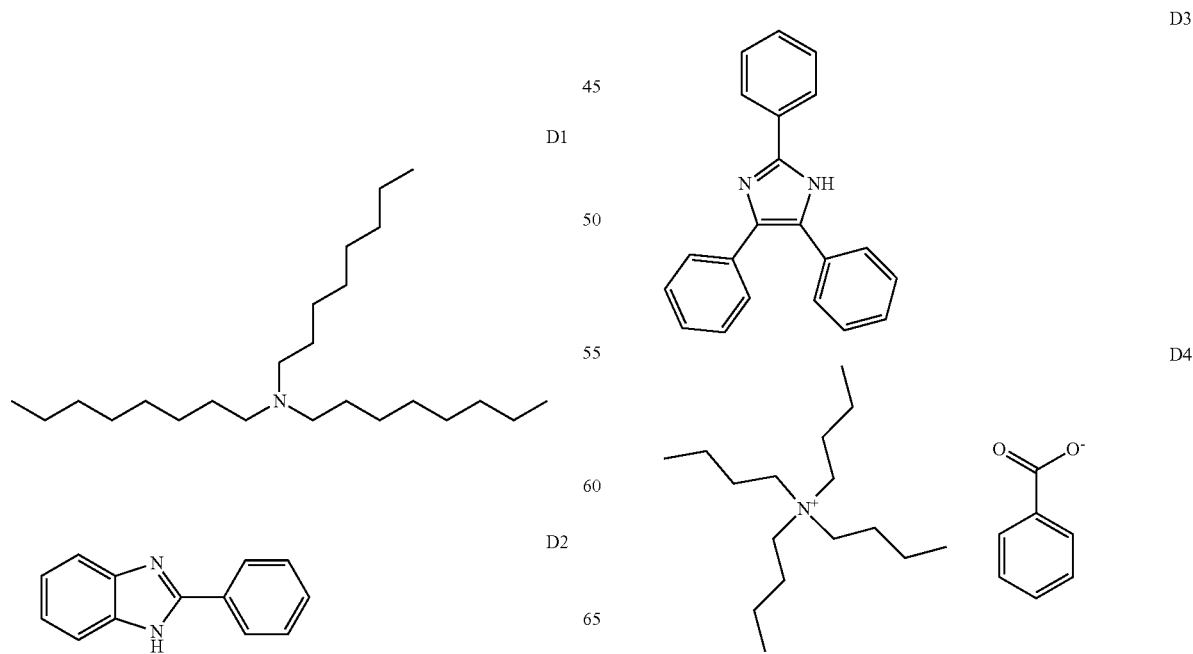

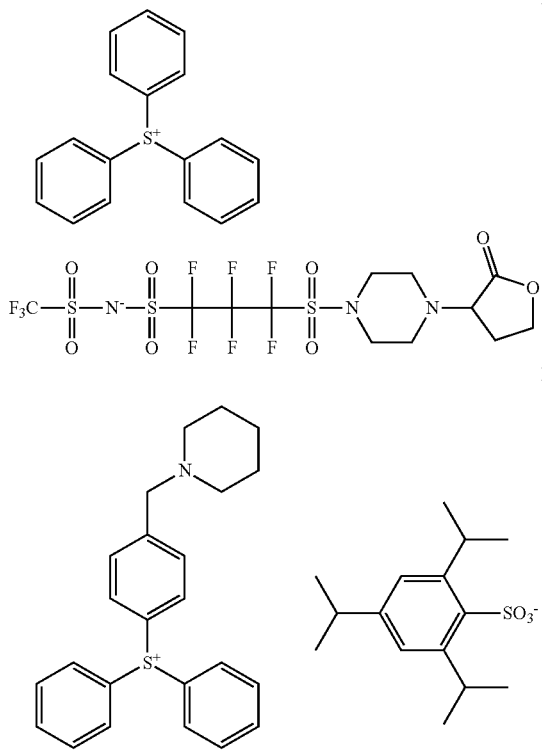

The following tables show the acid diffusion control agents used for the respective resist compositions.

The numerical values in the table indicate the content (mmol) of each acid diffusion control agent in 1 g of the solid content of the resist composition.

TABLE 16

| Table 4-1 | Acid diffusion control agent (mmol/g) | | | | | |
|---|---|---|---|---|---|---|
| | D1 | D2 | D3 | D4 | D5 | D6 |
| Composition 1 | | | 0.04 | | | |
| Composition 2 | | | 0.16 | | | |
| Composition 3 | | | 0.12 | | | |
| Composition 4 | | 0.12 | | | | |
| Composition 5 | | | 0.12 | | | 0.12 |
| Composition 6 | | | 0.12 | | | |
| Composition 7 | | | | 0.12 | | |
| Composition 8 | 0.16 | | | | | |
| Composition 9 | | | 0.16 | | | |
| Composition 10 | | | | 0.12 | | |
| Composition 11 | | | | 0.12 | | |
| Composition 12 | | | | 0.12 | | |
| Composition 13 | | | | 0.16 | | |
| Composition 14 | | | | 0.16 | | |
| Composition 15 | | | | 0.16 | | |
| Composition 16 | | | | 0.16 | | |
| Composition 17 | | | | | | 0.12 |
| Composition 18 | | | | 0.12 | | |
| Composition 19 | 0.16 | | | | | |
| Composition 20 | | 0.12 | | | | |
| Composition 21 | | | | 0.12 | | |
| Composition 22 | 0.12 | | | | | |
| Composition 23 | | | 0.015 | | | |
| Composition 24 | | | 0.16 | | | |
| Composition 25 | | | 0.16 | | | |
| Composition 26 | 0.2 | | | | | |
| Composition 27 | 0.12 | | | | | |
| Composition 28 | | | 0.12 | | | |
| Composition 29 | | | 0.12 | | | |

TABLE 16-continued

| Table 4-1 | Acid diffusion control agent (mmol/g) | | | | | |
|---|---|---|---|---|---|---|
| | D1 | D2 | D3 | D4 | D5 | D6 |
| Composition 30 | | | | | | 0.12 |
| Composition 31 | | 0.12 | | | | 0.12 |
| Composition 32 | | | | | | 0.2 |
| Composition 33 | | | | | 0.12 | |
| Composition 34 | | 0.12 | | | | |
| Composition 35 | 0.08 | | | | | |
| Composition 36 | | 0.12 | | | | |
| Composition 37 | | | 0.12 | | | |
| Composition 38 | | | 0.16 | | | |
| Composition 39 | 0.08 | | | | 0.08 | |
| Composition 40 | 0.08 | | | | | |
| Composition 41 | | | 0.16 | | | |
| Composition 42 | | | | | | 0.12 |
| Composition 43 | | | 0.16 | | | |
| Composition 44 | | | 0.12 | | | |
| Composition 45 | | | 0.16 | | | |
| Composition 46 | | 0.1 | | | | 0.1 |
| Composition 47 | | | 0.16 | | | |
| Composition 48 | | | | | 0.12 | |
| Composition 49 | | | | 0.12 | | |
| Composition 50 | | 0.12 | | | | |

TABLE 17

| Table 4-2 | Acid diffusion control agent (mmol/g) | | | | | |
|---|---|---|---|---|---|---|
| | D1 | D2 | D3 | D4 | D5 | D6 |
| Composition 51 | | | 0.16 | | | |
| Composition 52 | | | | | | 0.12 |
| Composition 53 | | | | | 0.12 | |
| Composition 54 | | | | | | 0.12 |
| Composition 55 | | | | | | 0.16 |
| Composition 56 | | | 0.16 | | | |
| Composition 57 | | | | | | 0.08 |
| Composition 58 | | | | | | 0.16 |
| Composition 59 | | | | | | 0.16 |
| Composition 60 | | 0.16 | | | | |
| Composition 61 | | | | | | 0.16 |
| Composition 62 | 0.16 | | | | | |
| Composition 63 | | 0.16 | | | | |
| Composition 64 | | | 0.12 | | | |
| Composition 65 | | | | | | 0.24 |
| Composition 66 | | 0.16 | | | | |
| Composition 67 | | | | 0.16 | | |
| Composition 68 | | 0.12 | | | | |
| Composition 69 | | | | | | 0.16 |
| Composition 70 | | | | 0.18 | | |
| Composition 71 | | | | 0.12 | | |
| Composition 72 | 0.16 | | | | | |
| Composition 73 | | | | 0.16 | | |
| Composition 74 | | | | 0.14 | | |
| Composition 75 | | 0.12 | | | | |
| Composition 76 | | | | 0.36 | | |
| Composition 77 | | | | | | 0.12 |
| Composition 78 | | 0.12 | | | | |
| Composition 79 | | | 0.08 | | | |
| Composition 80 | | | | | 0.12 | |
| Composition 81 | | | | 0.12 | | |
| Composition 82 | | | | 0.12 | | |
| Composition 83 | | | 0.16 | | | |
| Composition 84 | | | | | | 0.16 |
| Composition 85 | 0.12 | | | | | |
| Composition 86 | | | | | 0.12 | |
| Composition 87 | | | | | 0.12 | |
| Composition 88 | 0.16 | | | | | |
| Composition 89 | 0.12 | | | | | |
| Composition 90 | | | 0.08 | | | |
| Composition 91 | | | 0.08 | | | |
| Composition 92 | | | 0.08 | | | |
| Composition 93 | | | | | | 0.12 |
| Composition 94 | | | | | | 0.12 |
| Composition 95 | | | | | | 0.12 |

TABLE 17-continued

| Table 4-2 | Acid diffusion control agent (mmol/g) | | | | | |
|---|---|---|---|---|---|---|
| | D1 | D2 | D3 | D4 | D5 | D6 |
| Composition 96 | 0.12 | | | | | |
| Composition 97 | | | | 0.12 | | |

<Solvent>

As the solvent, a mixed solvent consisting of propylene glycol monomethyl ether acetate (PGMEA), propylene glycol monomethyl ether (PGME), and ethyl lactate (EL) was used. A mixing ratio of the mixed solvents was PGMEA/PGME/EL=490/490/1,470 (mass ratio).

<Preparation of Resist Composition>

The above-mentioned components were mixed so as to meet the solid content (the resin, the photoacid generator, and the acid diffusion control agent) shown in Table 5 below and the concentration of the solid content, and the mixture was filtered through a polyethylene filter having a pore size of 0.03 μm to prepare each of resist compositions.

[Evaluation]

The obtained resist composition was evaluated by the following method.

<Pattern Formation>

AL412 (manufactured by Brewer Science Ltd.) was spin-applied onto a 12-inch silicon wafer and heated at 200° C. for 60 seconds to form an underlayer film having a film thickness of 20 nm. Each of the resist compositions was applied thereonto so as to obtain a resist film having a film thickness described in the following table, and heated at 100° C. for 60 seconds (PB: prebaked) to form a resist film.

The obtained resist film was exposed through a reflective mask using an EUV exposure machine (manufactured by ASML; NXE3350, NA 0.33, Dipole 90°, outer sigma 0.87, inner sigma 0.35).

The resist film after exposure was heated at 90° C. for 60 seconds (PEB: post-exposure baked). Then, the resist film was developed for 30 seconds with a negative developer (butyl acetate). Thereafter, the silicon wafer was rotated for 30 seconds at a rotation speed of 4,000 rpm and dried to obtain a pattern of isolated dots in dimension of x26y26 nm with a pitch width of 90 nm.

<Missing Defect Suppressing Property>

Using the obtained x26y26 nm dot pattern, a defect distribution was confirmed using a defect inspection apparatus (2959 (manufactured by KLA-Tencor Corporation)). Next, the number of missing defects per silicon wafer was measured using a scanning electron microscope (eDR7110 (manufactured by KLA-Tencor Corporation)), and the missing defect suppressing property was evaluated based on this measured value. In a case where the number as a measured value is less than 20, the missing defect suppressing property can be evaluated to be good; in a case where the number as the measured value is from 20 to 50, the missing defect suppressing property can be evaluated to be slightly good; and in a case where the number of as the measured value is more than 50, the missing defect suppressing property can be evaluated to be poor.

<Pattern Collapse Suppressing Property>

A pattern was formed in the same manner as in <Pattern Formation> described above, except that the exposure was performed at various exposure doses, to obtain a pattern having a dot diameter according to the exposure dose.

The dot diameter of the obtained dot pattern was measured. In this case, the minimum dot diameter at which the pattern was resolved with no collapse over a 5 μm-square area was defined as a collapse dot diameter, and the pattern collapse suppressing property was evaluated. A smaller value thereof indicates a wide margin of the pattern collapse and a good pattern collapse suppressing property.

[Results]

The formulation of the resist composition and the test results are shown in the following tables.

In the tables, the column of "Content (% by mass)" means the content (% by mass) of each component with respect to the total solid content of the resist composition.

The column of "Content (mmol/g)" means the content (mmol/g) of each component of the photoacid generator or the acid diffusion control agent with respect to 1 g of the solid content of the resist composition.

The column of "Protection rate" means the content (% by mass) of the repeating unit having a protective group in the resin.

The column of "F number of protective group" indicates the number of fluorine atoms in a case where the protective group has the fluorine atoms. Further, in a case where two types of numbers are described, there are two types of protective groups having fluorine atoms, and each number indicates the number of fluorine atoms contained in each protective group.

In the table, the column of "ClogP after deprotection" shows the ClogP value of the resin after elimination of the protective group from the resin used in the resist composition.

The column "P/Q" means the ratio of the content of the photoacid generator to the content of the acid diffusion control agent in the resist composition (photoacid generator/acid diffusion control agent (molar ratio)).

The column "y" shows the value of y of the resist composition. The method of obtaining the value of y is as described above.

The column of "x" shows the value of x of the resist composition. The method of obtaining the value of x is as described above.

The column of "Expression (3x)" describes a value given by "y+x−1.5 Expression (3x)", which is a modification of Expression (3). In a case where the value of Expression (1x) is 0 or more, the resist composition satisfies the relationship of Expression (3).

The column of "Expression (4x)" describes a value given by "y+0.75x−1.4 Expression (4x)", which is a modification of Expression (4). In a case where the value of Expression (4x) is 0 or more, the resist composition satisfies the relationship of Expression (4).

The column of "Expression (5x)" describes a value given by "y+0.66x−1.4 Expression (5x)", which is a modification of Expression (5). In a case where the value of Expression (5x) is 0 or more, the resist composition satisfies the relationship of Expression (5).

The column of "Film thickness after PB" shows a film thickness (nm) of the resist film which has been subjected to PB (prebaking).

The column of "Film thickness after PEB" indicates a film thickness (nm) of the resist film after PEB (Post-exposure baking).

Furthermore, "Film thickness after PB" and "Film thickness after PEB" were measured using a film thickness measuring apparatus (SCD 100 (manufactured by KLA-Tencor Corporation)). In addition, in the measurement of the film thickness after PEB, first, a resist film was manufactured by performing the treatments up to PEB by the same method, except that the entire surface was exposed while not using a mask. The measured value of the film thickness of this resist film was used as the film thickness after PEB in each of Examples or Comparative Examples.

TABLE 18

| Table 5-1 | | Characteristics of resist composition | | | | | | | | | | | | | | | Evaluation | | |
|---|---|---|---|---|---|---|---|---|---|---|---|---|---|---|---|---|---|---|---|
| | | Resin | | | Amount of Photoacid generator | | Acid diffusion control agent | | Solid content (% by mass) | P/Q | y | x | Expression (3x) | Expression (4x) | Expression (5x) | Resist film | | Pattern collapse (nm) | Missing defects (number of defects) |
| | | Content (% by mass) | Protection rate (% by mass) | F number of protective group | ClogP after deprotection | Content (% by mass) | Content (mmol/g) | Content (% by mass) | Content (mmol/g) | | | | | | | | Initial film thickness (nm) | Film thickness after PEB (nm) | | |
| Example 1 | Composition 1 | 93.1 | 80 | 3 | 0.64 | 5.7 | 0.10 | 1.2 | 0.04 | 2.0 | 2.5 | 0.49 | 1.44 | 0.44 | 0.18 | 0.05 | 50 | 25 | 17.3 | 20 |
| Example 2 | Composition 2 | 71.5 | 80 | 3 | 0.50 | 22.7 | 0.40 | 5.8 | 0.16 | 2.0 | 2.5 | 0.39 | 1.31 | 0.20 | -0.03 | -0.15 | 50 | 31 | 14.9 | 42 |
| Example 3 | Composition 3 | 79.7 | 45 | — | 1.32 | 16.7 | 0.30 | 3.6 | 0.12 | 2.0 | 2.5 | 0.24 | 1.28 | 0.02 | -0.20 | -0.31 | 50 | 38 | 18.1 | 47 |
| Example 4 | Composition 4 | 80.8 | 50 | 3 | 0.35 | 16.9 | 0.30 | 2.3 | 0.12 | 2.0 | 2.5 | 0.29 | 1.36 | 0.14 | -0.09 | -0.22 | 50 | 36 | 17.4 | 46 |
| Example 5 | Composition 5 | 60.7 | 75 | 3 | 0.97 | 28.0 | 0.60 | 11.3 | 0.24 | 2.0 | 2.5 | 0.30 | 1.22 | 0.03 | -0.18 | -0.29 | 50 | 35 | 14.7 | 43 |
| Example 6 | Composition 6 | 78.7 | 70 | 3 | 0.61 | 17.8 | 0.30 | 3.6 | 0.12 | 2.0 | 2.5 | 0.39 | 1.37 | 0.26 | 0.02 | -0.10 | 50 | 30 | 15.4 | 30 |
| Example 7 | Composition 7 | 74.8 | 40 | 6 | -0.18 | 14.9 | 0.30 | 10.3 | 0.12 | 2.0 | 2.5 | 0.22 | 1.40 | 0.11 | -0.14 | -0.26 | 50 | 39 | 17.4 | 48 |
| Example 8 | Composition 8 | 66.8 | 80 | 6 | 0.11 | 27.5 | 0.40 | 5.7 | 0.16 | 2.0 | 2.5 | 0.35 | 1.58 | 0.42 | 0.13 | -0.01 | 50 | 33 | 15.3 | 27 |
| Example 9 | Composition 9 | 72.3 | 85 | 6 | 0.80 | 22.9 | 0.40 | 4.7 | 0.12 | 2.2 | 2.5 | 0.46 | 1.43 | 0.38 | 0.13 | 0.00 | 55 | 30 | 14.5 | 12 |
| Example 10 | Composition 10 | 67.1 | 80 | 6 | 0.43 | 22.6 | 0.30 | 10.3 | 0.12 | 2.0 | 2.5 | 0.39 | 1.56 | 0.45 | 0.16 | 0.02 | 50 | 31 | 14.9 | 20 |
| Example 11 | Composition 11 | 73.6 | 50 | 3 | 1.33 | 22.0 | 0.30 | 4.4 | 0.16 | 2.0 | 2.5 | 0.23 | 1.45 | 0.18 | -0.08 | -0.21 | 50 | 38 | 16.6 | 47 |
| Example 12 | Composition 12 | 73.6 | 80 | 6 | -0.25 | 22.0 | 0.30 | 4.4 | 0.12 | 2.0 | 2.5 | 0.41 | 1.57 | 0.48 | 0.18 | 0.04 | 50 | 29 | 15.2 | 18 |
| Example 13 | Composition 13 | 75.4 | 80 | 6 | -0.34 | 18.8 | 0.40 | 5.8 | 0.16 | 2.0 | 2.5 | 0.33 | 1.29 | 0.12 | -0.10 | -0.22 | 50 | 34 | 15.2 | 41 |
| Example 14 | Composition 14 | 66.5 | 50 | 6 | -0.11 | 19.7 | 0.40 | 13.7 | 0.16 | 2.0 | 2.5 | 0.23 | 1.44 | 0.18 | -0.09 | -0.22 | 50 | 38 | 16.9 | 41 |
| Example 15 | Composition 15 | 69.5 | 70 | 6 | 0.96 | 24.7 | 0.40 | 5.8 | 0.16 | 2.0 | 2.5 | 0.38 | 1.29 | 0.17 | -0.05 | -0.17 | 50 | 31 | 15.0 | 42 |
| Example 16 | Composition 16 | 69.6 | 55 | — | 1.25 | 24.6 | 0.40 | 5.8 | 0.16 | 2.0 | 2.5 | 0.25 | 1.31 | 0.06 | -0.17 | -0.29 | 50 | 38 | 16.9 | 42 |
| Example 17 | Composition 17 | 74.7 | 60 | 6 | 0.41 | 17.6 | 0.30 | 7.7 | 0.12 | 2.0 | 2.5 | 0.32 | 1.46 | 0.29 | 0.02 | -0.11 | 50 | 34 | 14.6 | 31 |
| Example 18 | Composition 18 | 71.9 | 80 | 3 | 0.63 | 17.8 | 0.30 | 10.3 | 0.12 | 2.0 | 2.5 | 0.38 | 1.43 | 0.31 | 0.05 | -0.08 | 50 | 31 | 15.2 | 31 |
| Example 19 | Composition 19 | 66.0 | 45 | 6 | 1.26 | 28.3 | 0.40 | 5.7 | 0.16 | 2.0 | 2.5 | 0.21 | 1.31 | 0.03 | -0.20 | -0.32 | 50 | 39 | 17.3 | 41 |
| Example 20 | Composition 20 | 81.0 | 50 | 6 | 0.54 | 16.7 | 0.30 | 2.3 | 0.12 | 2.0 | 2.5 | 0.30 | 1.42 | 0.22 | -0.03 | -0.16 | 50 | 35 | 15.0 | 47 |

TABLE 18-continued

| Table 5-1 | | Resin | | | | Amount of Photoacid generator | | Acid diffusion control agent | | Solid content (% by mass) | P/Q | y | x | Expression (3x) | Expression (4x) | Expression (5x) | Resist film | | Evaluation | |
|---|---|---|---|---|---|---|---|---|---|---|---|---|---|---|---|---|---|---|---|---|
| | | Content (% by mass) | Protection rate (% by mass) | F number | ClogP after deprotection | Content (% by mass) | Content (mmol/g) | Content (% by mass) | Content (mmol/g) | | | | | | | | Initial film thickness (nm) | Film thickness after PEB (nm) | Pattern collapse (nm) | Missing defects (number of defects) |
| | | | | of protective group | | | | | | | | | | | | | | | | |
| Example 21 | Composition 21 | 70.5 | 55 | 6 | 1.30 | 19.3 | 0.30 | 10.3 | 0.12 | 2.0 | 2.5 | 0.25 | 1.40 | 0.15 | -0.10 | -0.23 | 50 | 37 | 17.8 | 46 |
| Example 22 | Composition 22 | 70.8 | 50 | 6 | 0.94 | 24.9 | 0.30 | 4.2 | 0.12 | 2.0 | 2.5 | 0.26 | 1.34 | 0.10 | -0.14 | -0.26 | 50 | 37 | 18.4 | 48 |
| Example 23 | Composition 23 | 91.0 | 60 | 6 | 1.38 | 8.6 | 0.20 | 0.4 | 0.015 | 2.0 | 13.3 | 0.43 | 1.40 | 0.33 | 0.08 | -0.05 | 50 | 29 | 16.3 | 30 |
| Example 24 | Composition 24 | 72.8 | 50 | 6 | -0.24 | 21.4 | 0.40 | 5.8 | 0.16 | 2.0 | 2.5 | 0.26 | 1.37 | 0.13 | -0.11 | -0.23 | 50 | 37 | 16.9 | 44 |
| Example 25 | Composition 25 | 72.3 | 85 | 6 | 0.80 | 22.9 | 0.40 | 4.7 | 0.16 | 2.0 | 2.5 | 0.46 | 1.43 | 0.38 | 0.13 | 0.00 | 50 | 27 | 15.1 | 16 |
| Example 26 | Composition 26 | 65.1 | 40 | 6 | 0.72 | 27.8 | 0.50 | 7.1 | 0.2 | 2.0 | 2.5 | 0.19 | 1.34 | 0.04 | -0.20 | -0.32 | 50 | 40 | 17.2 | 41 |
| Example 27 | Composition 27 | 75.2 | 70 | 3 | 0.65 | 20.6 | 0.30 | 4.2 | 0.12 | 2.0 | 2.5 | 0.36 | 1.45 | 0.30 | 0.04 | -0.09 | 50 | 32 | 14.9 | 31 |
| Example 28 | Composition 28 | 74.4 | 80 | 3 | 0.51 | 22.0 | 0.30 | 3.6 | 0.12 | 2.0 | 2.5 | 0.40 | 1.23 | 0.13 | -0.08 | -0.19 | 50 | 30 | 15.1 | 46 |
| Example 29 | Composition 29 | 75.7 | 80 | 6 | -0.03 | 20.8 | 0.30 | 3.6 | 0.12 | 2.0 | 2.5 | 0.44 | 1.54 | 0.48 | 0.19 | 0.05 | 50 | 28 | 14.6 | 19 |
| Example 30 | Composition 30 | 67.0 | 40 | 6 | -0.17 | 25.2 | 0.30 | 7.7 | 0.12 | 2.0 | 2.5 | 0.19 | 1.41 | 0.10 | -0.16 | -0.28 | 50 | 41 | 17.1 | 46 |
| Example 31 | Composition 31 | 67.9 | 60 | 6 | 0.42 | 22.0 | 0.30 | 10.1 | 0.24 | 2.0 | 1.3 | 0.28 | 1.50 | 0.29 | 0.01 | -0.12 | 50 | 36 | 14.6 | 30 |
| Example 32 | Composition 32 | 74.2 | 60 | 6 | 1.38 | 12.9 | 0.30 | 12.9 | 0.2 | 2.0 | 1.5 | 0.35 | 1.37 | 0.21 | -0.03 | -0.15 | 50 | 33 | 16.0 | 48 |
| Example 33 | Composition 33 | 72.8 | 70 | 6 | 0.77 | 16.9 | 0.30 | 10.3 | 0.12 | 2.0 | 2.5 | 0.38 | 1.56 | 0.43 | 0.14 | 0.00 | 50 | 31 | 14.6 | 19 |
| Example 34 | Composition 34 | 78.5 | 50 | 11 | 0.72 | 19.2 | 0.30 | 2.3 | 0.12 | 2.0 | 2.5 | 0.29 | 1.57 | 0.36 | 0.07 | -0.07 | 50 | 35 | 17.9 | 30 |
| Example 35 | Composition 35 | 82.5 | 80 | 3 | 0.84 | 14.7 | 0.20 | 2.8 | 0.08 | 2.0 | 2.5 | 0.47 | 1.45 | 0.42 | 0.16 | 0.03 | 50 | 27 | 14.9 | 16 |

TABLE 19

| | | Characteristics of resist composition | | | | | | | | | | | | | | | | Evaluation | |
|---|---|---|---|---|---|---|---|---|---|---|---|---|---|---|---|---|---|---|---|
| | | Resin | | | | Amount of Photoacid generator | | Acid diffusion control agent | | Solid content (% by mass) | | | | | | Resist film | | Pattern collapse (nm) | Missing defects (number of defects) |
| | | Content (% by mass) | Protection rate (% by mass) | F number of protective group | ClogP after deprotection | Content (% by mass) | Content (mmol/g) | Content (% by mass) | Content (mmol/g) | | P/Q | y | x | Expression (3x) | Expression (4x) | Expression (5x) | Initial film thickness (nm) | Film thickness after PEB (nm) | | |
| Example 36 | Composition 36 | 81.0 | 60 | 3 | 1.23 | 16.7 | 0.30 | 2.3 | 0.12 | 2.0 | 2.5 | 0.33 | 1.45 | 0.28 | 0.02 | −0.11 | 50 | 34 | 15.4 | 30 |
| Example 37 | Composition 37 | 78.8 | 60 | 6 | 0.46 | 17.6 | 0.30 | 3.6 | 0.12 | 2.0 | 2.5 | 0.34 | 1.49 | 0.33 | 0.06 | −0.08 | 50 | 33 | 14.8 | 32 |
| Example 38 | Composition 38 | 73.1 | 70 | 6 | 0.83 | 22.2 | 0.40 | 4.7 | 0.16 | 2.0 | 2.5 | 0.37 | 1.53 | 0.40 | 0.12 | −0.02 | 50 | 32 | 14.6 | 27 |
| Example 39 | Composition 39 | 66.1 | 50 | 6 | 0.39 | 24.2 | 0.40 | 9.7 | 0.16 | 2.0 | 2.5 | 0.24 | 1.41 | 0.16 | −0.10 | −0.22 | 50 | 38 | 17.3 | 43 |
| Example 40 | Composition 40 | 82.5 | 80 | 3 | 0.84 | 14.7 | 0.20 | 2.8 | 0.08 | 2.0 | 2.5 | 0.47 | 1.45 | 0.42 | 0.16 | 0.03 | 50 | 27 | 14.8 | 18 |
| Example 41 | Composition 41 | 72.3 | 85 | 6 | 0.80 | 22.9 | 0.40 | 4.7 | 0.16 | 2.3 | 2.5 | 0.46 | 1.43 | 0.38 | 0.13 | 0.00 | 60 | 32 | 14.6 | 10 |
| Example 42 | Composition 42 | 75.4 | 60 | 3 | 1.30 | 16.9 | 0.30 | 7.7 | 0.12 | 2.0 | 2.5 | 0.29 | 1.40 | 0.19 | −0.06 | −0.19 | 50 | 36 | 15.9 | 48 |
| Example 43 | Composition 43 | 73.7 | 45 | — | 1.38 | 21.6 | 0.40 | 4.7 | 0.16 | 2.0 | 2.5 | 0.22 | 1.32 | 0.03 | −0.20 | −0.32 | 50 | 39 | 17.5 | 40 |
| Example 44 | Composition 44 | 79.6 | 80 | 3 | 0.42 | 16.9 | 0.30 | 3.6 | 0.12 | 2.0 | 2.5 | 0.40 | 1.44 | 0.34 | 0.08 | −0.05 | 50 | 30 | 14.7 | 30 |
| Example 45 | Composition 45 | 73.2 | 80 | 6 | 0.67 | 22.0 | 0.40 | 4.7 | 0.16 | 2.0 | 2.5 | 0.42 | 1.50 | 0.42 | 0.15 | 0.01 | 50 | 29 | 15.4 | 16 |
| Example 46 | Composition 46 | 61.7 | 48 | 6 | 0.46 | 30.0 | 0.50 | 8.4 | 0.2 | 2.0 | 2.5 | 0.22 | 1.30 | 0.02 | −0.20 | −0.32 | 50 | 39 | 16.8 | 40 |
| Example 47 | Composition 47 | 73.2 | 80 | 6 | −0.47 | 22.0 | 0.40 | 4.7 | 0.16 | 2.0 | 2.5 | 0.38 | 1.59 | 0.47 | 0.17 | 0.03 | 50 | 31 | 14.6 | 16 |
| Example 48 | Composition 48 | 67.9 | 50 | 3 | 0.63 | 21.8 | 0.30 | 10.3 | 0.12 | 2.0 | 2.5 | 0.23 | 1.42 | 0.15 | −0.10 | −0.23 | 50 | 39 | 16.8 | 48 |
| Example 49 | Composition 49 | 73.6 | 70 | 6 | 0.24 | 22.0 | 0.30 | 4.4 | 0.12 | 2.0 | 2.5 | 0.37 | 1.48 | 0.35 | 0.08 | −0.05 | 50 | 31 | 14.7 | 32 |
| Example 50 | Composition 50 | 74.7 | 80 | 6 | 0.95 | 23.0 | 0.30 | 2.3 | 0.12 | 2.0 | 2.5 | 0.44 | 1.49 | 0.43 | 0.16 | 0.03 | 50 | 28 | 15.3 | 19 |
| Example 51 | Composition 51 | 71.4 | 60 | 6 | −0.23 | 22.7 | 0.40 | 5.8 | 0.16 | 2.0 | 2.5 | 0.28 | 1.47 | 0.25 | −0.02 | −0.15 | 50 | 36 | 15.5 | 41 |
| Example 52 | Composition 52 | 73.0 | 60 | 6 | 0.33 | 19.3 | 0.30 | 7.7 | 0.12 | 2.0 | 2.5 | 0.32 | 1.44 | 0.26 | 0.00 | −0.13 | 50 | 34 | 14.6 | 47 |
| Example 53 | Composition 53 | 72.9 | 80 | 6 | 0.63 | 16.8 | 0.30 | 10.3 | 0.12 | 2.0 | 2.5 | 0.37 | 1.58 | 0.45 | 0.16 | 0.01 | 50 | 32 | 14.9 | 20 |
| Example 54 | Composition 54 | 70.2 | 50 | 3 | 1.03 | 22.0 | 0.30 | 7.7 | 0.12 | 2.0 | 2.5 | 0.23 | 1.36 | 0.09 | −0.15 | −0.27 | 50 | 38 | 17.1 | 48 |
| Example 55 | Composition 55 | 65.6 | 80 | 6 | 0.65 | 24.1 | 0.40 | 10.3 | 0.16 | 2.2 | 2.5 | 0.39 | 1.34 | 0.23 | 0.00 | −0.12 | 55 | 33 | 15.0 | 34 |

TABLE 19-continued

| | | Characteristics of resist composition | | | | | | | | | | | | | | | Evaluation | | |
|---|---|---|---|---|---|---|---|---|---|---|---|---|---|---|---|---|---|---|---|
| | | Resin | | | | Amount of Photoacid generator | | | Acid diffusion control agent | | Solid content (% by mass) | P/Q | y | x | Expression (3x) | Expression (4x) | Expression (5x) | Resist film | | Pattern collapse (nm) | Missing defects (number of defects) |
| | | Content (% by mass) | Protection rate (% by mass) | F number of protective group | ClogP after deprotection | Content (% by mass) | Content (mmol/g) | Content (% by mass) | Content (mmol/g) | | | | | | | | | Initial film thickness (nm) | Film thickness after PEB (nm) | | |
| Example 56 | Composition 56 | 71.9 | 50 | 3 | 1.39 | 22.3 | 0.40 | 5.8 | 0.16 | 2.0 | 2.5 | 0.18 | 1.45 | 0.13 | -0.13 | -0.26 | 50 | 41 | 17.4 | 41 |
| Example 57 | Composition 57 | 80.2 | 70 | 6 | 0.80 | 14.7 | 0.20 | 5.2 | 0.08 | 2.0 | 2.5 | 0.42 | 1.45 | 0.37 | 0.10 | -0.03 | 50 | 29 | 14.9 | 32 |
| Example 58 | Composition 58 | 65.6 | 80 | 6 | 0.89 | 24.1 | 0.40 | 10.3 | 0.16 | 2.0 | 2.5 | 0.41 | 1.29 | 0.20 | -0.03 | -0.14 | 50 | 29 | 15.1 | 43 |
| Example 59 | Composition 59 | 72.5 | 60 | 6 | 1.38 | 17.2 | 0.40 | 10.3 | 0.16 | 2.0 | 2.5 | 0.34 | 1.40 | 0.24 | -0.01 | -0.13 | 50 | 33 | 15.1 | 40 |
| Example 60 | Composition 60 | 75.3 | 50 | 6 | -0.36 | 21.6 | 0.40 | 3.1 | 0.16 | 2.0 | 2.5 | 0.25 | 1.43 | 0.18 | -0.08 | -0.21 | 50 | 38 | 17.0 | 43 |
| Example 61 | Composition 61 | 65.6 | 80 | 6 | 0.65 | 24.1 | 0.40 | 10.3 | 0.16 | 2.0 | 2.5 | 0.39 | 1.34 | 0.23 | 0.00 | -0.12 | 50 | 30 | 15.3 | 43 |
| Example 62 | Composition 62 | 61.1 | 45 | 6/3 | 1.35 | 33.2 | 0.40 | 5.7 | 0.16 | 2.0 | 2.5 | 0.20 | 1.30 | 0.00 | -0.22 | -0.34 | 50 | 40 | 17.1 | 43 |
| Example 63 | Composition 63 | 74.1 | 70 | 6 | 1.39 | 22.7 | 0.40 | 3.1 | 0.16 | 2.0 | 2.5 | 0.32 | 1.41 | 0.23 | -0.02 | -0.15 | 50 | 34 | 15.3 | 43 |
| Example 64 | Composition 64 | 78.8 | 70 | 3 | 0.96 | 17.6 | 0.30 | 3.6 | 0.12 | 2.0 | 2.5 | 0.35 | 1.31 | 0.16 | -0.07 | -0.18 | 50 | 33 | 14.7 | 48 |
| Example 65 | Composition 65 | 71.6 | 60 | 6 | 1.38 | 12.9 | 0.30 | 15.5 | 0.24 | 2.0 | 1.3 | 0.34 | 1.35 | 0.19 | -0.05 | -0.17 | 50 | 33 | 17.2 | 47 |
| Example 66 | Composition 66 | 71.2 | 70 | 3 | 0.51 | 25.7 | 0.40 | 3.1 | 0.16 | 2.0 | 2.5 | 0.33 | 1.30 | 0.13 | -0.10 | -0.21 | 50 | 34 | 15.5 | 40 |
| Example 67 | Composition 67 | 65.1 | 70 | 6 | 0.77 | 29.1 | 0.40 | 5.8 | 0.16 | 2.0 | 2.5 | 0.30 | 1.76 | 0.55 | 0.21 | 0.06 | 50 | 35 | 15.1 | 16 |
| Example 68 | Composition 68 | 72.7 | 60 | 3 | 0.30 | 24.9 | 0.30 | 2.3 | 0.12 | 2.0 | 2.5 | 0.31 | 1.33 | 0.14 | -0.09 | -0.21 | 50 | 35 | 14.9 | 46 |
| Example 69 | Composition 69 | 65.6 | 80 | 6 | 0.89 | 24.1 | 0.40 | 10.3 | 0.16 | 2.2 | 2.5 | 0.41 | 1.29 | 0.20 | -0.03 | -0.14 | 55 | 32 | 14.9 | 36 |
| Example 70 | Composition 70 | 68.3 | 90 | 3/6 | -0.03 | 26.4 | 0.45 | 5.3 | 0.18 | 2.0 | 2.5 | 0.42 | 1.49 | 0.41 | 0.14 | 0.00 | 50 | 29 | 16.7 | 20 |

TABLE 20

| | | Characteristics of resist composition | | | | | | | | | | | | | | | Evaluation | |
|---|---|---|---|---|---|---|---|---|---|---|---|---|---|---|---|---|---|---|
| | | Resin | | | Amount of Photoacid generator | | Acid diffusion control agent | | Solid content (% by mass) | P/Q | y | x | Expression (3x) | Expression (4x) | Expression (5x) | Resist film | | Pattern collapse (nm) | Missing defects (number of defects) |
| Table 5-3 | | Content (% by mass) | Protection rate (% by mass) | F number of protective group | ClogP after deprotection | Content (% by mass) | Content (mmol/g) | Content (% by mass) | Content (mmol/g) | | | | | | | | Initial film thickness (nm) | Film thickness after PEB (nm) | | |
| Example 71 | Composition 71 | 78.6 | 60 | 6 | 0.49 | 17.1 | 0.30 | 4.4 | 0.12 | 2.0 | 2.5 | 0.35 | 1.45 | 0.30 | 0.04 | -0.09 | 50 | 32 | 15.5 | 32 |
| Example 72 | Composition 72 | 64.9 | 40 | 6 | 0.23 | 29.4 | 0.40 | 5.7 | 0.16 | 2.0 | 2.5 | 0.17 | 1.37 | 0.04 | -0.20 | -0.33 | 50 | 42 | 16.6 | 41 |
| Example 73 | Composition 73 | 75.4 | 80 | — | -0.21 | 18.8 | 0.40 | 5.8 | 0.16 | 1.3 | 2.5 | 0.14 | 1.38 | 0.02 | -0.22 | -0.35 | 30 | 26 | 14.6 | 48 |
| Example 74 | Composition 74 | 73.7 | 90 | 3/6 | -0.03 | 22.1 | 0.35 | 4.1 | 0.14 | 2.0 | 2.5 | 0.45 | 1.49 | 0.45 | 0.17 | 0.04 | 50 | 27 | 16.4 | 18 |
| Example 75 | Composition 75 | 81.5 | 70 | 6 | -0.22 | 16.2 | 0.30 | 2.3 | 0.12 | 2.0 | 2.5 | 0.40 | 1.50 | 0.40 | 0.13 | -0.01 | 50 | 30 | 15.2 | 31 |
| Example 76 | Composition 76 | 64.9 | 50 | 3 | 1.33 | 22.0 | 0.30 | 13.1 | 0.36 | 2.0 | 0.8 | 0.21 | 1.40 | 0.10 | -0.15 | -0.27 | 50 | 40 | 17.6 | 47 |
| Example 77 | Composition 77 | 74.7 | 60 | 3 | 0.75 | 17.6 | 0.30 | 7.7 | 0.12 | 2.0 | 2.5 | 0.30 | 1.32 | 0.12 | -0.11 | -0.23 | 50 | 35 | 15.5 | 47 |
| Example 78 | Composition 78 | 70.6 | 80 | 3 | 0.26 | 27.0 | 0.30 | 2.3 | 0.12 | 2.0 | 2.5 | 0.37 | 1.32 | 0.19 | -0.04 | -0.16 | 50 | 31 | 14.6 | 46 |
| Example 79 | Composition 79 | 86.3 | 85 | 3 | 0.70 | 11.4 | 0.20 | 2.4 | 0.08 | 2.0 | 2.5 | 0.48 | 1.42 | 0.41 | 0.15 | 0.03 | 50 | 26 | 15.9 | 18 |
| Example 80 | Composition 80 | 73.1 | 90 | 3/6 | 0.05 | 16.6 | 0.30 | 10.3 | 0.12 | 2.0 | 2.5 | 0.46 | 1.46 | 0.41 | 0.15 | 0.02 | 50 | 27 | 16.2 | 20 |
| Comparative Example 1 | Composition 81 | 79.4 | 60 | — | 1.12 | 17.1 | 0.30 | 3.6 | 0.12 | 2.0 | 2.5 | 0.23 | 1.05 | -0.22 | -0.38 | -0.48 | 50 | 38 | 17.4 | 107 |
| Comparative Example 2 | Composition 82 | 78.8 | 60 | — | 0.94 | 17.6 | 0.30 | 3.6 | 0.12 | 2.0 | 2.5 | 0.23 | 1.09 | -0.18 | -0.35 | -0.45 | 50 | 38 | 17.2 | 114 |
| Comparative Example 3 | Composition 83 | 67.7 | 70 | — | 0.51 | 27.6 | 0.40 | 4.7 | 0.16 | 2.0 | 2.5 | 0.23 | 1.08 | -0.19 | -0.36 | -0.46 | 50 | 38 | 15.5 | 85 |
| Comparative Example 4 | Composition 84 | 68.1 | 70 | — | 0.60 | 21.6 | 0.40 | 10.3 | 0.16 | 2.0 | 2.5 | 0.23 | 1.05 | -0.22 | -0.38 | -0.48 | 50 | 38 | 17.5 | 80 |
| Comparative Example 5 | Composition 85 | 79.1 | 60 | — | 0.19 | 16.7 | 0.30 | 4.2 | 0.12 | 2.0 | 2.5 | 0.23 | 1.19 | -0.08 | -0.28 | -0.38 | 50 | 38 | 15.0 | 113 |
| Comparative Example 6 | Composition 86 | 73.6 | 60 | — | 0.58 | 22.0 | 0.30 | 4.4 | 0.12 | 2.0 | 2.5 | 0.17 | 1.15 | -0.18 | -0.36 | -0.47 | 50 | 41 | 15.5 | 109 |
| Comparative Example 7 | Composition 87 | 80.6 | 60 | — | 0.60 | 15.1 | 0.30 | 4.4 | 0.12 | 2.0 | 2.5 | 0.19 | 1.13 | -0.18 | -0.36 | -0.46 | 50 | 40 | 17.5 | 114 |

TABLE 20-continued

| Table 5-3 | | Characteristics of resist composition ||||||||||||||||| Evaluation ||
|---|---|---|---|---|---|---|---|---|---|---|---|---|---|---|---|---|---|---|---|
| | | Resin |||| Amount of ||| Acid diffusion control agent || Solid content (% by mass) | P/Q | y | x | Expression (3x) | Expression (4x) | Expression (5x) | Resist film ||| Pattern collapse (nm) | Missing defects (number of defects) |
| | | Content (% by mass) | Protection rate (% by mass) | F number of protective group | ClogP after deprotection | Photoacid generator ||  |||| | | | | | | Initial film thickness (nm) | Film thickness after PEB (nm) | | |
| | | | | | | Content (% by mass) | Content (mmol/g) | Content (% by mass) | Content (mmol/g) | | | | | | | | | | | |
| Comparative Example 8 | Composition 88 | 72.1 | 60 | — | 0.46 | 22.3 | 0.40 | 5.7 | 0.16 | 2.0 | 2.5 | 0.17 | 1.20 | −0.13 | −0.33 | −0.44 | 50 | 41 | 17.3 | 81 |
| Comparative Example 9 | Composition 89 | 76.0 | 50 | — | 0.75 | 19.8 | 0.30 | 4.2 | 0.12 | 2.0 | 2.5 | 0.19 | 1.10 | −0.21 | −0.39 | −0.49 | 50 | 41 | 17.3 | 106 |
| Comparative Example 10 | Composition 90 | 85.9 | 60 | — | 0.64 | 11.7 | 0.20 | 2.4 | 0.08 | 2.0 | 2.5 | 0.35 | 1.06 | −0.09 | −0.26 | −0.35 | 50 | 33 | 22.0 | 102 |
| Comparative Example 11 | Composition 91 | 85.9 | 70 | — | 0.65 | 11.7 | 0.20 | 2.4 | 0.08 | 2.0 | 2.5 | 0.40 | 1.04 | −0.05 | −0.21 | −0.31 | 50 | 30 | 22.1 | 46 |
| Comparative Example 12 | Composition 92 | 85.9 | 80 | — | 0.65 | 11.7 | 0.20 | 2.4 | 0.08 | 2.0 | 2.5 | 0.46 | 1.02 | −0.02 | −0.17 | −0.27 | 50 | 27 | 22.7 | 47 |
| Comparative Example 13 | Composition 93 | 65.8 | 40 | 9 | 3.45 | 26.5 | 0.30 | 7.7 | 0.12 | 2.0 | 2.5 | 0.14 | 1.89 | 0.52 | 0.15 | −0.02 | 50 | 43 | 22.0 | 30 |
| Comparative Example 14 | Composition 94 | 65.8 | 40 | 9 | 3.45 | 26.5 | 0.30 | 7.7 | 0.12 | 1.7 | 2.5 | 0.14 | 1.89 | 0.52 | 0.15 | −0.02 | 40 | 35 | 21.5 | 84 |
| Comparative Example 15 | Composition 95 | 65.8 | 40 | 9 | 3.45 | 26.5 | 0.30 | 7.7 | 0.12 | 1.0 | 2.5 | 0.14 | 1.89 | 0.52 | 0.15 | −0.02 | 20 | 17 | 23.0 | 57 |
| Comparative Example 16 | Composition 96 | 75.9 | 50 | — | 3.09 | 19.9 | 0.30 | 4.2 | 0.12 | 2.0 | 2.5 | 0.10 | 1.37 | −0.02 | −0.27 | −0.39 | 50 | 45 | 21.5 | 120 |
| Comparative Example 17 | Composition 97 | 73.3 | 50 | — | 1.54 | 22.4 | 0.30 | 4.4 | 0.12 | 2.0 | 2.5 | 0.14 | 1.44 | 0.08 | −0.18 | −0.30 | 50 | 43 | 22.0 | 47 |

As shown in the tables, it was confirmed that the resist composition of the embodiment of the present invention was excellent in the pattern collapse suppressing property and the missing defect suppressing property.

Furthermore, it was confirmed that in a case where the resist composition satisfies the relationship of Expression (4), the missing defect suppressing property tends to be more excellent.

(Results of Examples 6, 8, 17, 18, 23, 27, 31, 34, 36, 37, 38, 44, 49, 57, 71, and 75, and the Like)

In addition, it was confirmed that in a case where the resist composition satisfies the relationship of Expression (5), the missing defect suppressing property tends to be more excellent.

(Results of Examples 1, 9, 10, 12, 25, 29, 33, 35, 40, 41, 45, 47, 50, 53, 67, 70, 74, 79, and 80, and the Like)

It was confirmed that in a case where the protective group has 3 to 6 fluorine atoms, the pattern collapse suppressing property tends to be more excellent.

Results of Example 34, and the Like

It was confirmed that in a case where y is large, the pattern collapse suppressing property is more excellent.

It was confirmed that in a case where the content of the photoacid generator in 1 g of the solid content of the resist composition is more than 0.3 mmol, the missing defect suppressing property tends to be more excellent.

(Results of Examples 2, 5, 13, 14, 15, 16, 19, 24, 26, 39, 43, 46, 51, 55, 56, 58, 59, 60, 61, 62, 63, 66, 69, 72, and 73, Results of Example 38 (Comparison Among the Resist Compositions Satisfying Expression (4), Results of Examples 25, 38, 41, 47, and 67 (Comparison Among the Resist Compositions Satisfying Expression (5), and the Like)

It was confirmed that in a case where the initial film thickness is 35 nm or more, the missing defect suppressing property tends to be more excellent.

Results of Example 73, and the Like

It was confirmed that in a case where a pattern is formed with a resist film having an initial film thickness of more than 50 nm (more preferably more than 55 nm) and a film thickness after PEB of 35 nm or less, the missing defect suppressing property tends to be more excellent.

(Results of Examples 55 and 69, Results of Examples 9 and 41 (Comparison Among the Resist Compositions Satisfying Expression (5)), and the Like)

What is claimed is:

1. A negative tone photosensitive composition for EUV light, comprising:
   a resin A having a repeating unit having an acid-decomposable group with a polar group being protected with a protective group that is eliminated by the action of an acid; and
   a photoacid generator,
   wherein a ClogP value of the resin after elimination of the protective group from the resin A is 1.40 or less,
   a value x calculated by Expression (1) is 1.2 or more, and the value x calculated by Expression (1) and a value y calculated by Expression (2) satisfy a relationship of Expression (3), $$x=([H]\times0.04+[C]\times1.0+[N]\times2.1+[O]\times3.6+[F]\times5.6+[S]\times1.5+[I]\times39.5)/([H]\times1+[C]\times12+[N]\times14+[O]\times16+[F]\times19+[S]\times32+[I]\times127)\times10 \quad \text{Expression (1):}$$

where [H] represents a molar ratio of hydrogen atoms derived from the total solid content with respect to all the atoms of the total solid content in the negative tone photosensitive composition for EUV light, [C] represents a molar ratio of carbon atoms derived from the total solid content with respect to all the atoms of the total solid content in the negative tone photosensitive composition for EUV light, [N] represents a molar ratio of nitrogen atoms derived from the total solid content with respect to all the atoms of the total solid content in the negative tone photosensitive composition for EUV light, [O] represents a molar ratio of oxygen atoms derived from the total solid content with respect to all the atoms of the total solid content in the negative tone photosensitive composition for EUV light, [F] represents a molar ratio of fluorine atoms derived from the total solid content with respect to all the atoms of the total solid content in the negative tone photosensitive composition for EUV light, [S] represents a molar ratio of sulfur atoms derived from the total solid content with respect to all the atoms of the total solid content in the negative tone photosensitive composition for EUV light, and [I] represents a molar ratio of iodine atoms derived from the total solid content with respect to all the atoms of the total solid content in the negative tone photosensitive composition for EUV light, $$y=\{(a-b)/a\}\times c\times d \quad \text{Expression (2):}$$

where a represents a molecular weight of the repeating unit having an acid-decomposable group in the resin A, b represents a molecular weight of the repeating unit after elimination of the protective group from the repeating unit having an acid-decomposable group, c represents a mass ratio of the repeating unit having an acid-decomposable group to all the repeating units of the resin A, and d represents a mass ratio of the resin A to the total mass of the solid content, $$y \geq -x+1.5. \quad \text{Expression (3):}$$

2. The negative tone photosensitive composition for EUV light according to claim 1, wherein the protective group has a fluorine atom.

3. The negative tone photosensitive composition for EUV light according to claim 1, wherein a relationship of Expression (4) is satisfied, $$y \geq -0.75x+1.4. \quad \text{Expression (4):}$$

4. The negative tone photosensitive composition for EUV light according to claim 1, wherein a relationship of Expression (5) is satisfied, $$y \geq -0.66x+1.4. \quad \text{Expression (5):}$$

5. The negative tone photosensitive composition for EUV light according to claim 1, wherein a content of the repeating unit having an acid-decomposable group with respect to all the repeating units of the resin A is 60% by mass or more.

6. The negative tone photosensitive composition for EUV light according to claim 1, wherein y is 0.2 or more.

7. The negative tone photosensitive composition for EUV light according to claim 1, wherein x is 1.4 or more.

8. A pattern forming method comprising:
   a step of forming a resist film on a substrate using the negative tone photosensitive composition for EUV light according to claim 1;

a step of exposing the resist film to EUV light; and
a step of developing the exposed resist film using a developer including an organic solvent to form a pattern.

9. The pattern forming method according to claim 8, wherein the exposed resist film has a film thickness of 50 nm or less.

10. The pattern forming method according to claim 8, wherein the exposed resist film has a film thickness of 40 nm or less.

11. The pattern forming method according to claim 8, wherein the exposed resist film has a film thickness of 35 nm or less.

12. A method for manufacturing an electronic device, the method comprising the pattern forming method according to claim 8.

13. The negative tone photosensitive composition for EUV light according to claim 2, wherein a relationship of Expression (4) is satisfied, $$y \geq -0.75x + 1.4.  \quad \text{Expression (4):}$$

14. The negative tone photosensitive composition for EUV light according to claim 2, wherein a relationship of Expression (5) is satisfied, $$y \geq -0.66x + 1.4. \quad \text{Expression (5):}$$

15. The negative tone photosensitive composition for EUV light according to claim 2, wherein a content of the repeating unit having an acid-decomposable group with respect to all the repeating units of the resin A is 60% by mass or more.

16. The negative tone photosensitive composition for EUV light according to claim 2, wherein y is 0.2 or more.

17. The negative tone photosensitive composition for EUV light according to claim 2, wherein x is 1.4 or more.

18. A pattern forming method comprising:
a step of forming a resist film on a substrate using the negative tone photosensitive composition for EUV light according to claim 2;
a step of exposing the resist film to EUV light; and
a step of developing the exposed resist film using a developer including an organic solvent to form a pattern.

19. The pattern forming method according to claim 18, wherein the exposed resist film has a film thickness of 50 nm or less.

20. A method for manufacturing an electronic device, the method comprising the pattern forming method according to claim 9.

* * * * *